(12) United States Patent
Hatanaka et al.

(10) Patent No.: US 6,326,309 B2
(45) Date of Patent: *Dec. 4, 2001

(54) SEMICONDUCTOR DEVICE MANUFACTURING METHOD

(75) Inventors: Masanobu Hatanaka, Aichi; Naoyuki Takada, Kanagawa; Motoshu Miyajima, Kanagawa; Shuichi Miyata, Kanagawa, all of (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/343,457

(22) Filed: Jun. 30, 1999

(30) Foreign Application Priority Data

Jun. 30, 1998 (JP) .................................................. 10-185474

(51) Int. Cl.[7] .................................................. H01L 21/304
(52) U.S. Cl. ........................... 438/693; 438/700; 438/701
(58) Field of Search ..................................... 438/691, 692, 438/693, 700, 701, 745, 697; 451/41

(56) References Cited

U.S. PATENT DOCUMENTS

| 5,270,264 | * | 12/1993 | Andideh et al. ...................... 438/703 |
| 5,459,096 | * | 10/1995 | Venkatesan et al. ................. 438/437 |
| 5,514,245 | * | 5/1996  | Doan et al. ........................... 438/693 |
| 5,663,797 | * | 9/1997  | Sandhu .................................... 438/16 |
| 5,665,202 | * | 9/1997  | Subramanian et al. ............... 438/692 |
| 5,672,095 | * | 9/1997  | Morimoto et al. ...................... 451/41 |
| 5,736,462 | * | 4/1998  | Takahashi et al. .................... 438/692 |
| 5,913,712 | * | 6/1999  | Molinar ................................. 451/41 |
| 5,923,993 | * | 7/1999  | Sahota ................................. 438/427 |

* cited by examiner

Primary Examiner—Robert Kunemund
Assistant Examiner—Binh X Tran
(74) Attorney, Agent, or Firm—Armstrong, Westerman, Hattori, McLeland & Naughton, LLP

(57) ABSTRACT

The present invention relates to a semiconductor device manufacturing method containing the step of polishing an insulating oxide film having an uneven surface, to improve a throughput in burying the insulating film into trenches and also improve flatness of a polished surface. The method comprises a step of forming a polishing stopping film 26 on a surface of a semiconductor substrate 21, a step of forming trenches 23a to 23d by etching the semiconductor substrate 21 via the opening portions, a step of forming an insulating film 27 in the trenches 23a to 23d and on the semiconductor substrate 21, and steps of first polishing the insulating film by using a first abrasive cloth 102 which has a polishing surface with first hardness while supplying a first slurry onto a polished surface of the insulating film 27 and then polishing the polished surface of the insulating oxide film 27 by using a second abrasive cloth 101 which has second hardness softer than the first hardness while supplying a second slurry onto the polished surface of the insulating film 27 until the polishing stopping film 26 is exposed.

30 Claims, 43 Drawing Sheets

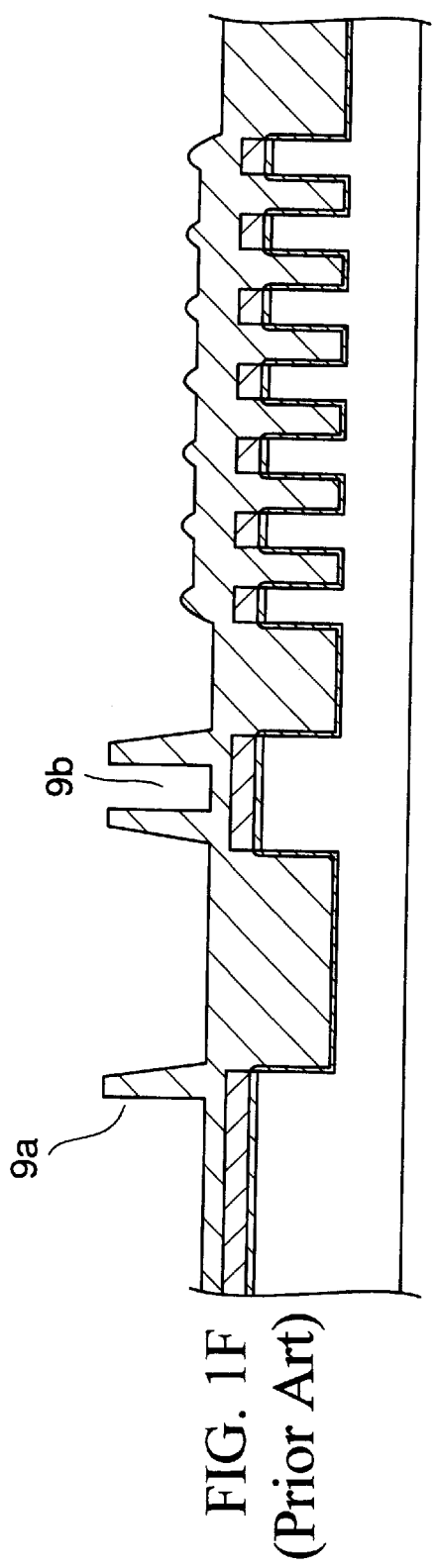
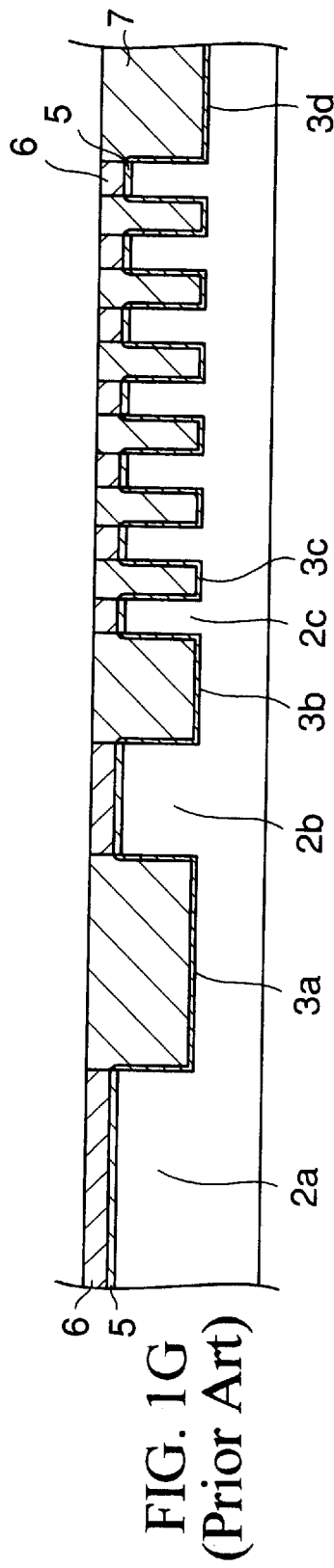
FIG. 1F (Prior Art)
FIG. 1G (Prior Art)

Scribe Portion

Large Pattern Area in a Peripheral Portion

Peripheral Area of a Cell

Inside of a Cell

Scribe Portion

Large Pattern Area in a Peripheral Portion

Peripheral Area of a Cell

Inside of a Cell

Scribe Portion

Large Pattern Area in a Peripheral Portion

Peripheral Area of a Cell

Inside of a Cell

SS25/PL6103=1/2

Scribe Portion

SS25/PL6103=1/2

Large Pattern Area in a Peripheral Portion

SS25/PL6103=1/2

Peripheral Area of a Cell

SS25/PL6103=1/2

Inside of a Cell

SS25/PL6103=1/1

Scribe Portion

SS25/PL6103=1/1

Large Pattern Area in a Peripheral Portion

SS25/PL6103=1/1

Peripheral Area of a Cell

SS25/PL6103=1/1

Inside of a Cell

8% Dummy Case

16% Dummy Case

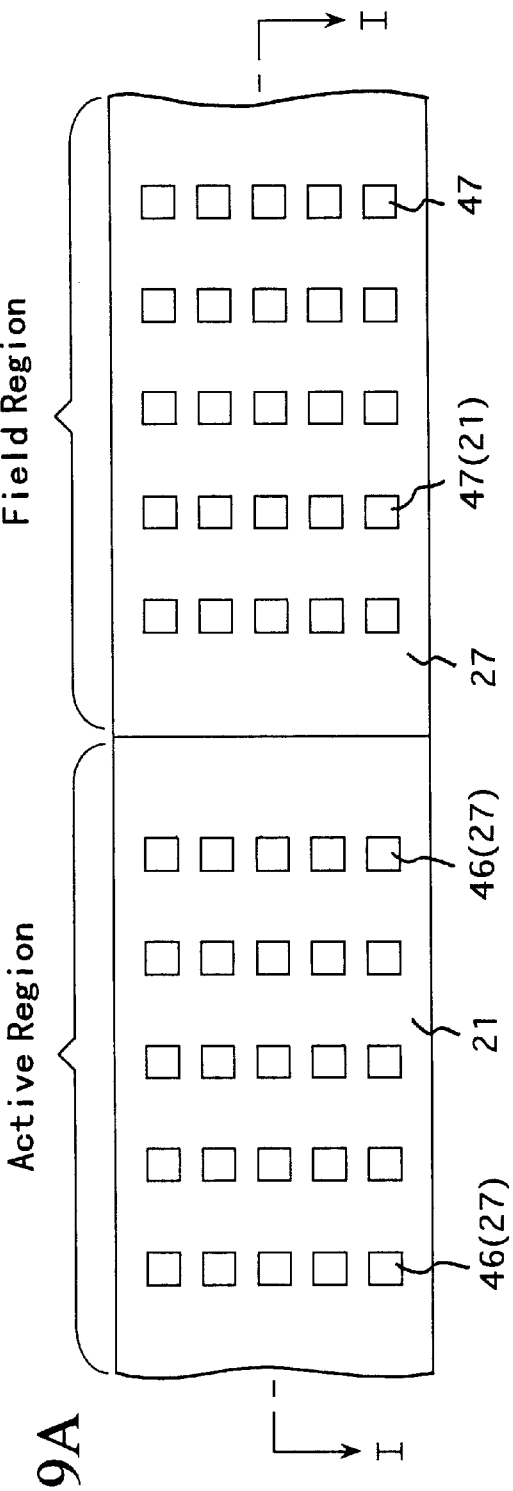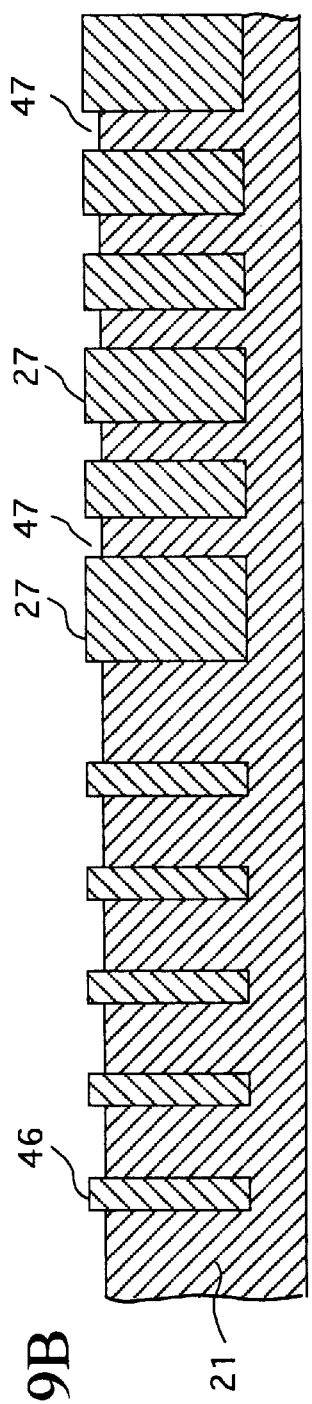
FIG. 39A
FIG. 39B

LEFT

CENTER

SEMICONDUCTOR DEVICE MANUFACTURING METHOD

BACKGROUND OF THE INVENTION

1. Field of the Invention

The present invention relates to a semiconductor device manufacturing method and, more particularly, a semiconductor device manufacturing method including the step of forming a shallow trench isolation (STI).

2. Description of the Prior Art

In recent years, with the progress of miniaturization in the semiconductor device, it has become difficult to isolate devices with good precision by using the device isolation method which employs the LOCOS (Local Oxidation of Silicon) method employed in the prior art.

For this reason, the method using the shallow trench has engaged public attention as the new device isolation method in place of the LOCOS method, and has already been utilized.

FIGS. 1A to 1G are sectional views showing steps of forming shallow trenches in the prior art.

First, as shown in FIG. 1A, an oxide film 5 and a nitride film 6 are formed on a surface of a silicon substrate 1 in this sequence.

Then, as shown in FIG. 1B, the oxide film 5 and the nitride film 6 are removed from a region serving as a device isolation region by the photolithography method.

Then, as shown in FIG. 1C, the silicon substrate 1 is etched by using the oxide film 5 and the nitride film 6 as a mask to form shallowly a first trench 3a to a fourth trench 3d which have a different width respectively. At this time, because the silicon substrate 1 is partitioned by the trenches 3a to 3d, regions partitioned by the first trench 3a and the fourth trench 3d with a wide area respectively are first device regions 2a each of which has a wide area, a region partitioned by the second trench 3b with a middle width is a second device region 2b which has a middle area, and a region partitioned by the third trench 3c with a narrow width is a third device region 2c which has a convex narrow area.

Then, as shown in FIG. 1D, a silicon oxide film 7 whose thickness is thicker than depths of the first trench 3a to the fourth trench 3d is formed on the silicon substrate 1 to bury the first trench 3a to the fourth trench 3d. In this case, if the silicon oxide film 7 is formed under the condition that such silicon oxide film 7 can be buried densely in the third trench 3c with the narrow width, normally a thickness of the silicon oxide film 7 becomes thickest on the first device region 2a which has the large width but becomes thinnest on the third device region 2c which has the small width. In addition, a thickness t3 of the silicon oxide film 7 formed in the region, in which the third trenches 3c having the small width are formed collectively, is larger than thicknesses t1, t2 of the silicon oxide film 7 in the first trench 3a and the second trench 3b both have the large width.

Then, as shown in FIG. 1E, a photoresist film 8 is formed on an overall surface, Windows 9a, 9b are then formed by exposing and developing the photoresist film 8. These windows 9a, 9b are positioned over the first device region 2a which has the large width and the second device region 2b which has the middle width respectively.

Then, the silicon oxide film 7 is etched via the windows 9a, 9b. In this case, an etching depth of the silicon oxide film 7 may be set shallow not to expose the nitride film 6.

Then, as shown in FIG. 1F, the photoresist film 8 is removed. Then, as shown in FIG. 1G, a surface of the silicon oxide film 7 is polished. In this event, polishing of the silicon oxide film 7 formed on the first device region 2a and the second device region 2b can be easily performed, and then such polishing is substantially stopped by the nitride film 6. Accordingly, the silicon oxide film 7 can be buried in the first trench 3a to the fourth trench 3d, but the silicon oxide film 7 can be removed from the first device region 2a to the third device region 2c.

The first trench 3a to the fourth trench 3d in which the silicon oxide film 7 is buried can act as a shallow trench to isolate the first device region 2a to the third device region 2c respectively.

In the above-mentioned steps, the reason for that the width of the silicon oxide film 7 formed on the first device region 2a and the second device region 2b is made small is to planarize a polished surface of the silicon oxide film 7 by accelerating the polishing of the silicon oxide film 7 on the region which has the thicker silicon oxide film 7. In other words, if the silicon oxide film 7 is left thick on the first device region 2a which has the largest width and the second device region 2b which has the middle width, it is difficult to achieve uniform polishing since a polishing resistance in such regions 2a and 2b is increased.

Meanwhile, according to the above shallow trench forming method, since a plurality of different steps such as the photolithography step, the etching step, and the polishing step are needed, the number of steps of manufacturing the semiconductor device is increased.

Also, if variation of the silicon oxide film 7 in film thickness is generated, the silicon oxide film 7 is left on the first device region 2a and the second device region 2b after the etching, or else the film thickness of the silicon oxide film 7 which is left on the first device region 2a and the second device region 2b is varied. Hence, according to the above method, variation of the film thickness of the silicon oxide film 7 cannot be overcome.

Furthermore, if the silicon oxide film 7 is assumed to be uniform, variation in etching of a surface of the silicon oxide film 7 shown in FIG. 2 is generated when STI is formed on, e.g., twenty five sheets of the semiconductor wafers, so that the thickness of the silicon oxide film 7 being left on the semiconductor wafer is ready to be uneven.

In the situation that the silicon oxide film 7 has its uneven thickness on the first device region 2a to the third device region 2c respectively, if polishing of the silicon oxide film 7 is carried out until it is removed completely from the first device region 2a to the third device region 2c, an upper surface of the silicon oxide film 7 is curved in the first trench 3a to the fourth trench 3d like a dishing since such polishing is also proceeded in the first trench 3a to the fourth trench 3d.

SUMMARY OF THE INVENTION

It is an object of the present invention to provide a semiconductor device manufacturing method which is capable of improving a throughput of shallow trench formation and also improving flatness of a silicon oxide film buried in trenches by polishing.

In the present invention, in filling the insulating film in the trenches formed on the semiconductor substrate, the insulating film on the semiconductor substrate is removed by using two-step polishing in which the abrasive cloth is changed.

According to this, the volume of the convex portions of the insulating film is reduced by the first step polishing, and then the planarization of the insulating film is accelerated by the second step polishing, In the polishing by the first step polishing step, the abrasive cloth having a hard polishing surface which has a ratio of a compressive strain ($\mu$m) to a compressive load (g/cm$^2$) of less than 0.06 $\mu$m·cm$^2$/g is employed as the abrasive cloth, and the slurry which contains oxygen as a major component and has the small polishing rate of the insulating film of less than 200 nm/min as the first polishing rate is employed as the slurry.

In the first step polishing step, since the polishing rate becomes very slow at the point of time when uneven difference of the surface of the polished substrate is reduced, the polishing is then terminated.

In the second step polishing step, the slurry which provides the second polishing rate, which is larger than the first polishing rate, as the polishing rate of the insulating film is employed, and also the abrasive cloth which is softer than the first abrasive cloth is employed. Then, the surface follow-up performance of the abrasive cloth is reduced by reducing the pushing force of the polishing object against the abrasive cloth, and the line velocity is enhanced in polishing by rotating the abrasive cloth at high speed.

Here the "surface follow-up performance of the abrasive cloth" means that, if the polished surface of the polished substrate is uneven and the abrasive cloth is relatively soft, the surface of the abrasive cloth can be deformed in polishing in compliance with the unevenness of the polished surface.

In the second step polishing step, the reason for that the slurry to increase the polishing rate is used and the relatively soft abrasive cloth is used is to planarize the surface.

In the second step polishing step, the polishing is ended at the point of time when the polishing stopping film containing nitrogen as a major component appears and the polished surface is planarized. As a result, the insulating film is buried into the trenches on the semiconductor substrate and planarized surface of the substrate can be obtained.

On the contrary, according to the prior art, i.e., if the polishing is executed without the first step polishing only under the same conditions as those for the second step polishing, it becomes impossible to control the polishing of the fine convex regions because the polishing is affected by the density of the patterns on the polished substrate.

The trench into which the insulating film is filled may be used as device isolation, otherwise either the convex portion of the insulating film projected from the trench or the concave portion surrounded by the convex portion may be used as the alignment mark.

If the interlayer insulating film is polished by the abrasive cloth having particular hardness with the use of the particular slurry when unevenness is generated on the surface of the interlayer insulating film, the flatness can be improved by the polishing method of the present invention rather than the polishing method in the prior art. The slurry in which the abrasive grains made of silica material or cerium oxide are contained in the dispersant having OH radicals may be used as the slurry. The abrasive cloth whose hardness is set to a ratio of the compressive strain to the compressive load of less than 0.06 $\mu$m·cm$^2$/g is preferable as the abrasive cloth. In this case, it is preferable that the relative line velocity between the polished substrate and the abrasive cloth is 40 nm/min.

BRIEF DESCRIPTION OF THE DRAWINGS

FIGS. 1A to 1G are sectional views showing steps of forming shallow trenches in the prior art;

FIG. 36 is a sectional view showing difference in the silicon oxide film if first step polishing conditions are changed in the alignment mark manufacturing steps in the semiconductor device manufacturing method according to the third embodiment of the present invention;

FIG. 39A is a plan view showing forming areas of the alignment marks, which are formed in the third embodiment of the present invention, and FIG. 39B is a sectional view showing the forming areas in FIG. 39A;

DESCRIPTION OF THE PREFERRED EMBODIMENTS

Embodiments of the present invention will be explained in detail with reference to the accompanying drawings hereinafter.

First Embodiment

To begin with, a polishing equipment employed in embodiments of the present invention will be explained and then a polishing method using the polishing equipment will be explained hereunder.

Polishing Equipments

Figure 1A:
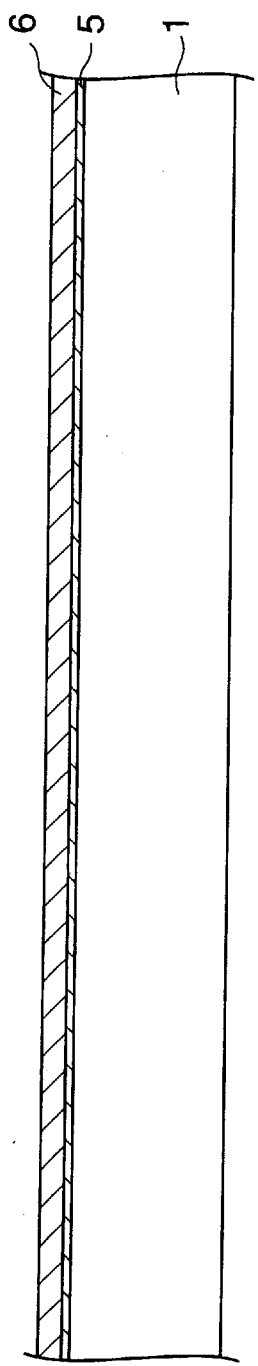
Figure 1B:
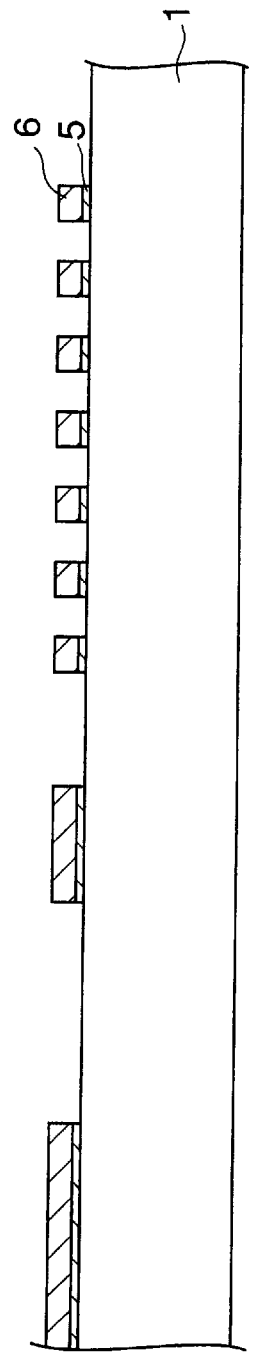
Figure 1C:
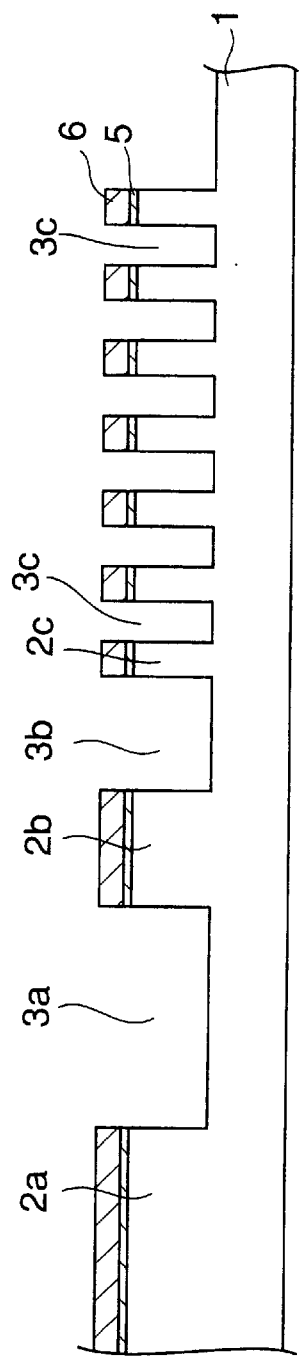
Figure 1D:
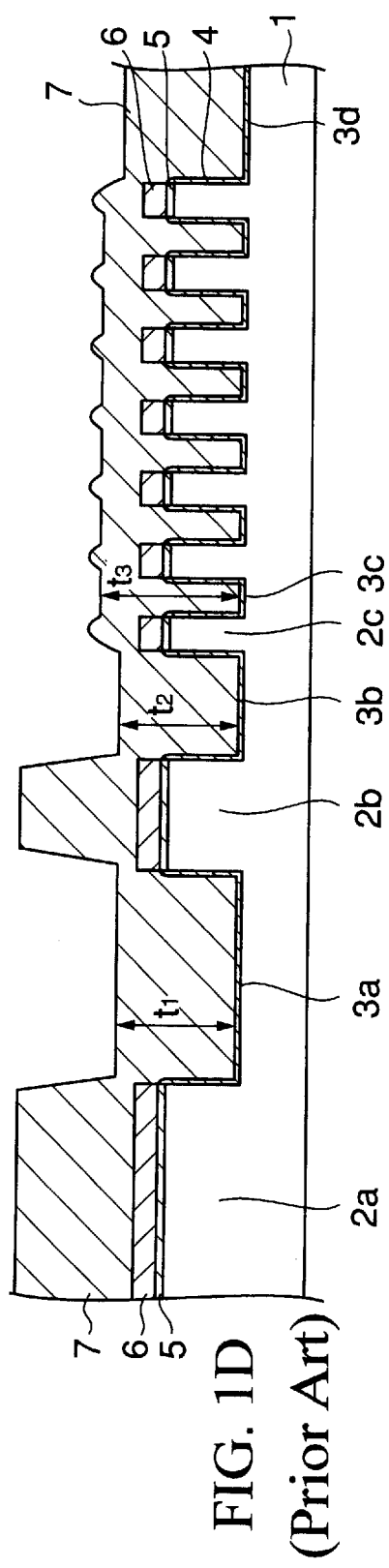
Figure 1E:
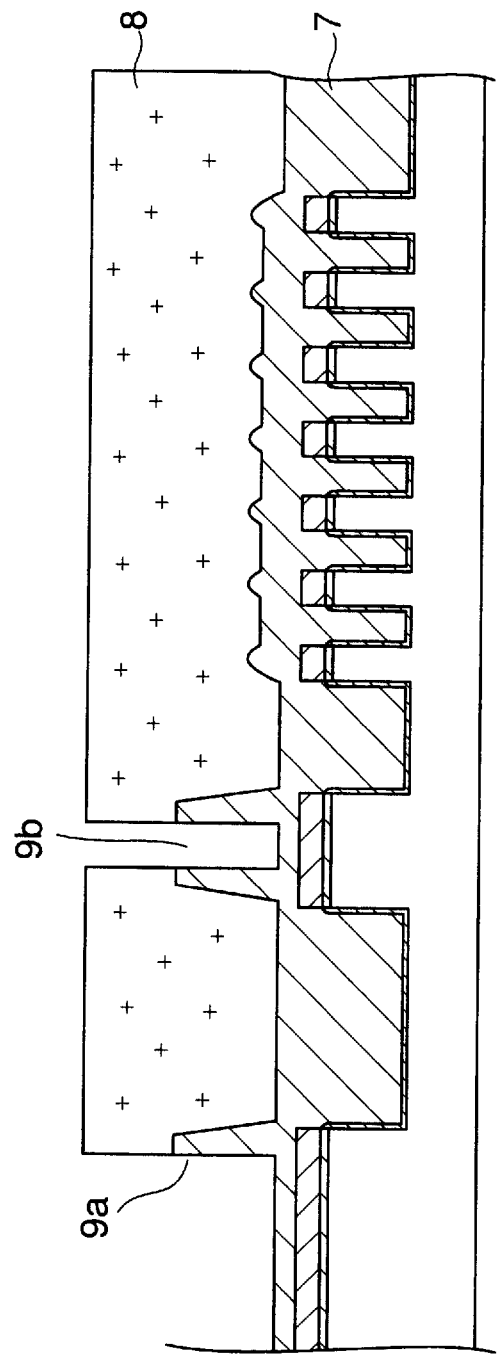
Figure 2:
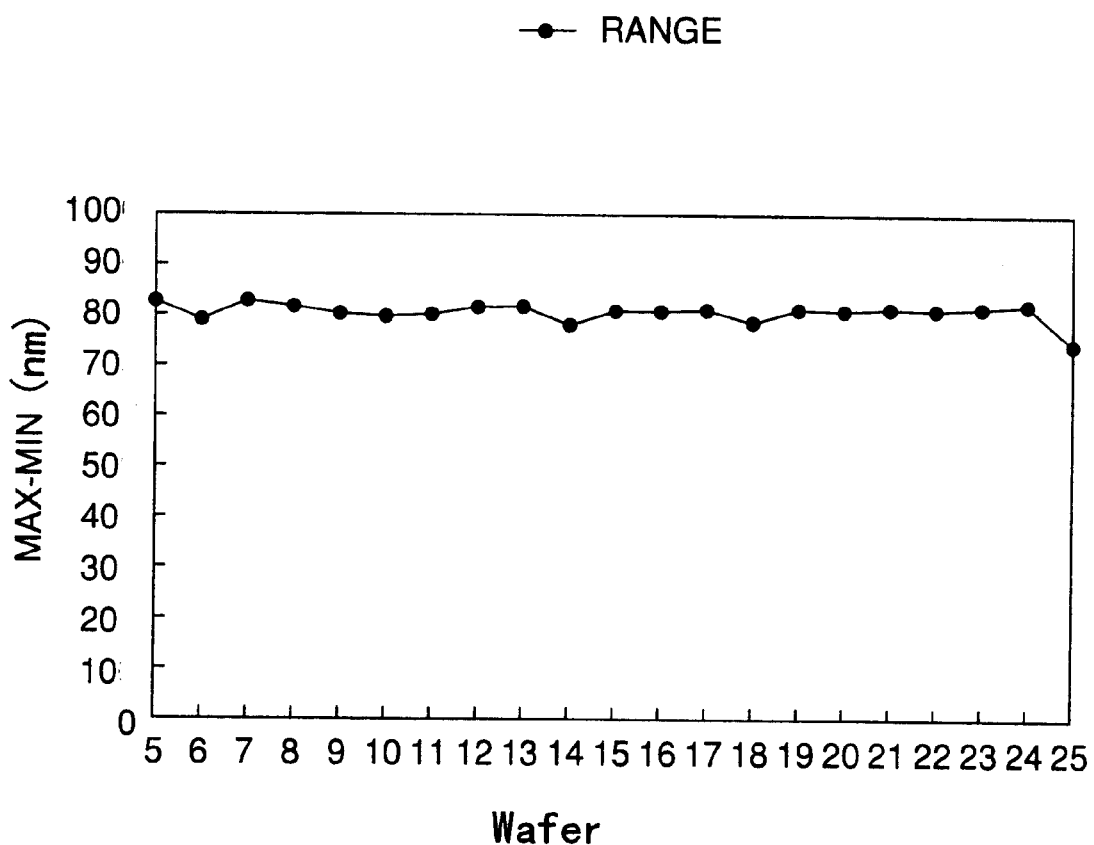
FIG. 2 is a graph showing variation in etching of unevenness on a surface of an insulating film in the process to form STI formation in compliance with steps in FIGS. 1A to 1G, viewed from a wafer surface.
Figure 3A:
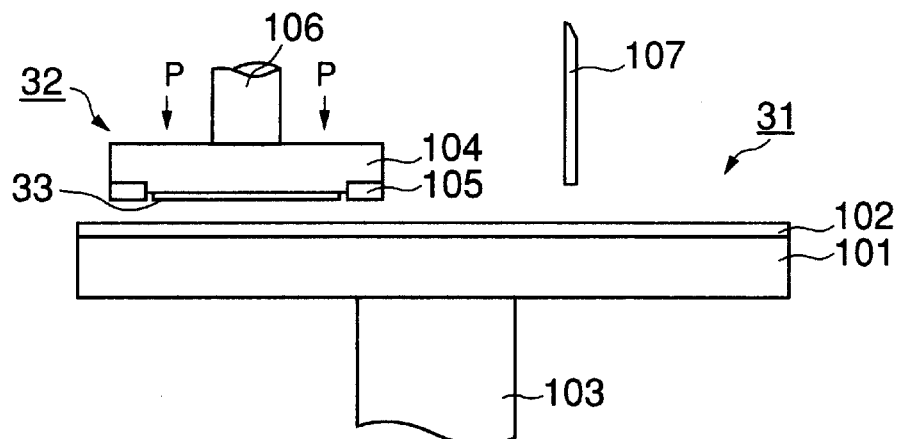
FIG. 3A is a side view showing an example of a polishing equipment employed in embodiments of the present invention.
Figure 3B:
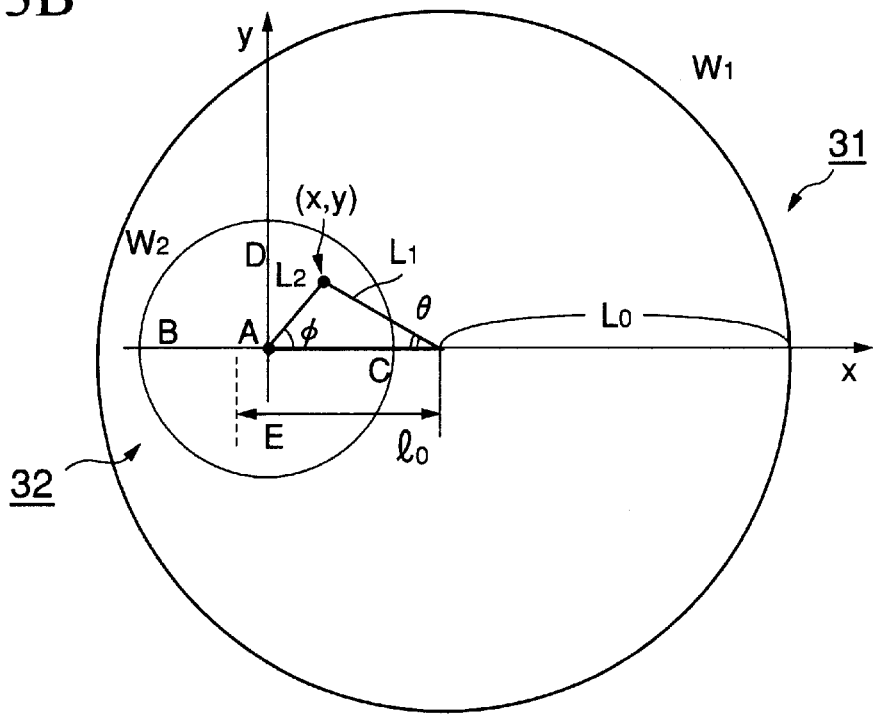
FIG. 3B is a top view showing the example of the polishing equipment in FIG. 3A

FIG. 3A is a side view showing an example of the polishing equipment employed in embodiments of the present invention, and FIG. 3B is a top view showing the example of the polishing equipment in FIG. 3A.

The polishing equipment comprises a polishing plate 31 and a substrate holder 32 arranged over the polishing plate 31.

The polishing plate 31 includes a base plate 101 and an abrasive cloth 102 which is stuck onto an upper surface of the base plate 101. A rotatable supporting axis 103 is secured to a center portion of a lower surface of the base plate 101.

The base plate 101 is formed of, for example, an aluminum plate which is covered with alumite, or a slate such as marble, granite, etc. which has small thermal deformation.

As the abrasive cloth 102, a very hard abrasive cloth is used in the first polishing step and a soft abrasive. cloth is used in the second polishing step. For example, IC-1000

(product name) which is formed of cellular polyurethane of 1270 μm thickness and manufactured by Rodel Co., Ltd. may be employed as the hard abrasive cloth. For example, Suba 400 (product name) which has a nonwoven fabric structure and manufactured by Rodel Co., Ltd. may be employed as the soft abrasive cloth.

As the abrasive cloth 102, an abrasive cloth in which spiral grooves (K grooves), orthogonal lattice type grooves, a large number of holes, etc. are formed on its polishing surface is employed.

The substrate holder 32 includes a holding plate 104 and a retainer ring 105.

A polished substrate (polishing object) 33 is stuck onto a lower surface of the holding plate 104 of the substrate holder 32 by virtue of surface tension. A rotatable supporting axis 106 is secured to a center portion of an upper surface of the holding plate 104. In addition, when a pushing force P is applied to the holding plate 104 to be pushed down, the overall polished substrate 33 can be pushed against the abrasive cloth 102. Among the holding plate 104, there is a holding plate 104 having such a structure that a large number of pores (not shown) are formed to pass through the holding plate 104. In such holding plate 104, the pushing force applied to the polished substrate 33 can be adjusted partially by blowing a nitrogen gas, etc. into the pores from the outside to blow off onto the polished substrate 33. This pushing force as well as slurry affects a polishing rate of the polished substrate 33.

The retainer ring 105 of the substrate holder 32 is provided to limit lateral movement of the polished substrate 33 on the lower surface of the holding plate 104. The retainer ring 105 is fitted to the periphery of the holding plate 104 so as to project from the lower surface of the polished substrate 33 to the almost same level as that of the polished substrate 33 in the situation that the polished substrate 33 is stuck onto the lower surface of the polished substrate 33. There are a fixed type retainer ring whose height is not adjustable and an adjustable type retainer ring whose height is adjustable. Any type of them may be selected as the retainer ring 105.

Since the polishing equipment has a different structure of the substrate holder 32 because of difference of the manufacturer, a force of pushing the polished substrate is called differently. For example, in the case of 6DP-SP (product name) or 6ED (product name) which is manufactured by Strassbar Co., Ltd. as the polishing equipment, a force applied by the plate, on which the wafer is stuck, to push the wafer downward is called a "down force", while a force given by the gas, which is emitted from the pores provided in the wafer-attached plated, to push the wafer is called a "back pressure".

In the case of the polishing equipment MIRRA 3400 (product name), the pressure which is applied to the membrane on a holding surface of the holding plate 104 is called a "membrane pressure", while the pressure which is applied to the rear side of the holding plate 104 by the rubber tube is called an "inner tube pressure".

Also, although different from the pushing force, the retainer ring pressure which is applied to the retainer ring 105 to adjust its projection height from the holding plate 104 is sometimes defined. This is because such pressure slightly affects the polishing rate.

The slurry is supplied to the polished surface in the course of polishing. The slurry in which abrasive grains are dispersed into the dispersant or the polishing accelerator is employed. As the dispersant or the polishing accelerator, an organic substance such as tetramethylammonium hydroxide (TMAH:$(CH_3)_4NOH$) amine material, or an inorganic substance such as KOH, $NH_4OH$, etc. may be used. As the abrasive grain, silica such as colloidal silica, humid silica, etc. or cerium oxide ($CeO_2$) may be used.

Next, an outline of a method of polishing the polished substrate 33 by using the polishing equipment shown in FIG. 3A and 35 will be explained hereunder.

At first, the polished substrate 33 is stuck onto the lower surface of the holding plate 104 of the substrate holder 32.

Then, a polished surface of the polished substrate 33 is brought into contact with a surface of the abrasive cloth 102 by bringing down the substrate holder 32 then, both the polishing plate 31 and the substrate holder 32 are rotated on the supporting axis 106 mutually and at the same time the substrate holder 32 is reciprocally moved at a constant velocity along the X-axis direction on the polishing plate 31. This reciprocating motion is referred to as a "vibration" hereinafter.

In this case, after a relative velocity between the holding plate 104 and the base plate 101, both are rotated by driving forces of two supporting axes 103 and 106, is set to a predetermined value and also a vibration velocity is set to a predetermined value, the polished substrate 33 is then polished.

Polishing of the polished substrate 33 is advanced by such rotation motion and the vibration. However, in the first embodiment, the polishing is not continued from start of polishing to end thereof, but is carried out in two steps by changing the polishing condition.

In such two-step polishing conditions, at least one condition of the slurry, the abrasive cloth, and the rotation speed is changed. The slurry is selected from the above material. The abrasive cloth which is harder than that used in the second step should be selected as the abrasive cloth used in the first step.

Figure 4:
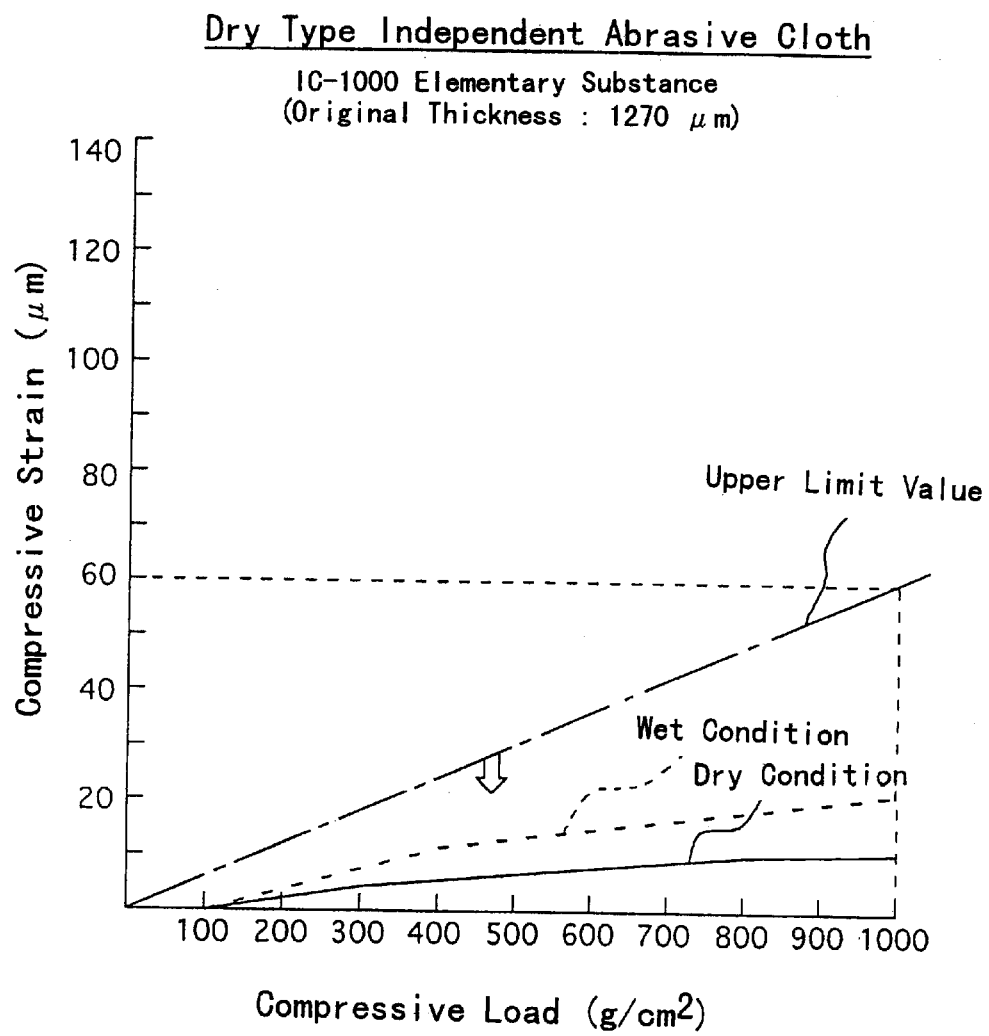
FIG. 4 is a graph showing relationships between a compressive load applied to an abrasive cloth (IC-1000) employed in semiconductor device manufacturing steps according to embodiments of the present invention and a compressive strain.

For example, as shown in FIG. 4, in the first polishing step, an abrasive cloth having a hard polishing surface, which has a ratio of a compressive strain to a compressive load of less than 0.06 $\mu m \cdot cm^2/g$, must be employed as the abrasive cloth 102. For example, IC-1000 (product name) manufactured by Rodel Co., Ltd. can satisfy this condition.

If the abrasive cloth 102 has a single structure which is formed of a single material, the Young's modulus one of the physical quantities which show the special qualities of the single material is $10^6 \sim 10^9$ N/m² order, preferably $1 \times 10^7$ N/m²~$5 \times 10^8$ N/m².

Figure 5:
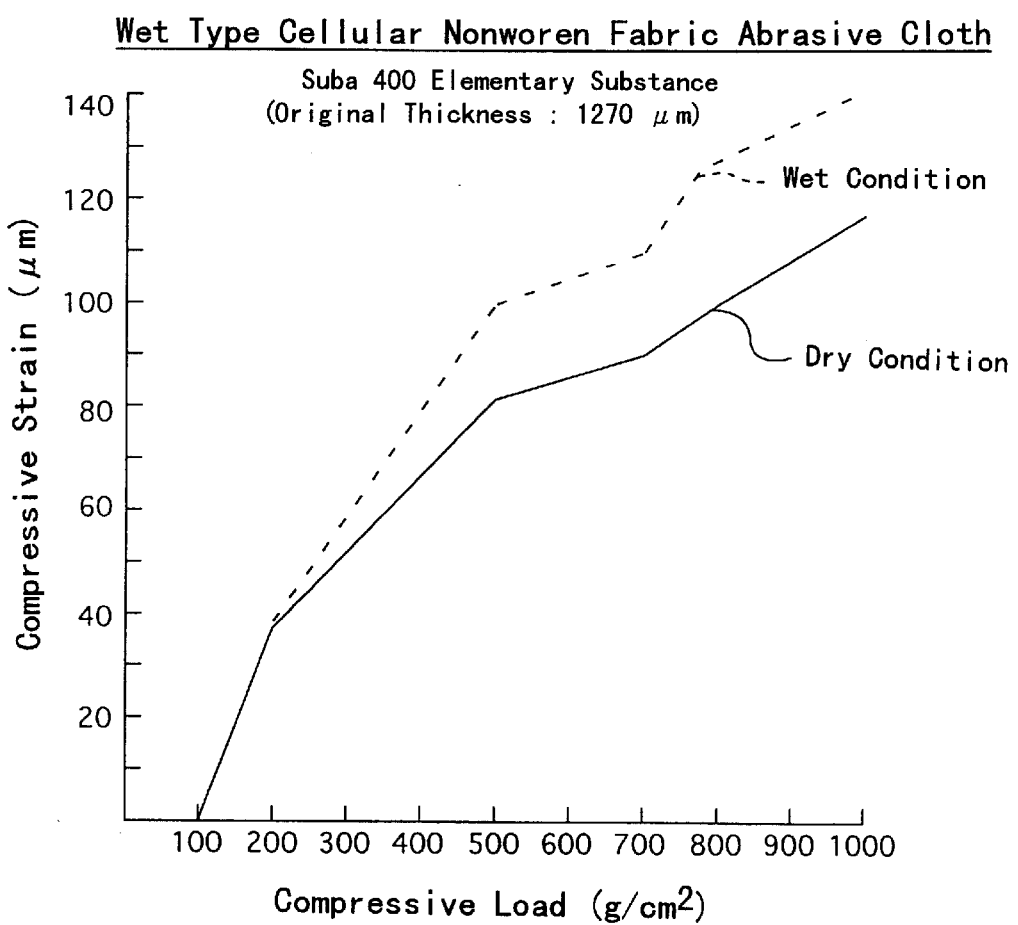
FIG. 5 is a graph showing relationships between a compressive load applied to an abrasive cloth (Suba 400) employed in semiconductor device manufacturing steps according to embodiments of the present invention and a compressive strain.

In contrast, since Suba 400 (product name) as the abrasive cloth 102 has a soft quality, as shown in FIG. 5, it is preferable that such Suba 400 should be employed In the second polishing step rather than the first polishing step. Also, IC-1400 (product name) manufactured by Rodel Co., Ltd. as the abrasive cloth can be used.

In FIG. 4 and FIG. 5, an ordinate denotes compressive strain in a linear scale, and an abscissa denotes a compressive load in a linear scale.

Next, a line velocity at a plurality of points on a surface of the polished substrate 33 in the polishing equipment will be explained hereunder.

The line velocity of the polished substrate 33 at the predetermined area can be calculated by the following equations.

In the following equations, as seen in FIG. 3B, assume that a radius of the polishing plate 31 is set to L0 and that distances from a center of the polishing plate 31 and a center of the substrate holder 32 to any point (x, y) on the polished substrate 33 respectively are set to L1, L2 respectively. Also, assume that inner angles of two straight lines, which connect the point (x, y) to the center of the polishing plate 31 and the center of the substrate holder 32, relative to the X axis are set to θ, φ respectively. Further, assume that a vibrating range of the center of the substrate holder 32 is set within a predetermined distance I0 from the center of the polishing plate 31 in the X axis direction.

Furthermore, the polishing plate 31 and the substrate holder 32 are rotated around the supporting axes 103, 106 respectively, and their angular velocities are set to ω1 and ω2 respectively.

In this case, a line velocity of a platen, a line velocity of a head, and a vibration component of the head at any point (x, y) are expressed by following equations.

① The line velocities (Vpx, Vpy) by the polishing plate 31 are expressed by $$Vpx = -L1\omega1 \sin\theta = -L1\omega1Y/L1 = -\omega1Y \quad (1)$$

$$Vpy = -L1\omega1 \cos\theta = -L1\omega1(L0-I0 \sin\omega3t-X)/L1 = -\omega1(L0-I0 \sin\omega3t-X) \quad (2)$$

② The line velocities (Vhx, Vhy) by the substrate holder 32 are expressed by $$Vhx = -L2\omega2 \sin\phi = -L2\omega2Y/L2 = -\omega2Y \quad (3)$$

$$Vhy = L2\omega2 \cos\phi = L2\omega2X/L2 = \omega2X \quad (4)$$

③ The vibration frequency f of the substrate holder 32 is expressed by Eq.(5). Where the head is vibrated periodically at the angular velocity ω3.

$$f = L0 - I0 \sin\omega3t \quad (5)$$

Then, a differential value f' of the vibration frequency f affects the line velocity of the substrate holder 32 in the X axis direction as a function of time. The differential value f' is expressed by $$f' = (L0 - I0 \sin\omega3t)/dt = I0\omega3 \cos\omega3t \quad (6)$$

With the above, by using above Eqs. in items ① to ③ in combination, the line velocities at any point (x, y) on the surface of the polished substrate 33 are expressed by Eqs. (7), (8). Where the rotation directions of the polishing plate 31 and the substrate holder 32 are assumed in the same direction.

$$Vx = Vpx - Vhx - I0\omega3 \cos\omega3t = (\omega2-\omega1)Y - I0\omega3 \cos\omega3t \quad (7)$$

$$Vy = Vpy - Vhy = -\omega1(L0-I0 \sin\omega3t) - (\omega2-\omega1)X \quad (8)$$

In the case that above Eqs. are applied to the polishing equipments manufactured by respective manufacturers, results of the line velocity being calculated by using the above Eqs. under the conditions given in the following are shown in Table 1. In the calculation of Table 1, rotating conditions in the polishing equipments manufactured by respective manufacturers are set to values given hereunder. Where measuring points A to E in Table 1 are set such that a center point of the polished substrate 33 shown in FIG. 3B is A, left and right points thereof are B and C, and upper and lower points thereof are D and E. In this case, vibration components are not contained in formulating Table 1.

① (Polishing equipment 6DP-SP)
L0=17.5 cm
◇ First step polishing
Rotation speed of the substrate holder=45 rpm
Rotation speed of the polishing plate=45 rpm
ω1=90π rad/min
ω2=90π rad/min ◇ Second step polishing
Rotation speed of the substrate holder=30 rpm
Rotation speed of the polishing plate=30 rpm
ω1=60π rad/min
ω2=60π rad/min ② Polishing equipment 6ED
L0=24 cm
◇ First and second step polishing
Rotation speed of the substrate holder=40 rpm
Rotation speed of the polishing plate=33 rpm
ω1=66π rad/min
ω2=80π rad/min ③ Polishing equipment MIRRA3400
L0=12.7 cm
◇ First and second step polishing
Rotation speed of the substrate holder-97 rpm
Rotation speed of the polishing plate=103 rpm
ω1=206π rad/min
ω2=194π rad/min

TABLE 1

|  |  | 6DS-SP |  | 6ED |  | MIRRA3400 |  |
| --- | --- | --- | --- | --- | --- | --- | --- |
|  | position | Vx | Vy | Vx | Vy | Vx | Vy |
| 1-st polishing step | A | 0 | −4948 | 0 | −4976 | 0 | −8219 |
|  | B | 0 | −4948 | 0 | −4096 | 0 | −8973 |
|  | C | 0 | −4948 | 0 | −5856 | 0 | −7465 |
|  | D | 0 | −4948 | 880 | −4976 | −754 | −8219 |
|  | E | 0 | −4948 | −880 | −4976 | 754 | −8219 |
| 2-nd polishing step | A | 0 | −3299 | 0 | −4976 | 0 | −8219 |
|  | B | 0 | −3299 | 0 | −4096 | 0 | −8973 |
|  | C | 0 | −3299 | 0 | −5856 | 0 | −7465 |
|  | D | 0 | −3299 | 880 | −4976 | −754 | −8219 |
|  | E | 0 | −3299 | −880 | −4976 | 154 | −8219 |

Note)
1. Unit is cm/min.
2. In the X direction, a positive sign denotes a rightward direction. In the Y direction, a positive sign denotes an upward direction.

Next, while taking the step of forming the shallow trench isolation on the semiconductor substrate as an example, concrete polishing methods will be explained hereunder.

Figure 6:
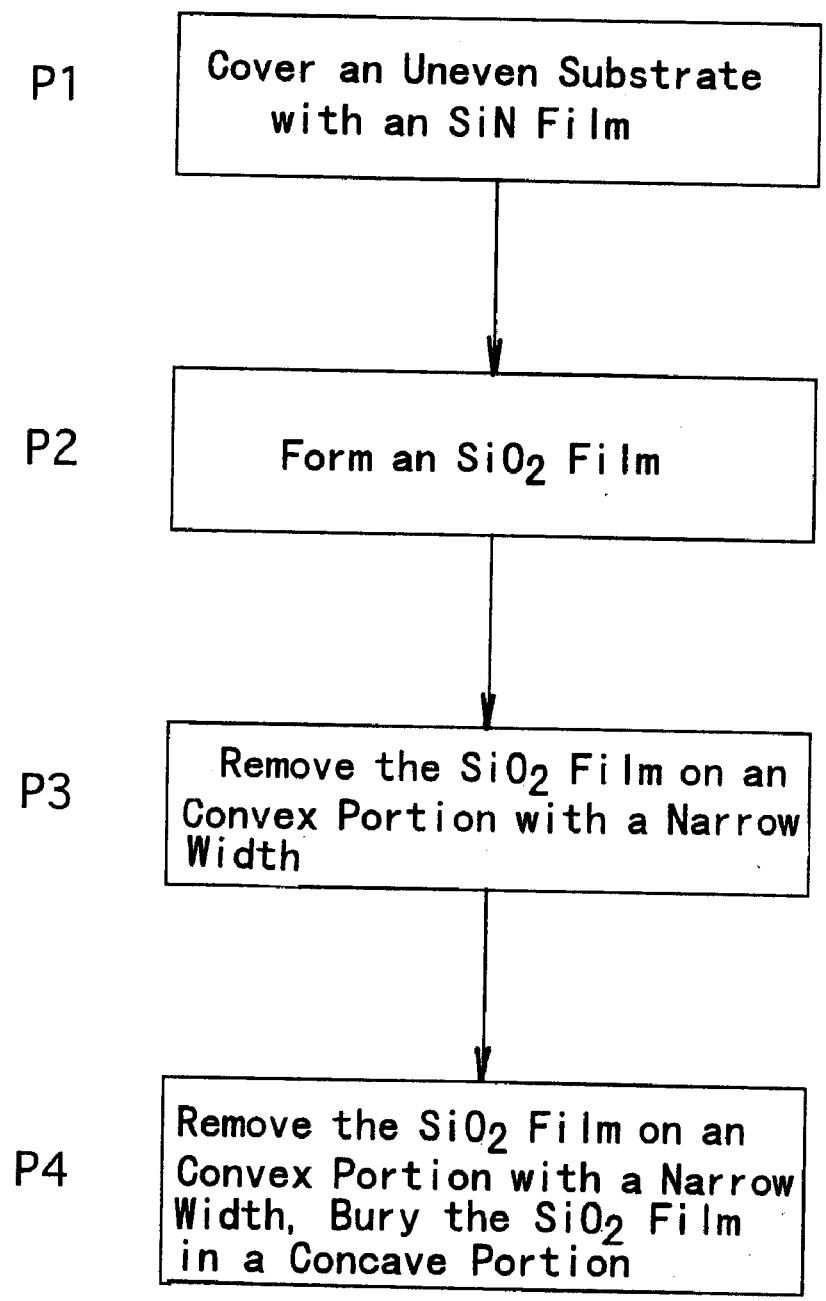
FIG. 6 is a flowchart showing a shallow trench isolation forming method according to a first embodiment of the present invention.

FIG. 6 is a flowchart showing a shallow trench isolation forming method according to a first embodiment of the present invention. FIGS. 7A to 7E are sectional views showing shallow trench isolation manufacturing steps according to the first embodiment of the present invention.

In FIG. 6, the step of forming an uneven substrate covered with an SiN film shown in P1 will be made as follows.

Figure 7A:
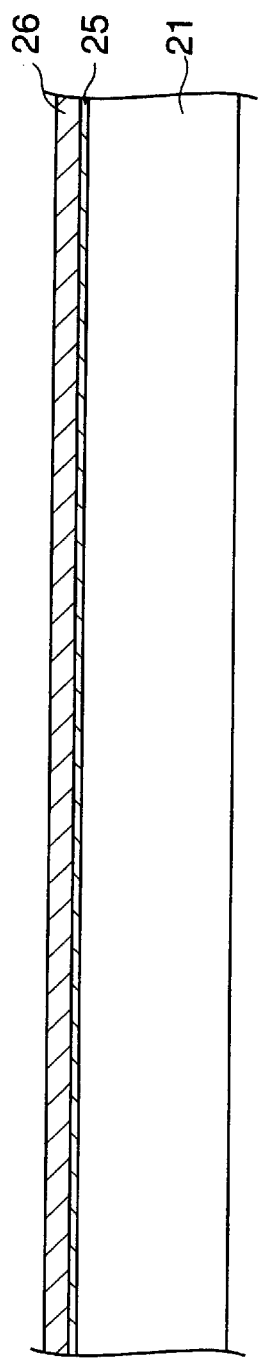
FIGS. 7A to 7E are sectional views showing shallow trench isolation manufacturing steps according to the first embodiment of the present invention.

First, as shown in FIG. 7A, an oxide film (silicon oxide film) 25 of about 10 nm thickness and a nitride film (silicon nitride film) 26 of about 100 to 250 nm thickness are formed in sequence on a surface of the silicon substrate (semiconductor substrate) 21 which has a diameter of 8 inchs. Where the oxide film 25 is formed of silicon oxide ($SiO_2$), and the nitride film 26 is an underlying insulating film like silicon nitride ($Si_3N_4$), silicon nitride oxide (SiON), or the like, which includes nitrogen as a major component. If the silicon nitride is to be grown, such conditions are employed that, for example, dichlorosilane ($SiH_2Cl_2$) and ammonia ($NH_3$) are used as a reaction gas, a growth temperature is set to 800° C., and a growth atmospheric pressure is set to about 0.2 Torr.

Figure 7B:
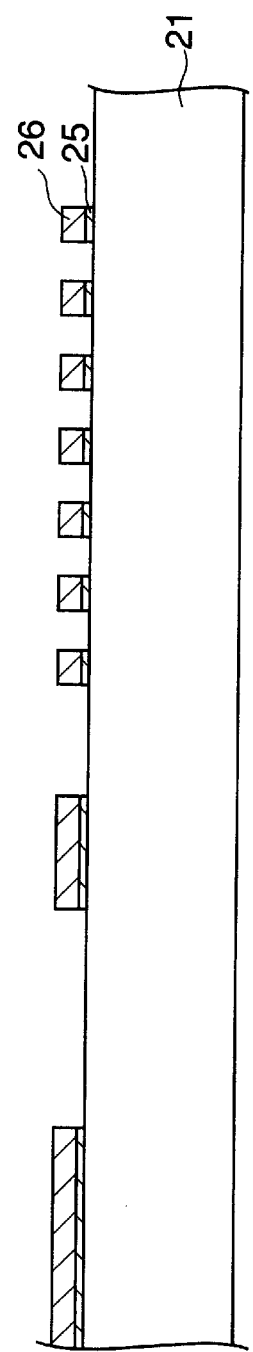
Figure 7C:
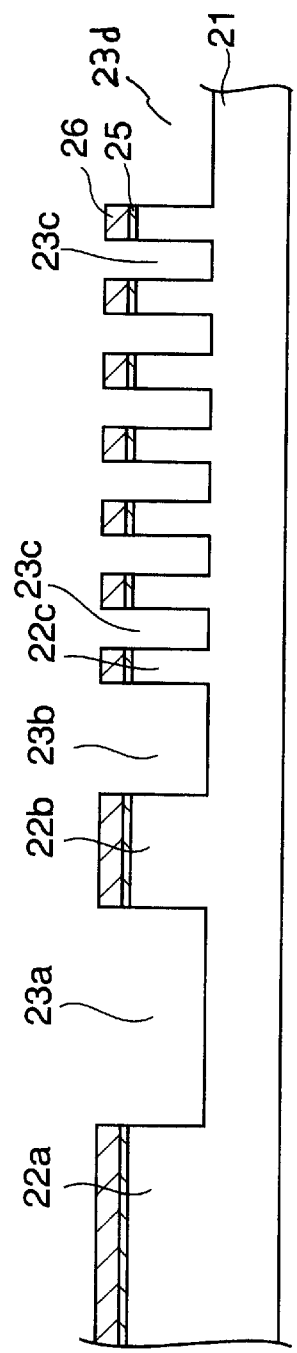

Then, as shown in FIG. 7B, the oxide film 25 and the nitride film 26 located in a device isolation region are removed. Then, as shown in FIG. 7C, a first shallow trench (groove) 23a to a fourth trench (groove) 23d are formed by etching portions of the silicon substrate 21, which are not covered with the oxide film 25 and the nitride film 26, up to a depth of about 0.2 μm to 0.5 μm.

At this time, device forming regions of the silicon substrate 21 are partitioned by the first trench 23a to the fourth trench 23d. Regions located adjacent to the third trench 23c having a narrow width of about 0.25 μm respectively are first device regions 22c each has a small area. A region located adjacent to the second trench 23b having a middle width of 10 μm is a second device region 22b which has a middle area. Regions located adjacent to the first trench 23a and the fourth trench 23d each having a wide width of more than several tens μm respectively are a third device region 22a which has a large area. Then, a silicon oxide film 24 of about 10 nm thickness is formed by thermally oxidizing exposed surfaces of the silicon substrate 21. As a result, steps of forming the substrate, in which convex device regions located adjacent to the first shallow trench 23a to the fourth trench 23d are covered with the nitride film 26, are completed.

Then, the process goes to a step P2 shown in FIG. 6.

Figure 7D:
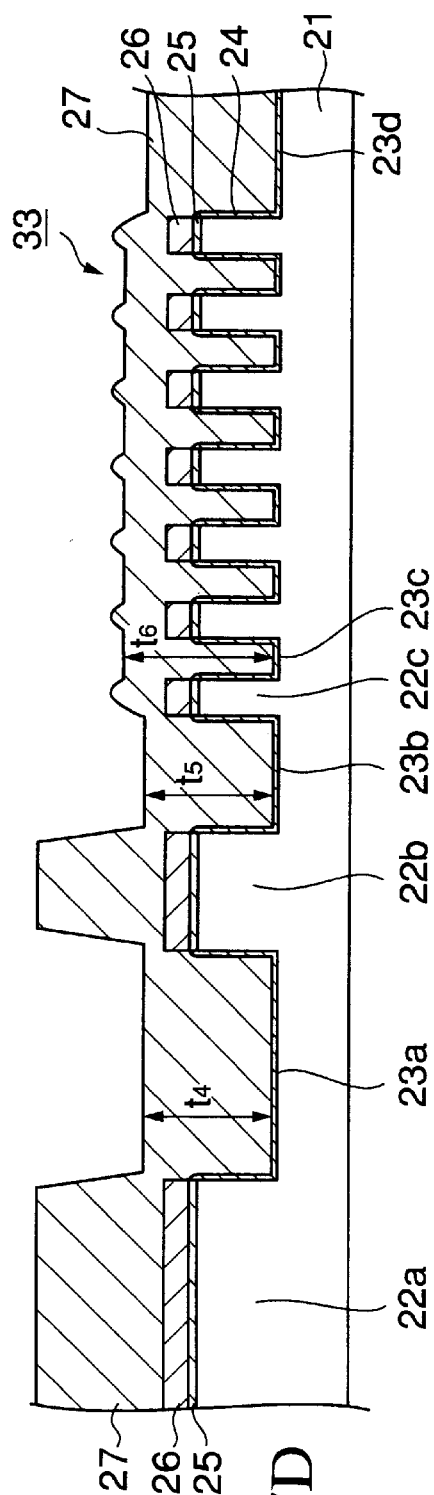

In this step, as shown in FIG. 7D, a silicon oxide film 27 which has a thickness, e.g., about 730 nm, larger than a depth of the first shallow trench 23a to the fourth trench 23d is formed on a surface of the silicon substrate 21 by using the so-called HDP (High Density Plasma)-CVD (Chemical Vapor Deposition) method like the ICP (Inductive Coupling Plasma) method, the ECR (Electron Cyclotron Resonance) method, etc. such that this silicon oxide film 27 can be completely buried in the first shallow trench 23a to the fourth trench 23d. If the film 27 is formed by using the high density plasma CVD method, filling-up of the silicon oxide film 27 into the third shallow trenches 23c which has the narrow width can be performed more perfectly. This silicon oxide film 27 may be formed of PSG, BPSG, ESG, or the like into which impurity is doped.

If the silicon oxide film 27 is grown by the HDP-CVD method, SiH4, oxygen, and dilution gas are introduced into a reaction chamber (not shown) at a flow rate of about 150 scam, about 230 scan, and about 400 sccm, for example, respectively.

Exposed surfaces of the silicon oxide film 27 are not flat, but unevenness is generated on the exposed surfaces, In addition, a thickness of the silicon oxide film 27 becomes thick on the first device region 22a and the second device region 22b, while the thickness of the silicon oxide film 27 becomes thin on the third device regions 22c each has the small area. The thickness t6 of the silicon oxide film 27 in the buried region of the third narrow trenches 23c is thicker than the thickness t4 or t5 of the silicon oxide film 27 in the buried region of the first device region 22a or the second device region 22b. In the event that the depth of the first shallow trench 23a to the fourth trench 23d is set to 0.4 μm and the width of the third trench 23c is set to about 0.25 μm, the thickness t6 becomes about 1.1 times thicker than the thickness t4 or t5 when the silicon oxide film 27 is grown in the first device region 22a to have the thickness of about 730 nm.

The silicon substrate 21 in this state is called the polished substrate 33.

Subsequently, the process advances to the first step polishing step shown in P3 in FIG. 6.

In the first step polishing step, the hard IC-1000 (product name) is employed as the abrasive cloth 102. Also, PLANERLITE-6103 (product name) manufactured by Fujimi Co., Ltd., SS-25 (product name) manufactured by Cabot Co., Ltd., or Rodel 2371 (product name) manufactured by Rodel Co., Ltd. is employed as the slurry. In case PLANERLITE-6103 or SS-25 is employed, it is diluted with the ionized water. Differences in polished results depending upon the type of polishing material will be described later.

At first, after the polished substrate 33 is fitted onto the lower surface of the substrate holder 32 to direct the silicon oxide film 27 downward, the polishing plate 31 is rotated at a predetermined rotation speed R1 and also the substrate holder 32 is rotated at a predetermined rotation speed R2 in the same direction or the opposite direction to the polishing plate 31.

In turn, the substrate holder 32 and the polishing plate 31 are brought close to each other and at the same time the slurry is passed onto the abrasive cloth 102 at a flow rate of 350 cc/min, whereby the slurry can be supplied between the abrasive cloth 102 and the polished substrate 33. The slurry is supplied from a slurry supplying nozzle 107.

Then, the silicon oxide film 27 of the polished substrate 33 is brought into contact with the abrasive cloth 102 by pushing the substrate holder 32 to start the polishing.

If this polishing condition is maintained for a predetermined time, only the silicon oxide film 27, which is projected on the third device region 22c which has the small area and the second device region 22b which has the middle area, is polished mainly by the hard abrasive cloth 102, so that a volume of the silicon oxide film 27 can be reduced. The first step polishing step is terminated at the point of time when the predetermined polishing time has been lapsed.

If the hard abrasive cloth 102 is employed in this manner, convex portions which have a large projection amount selectively comes into contact with the polishing pad, and thus the convex portion is brought strongly into contact with the abrasive cloth 102 rather than the concave portion. Therefore, the polishing rate on the convex portions becomes larger and thus selective polishing can be achieved. Then, in the initial stage of the first step, mainly the polishing is consumed to planarize the convex portions.

In this event, in order to perform effectively the first step polishing, it is preferable that such a polished substrate 33 should be employed that a remaining region of the silicon nitride film 26 except the first shallow trench 23a to the fourth trench 23d is more than 10% of a total area of the upper surface of the wafer, preferably more than 30%, but is about 70% of the total area at its maximum.

Next, the process is shifted to the second step polishing step shown in P4 in FIG. 6.

In this second step polishing step, IC-1400 (product name) is employed as the abrasive cloth 102 to remove the remaining silicon oxide film 27. In this case, material of the slurry is changed. As the material, the slurry in which the humid silica (abrasive grain) is dispersed in the dispersant (polishing accelerator) containing KOH, for example, may be used. For instance, there is SS-25 (product name) manufactured by Cabot Co., Ltd., and this SS-25 is diluted with the ionized water in the ratio 1:1.

While supplying the slurry onto the abrasive cloth 102 at a flow rate of 300 cc/min, the polishing plate 31 is rotated at a rotation speed R3 and also the substrate holder 32 is rotated at a rotation speed R4 in the same direction or the opposite direction to the polishing plate 31. Then, polishing of the silicon oxide film 27 is started by pushing the polished substrate 33 against the abrasive cloth 102, and polishing is ended when the abrasive cloth 102 reaches the nitride film 26 as a polishing end point. Since the abrasive cloth 102 is exchanged by the soft abrasive cloth in the second step polishing, a pushing force of the abrasive cloth 102 applied to the convex portions of the silicon oxide film 27 is reduced smaller than that in the first step polishing. As a result, difference between polishing amount of the concave portions and polishing amount of the concave portions can be reduced.

Figure 7E:
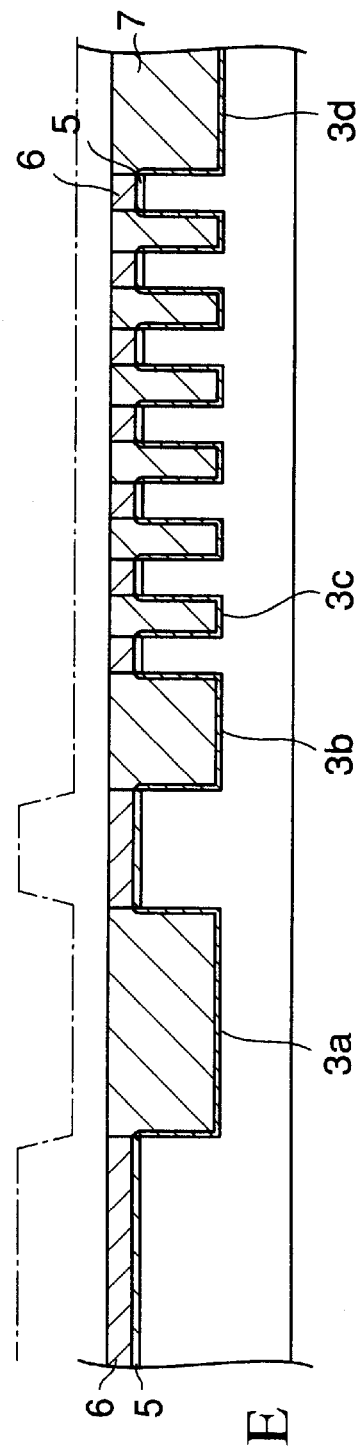

In such second step polishing step, as shown in FIG. 7E, the silicon oxide film 27 on the first device region 22a which has the wide area is also polished and removed. In other words, the silicon oxide film 27 on all the first device region 22a to the fourth device region 22d can be polished and removed to expose the silicon nitride film 26. In this condition, the polishing rate is reduced small.

At the point of time when the entire nitride film 26 is exposed, polishing is stopped. Thus, the shallow trench isolation (STI) for the device isolation can be formed by the first trench 23a to the fourth trench 23d in which the silicon oxide film 27 is buried. Then, the nitride film 26 and the silicon oxide film 27 are removed.

Thereafter, DRAM, SRAM, logic circuit, other devices are formed in the first device region 22a to the fourth device region 22d which are isolated by the STI.

In the above embodiment of the present invention, the silicon oxide film 27 formed by the HDP-CVD method is employed as the insulating film which is the polished object. However, a film which is formed while executing film formation and sputter etching simultaneously or repeating film formation and sputter etching may be employed as the polished object. If such film is employed, it is possible to fill the film into the narrow trenches more perfectly, like the first embodiment.

Then, difference in polishing caused when conditions of the first step polishing and the second step polishing are changed will be explained hereunder.

FRIST EXAMPLE

In the condition shown in FIG. 7D, 6DS-SP (product name) manufactured by Strassbar Co., Ltd. is employed as the polishing equipment used to polish the silicon oxide film 27, and then the first step polishing and the second step polishing are carried out.

To begin with, the first step polishing is carried out by using IC-1000 as the abrasive cloth 102. The slurry which is formed by dispersing colloidal silica (abrasive grains) into the amine dispersant (polishing accelerator). e.g., PLANERLITE-6103 (product name) manufactured by Fujimi Co., Ltd., is employed as the slurry. The abrasive cloth 102, and other polishing conditions are given in Table 2.

TABLE 2

| Polishing Equipment | Strassbar Co., Ltd. 6DS-SP |
| --- | --- |
| 1-st CMP | |
| Abrasive cloth | IC-1000 |
| Slurry | PLANERLITE-6103:ionized water = 1:1 |
| Down force | 5 psi |
| Back pressure | 1 psi |
| Rotation speed R1 of polishing plate | 45 rpm |
| Rotation speed R2 of substrate holder | 45 rpm (R1 and R2 are in the same direction) |
| Polishing rate | less than 50 nm/min |

PLANERLITE-6103 as the slurry is normally used as the polysilicon slurry, and has a small polishing rate because it does not chemically react with the silicon oxide film 27. But the polishing rate is adjusted below 200 nm/min according to above pushing forces (down force, back pressure), etc.

This is because a mechanical pressure is enhanced if the polishing rate is increased, and thus a polishing rate of the silicon oxide film 27 on the first trench 23a to the fourth trench 23d is also increased.

Figure 8:
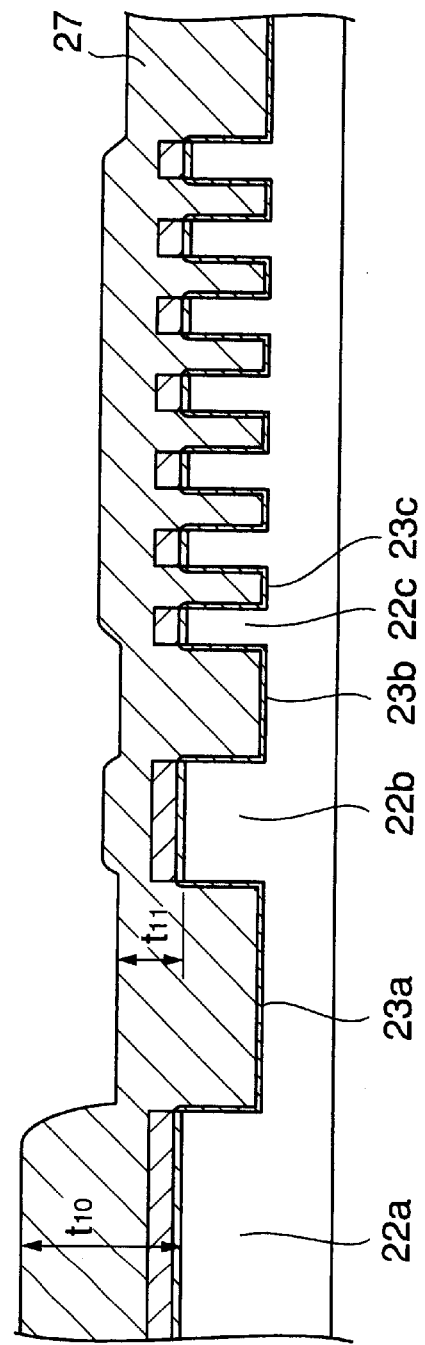
FIG. 8 is a sectional view showing a state after a first polishing step has been finished In the shallow trench isolation manufacturing steps according to the first embodiment of the present invention.
Figure 9A:
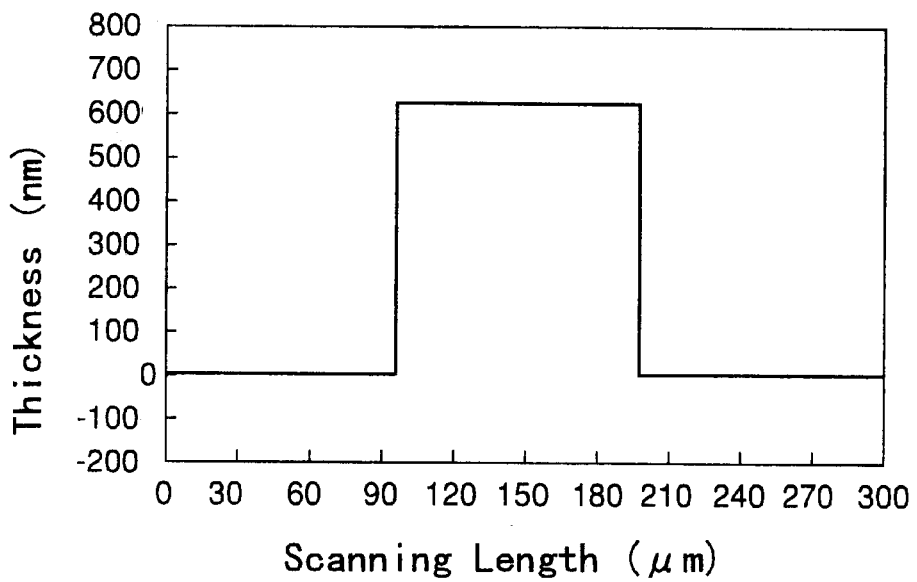
FIGS. 9A to 9D are views showing a before- polishing state of a silicon oxide film, which is employed in the shallow trench isolation formation according to the first embodiment of the present invention, measured by a step measuring device respectively.
Figure 9B:
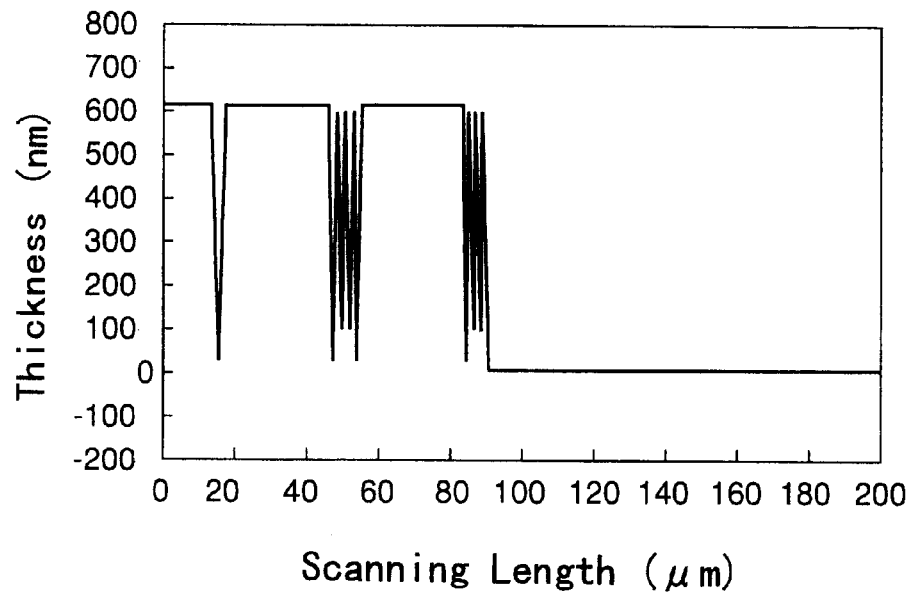
Figure 9C:
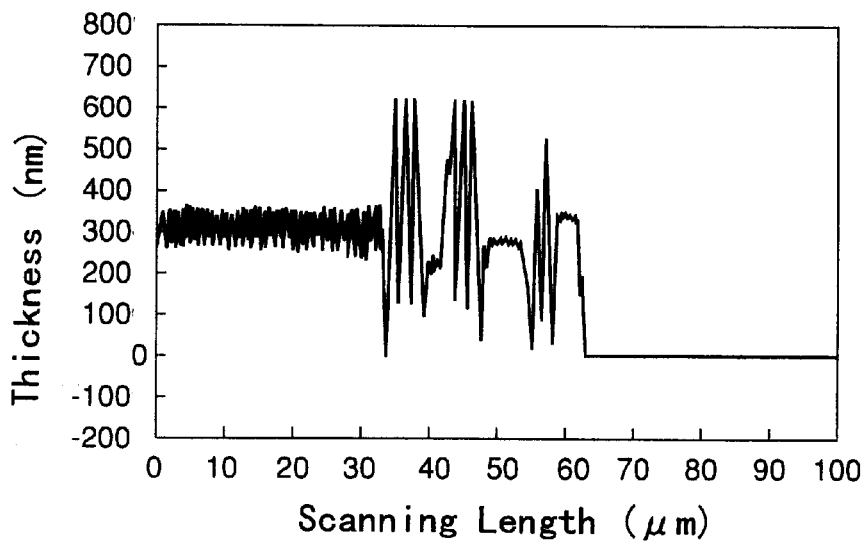
Figure 9D:
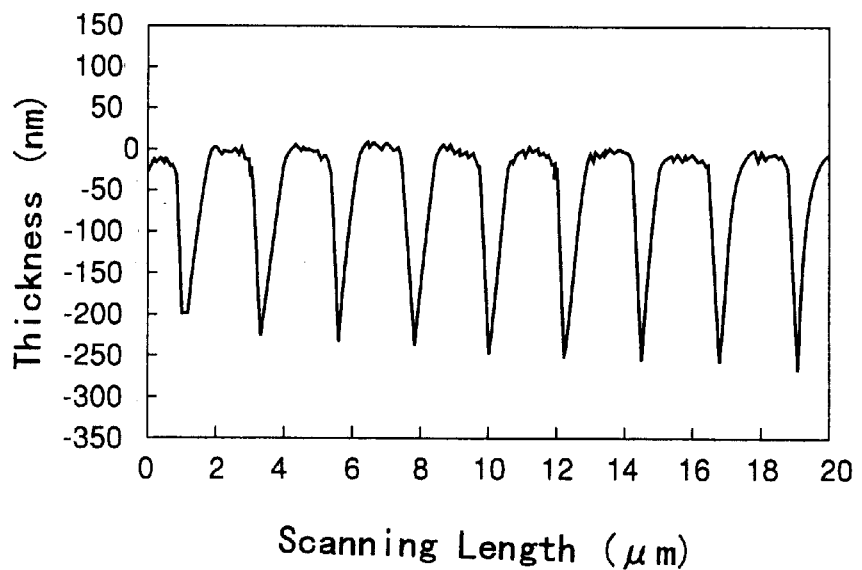
Figure 10A:
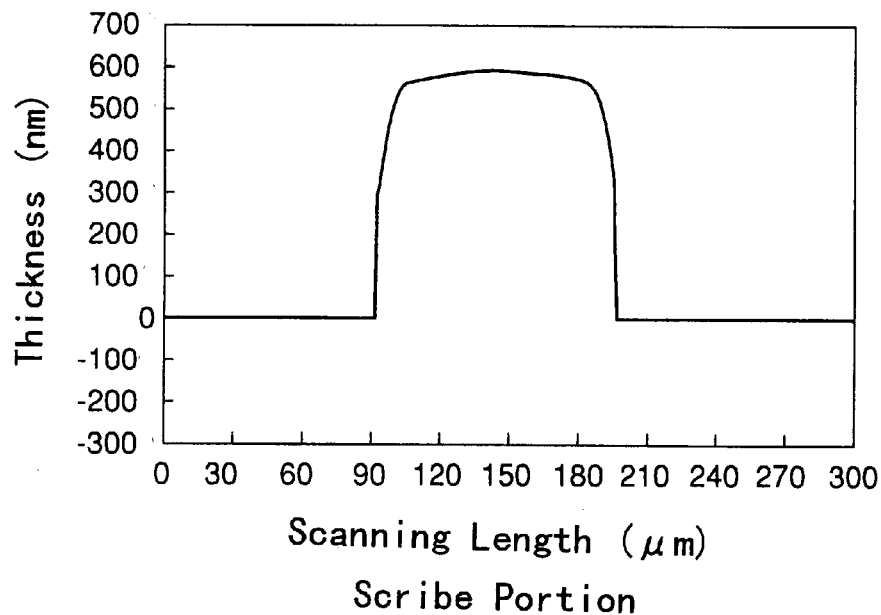
FIGS. 10A to 10D are views showing level difference of a surface of the silicon oxide film, which is employed in the shallow trench isolation formation according to the first embodiment of the present invention, after a first step polishing has been finished, respectively.
Figure 10B:
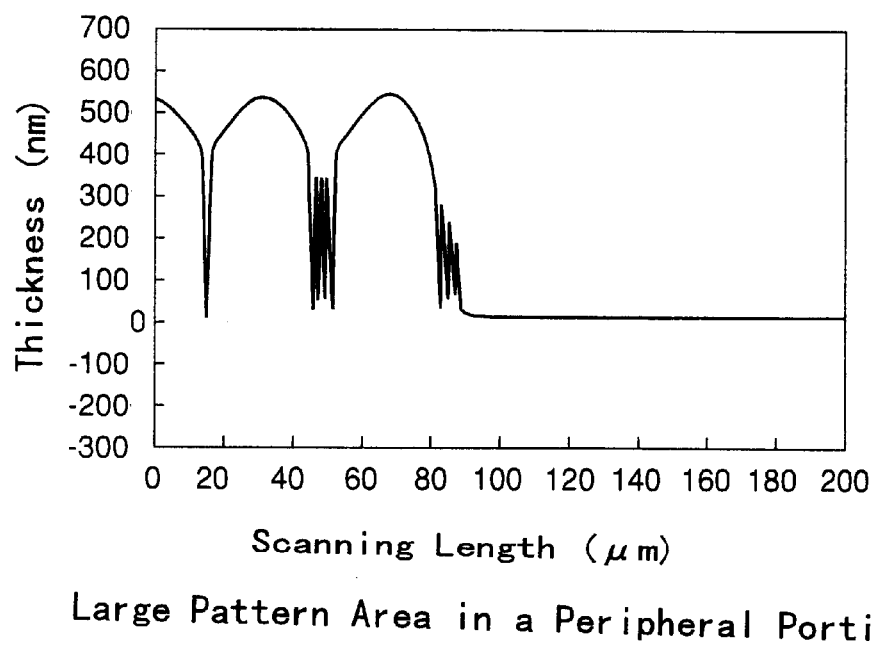
Figure 10C:
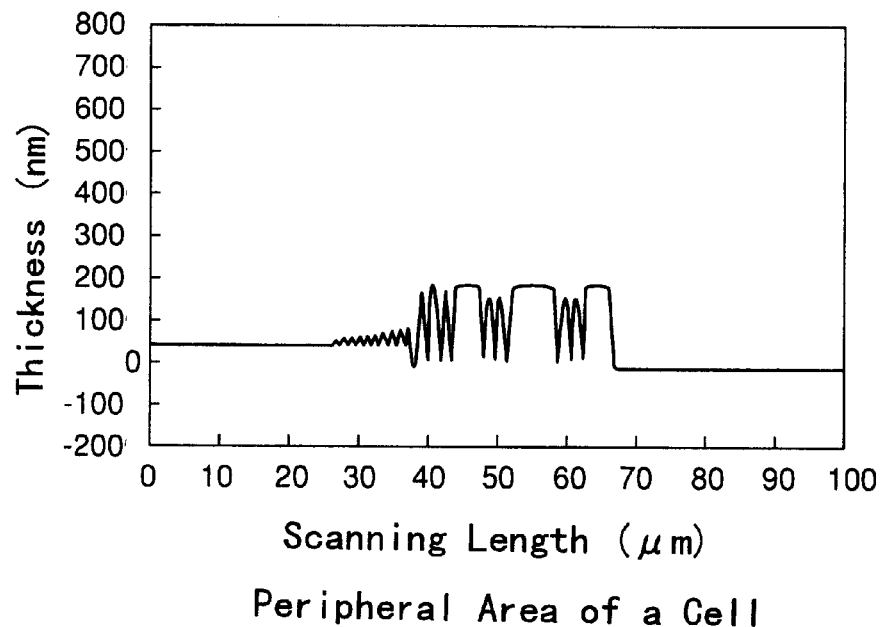
Figure 10D:
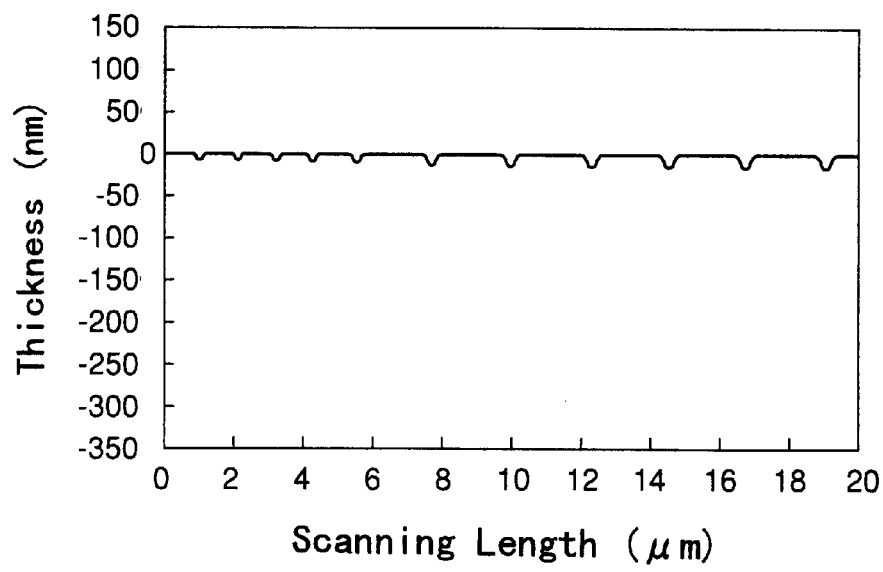

When the silicon oxide film 27 shown in FIG. 7D is polished according to the conditions given in Table 2. a top portion of the silicon oxide film 27 on the first device region 22a which has the large area is rounded as shown in FIG. 8 and thus its volume is reduced.

The reason for that the silicon oxide film 27 is polished to such extent that only the convex portion of the silicon oxide film 27 in the first device region 22a is rounded can be given as follows.

That is, since the silicon oxide film 27 which is projected on the third device region 22c which has the narrow area and the second device region 22b which has the middle area is mechanically weakened respectively, the physical pressure is applied to such silicon oxide film 27 by the hard abrasive cloth. Also, since the silicon oxide film 27 on the first device region 22a is largely projected, such silicon oxide film 27 is strongly pushed by the abrasive cloth 102 and thus its volume is reduced largely.

As described above, if an amount of the silicon oxide film 27 which is formed as the convex portions in FIG. 7D is reduced, excessive polishing of the silicon oxide film 27 on the first trench 23a to the fourth trench 23d can be suppressed in the succeeding second step polishing step.

Next, the polishing goes to the second step polishing step.

Before the second step polishing, the abrasive cloth IC-1000 is replaced with IC-1400 and the slurry in which SS-25 (product name) is diluted with the ionized water at a ratio of 1:1 is employed. The abrasive cloth IC-1400 is formed of the cellular polyurethane like IC-1000, but has a double-layered structure in which material having softness being almost identical to Suba 400 is formed under the cellular polyurethane.

The conditions of the second step polishing are given in Table 3.

TABLE 3

| Polishing Equipment | Strassbar Co., Ltd. 6DS-SP |
| --- | --- |
| 2-nd CMP | |
| Abrasive cloth | IC-1400 |
| Slurry | SS-25:ionized water = 1:1 |
| Down force | 6 psi |
| Back pressure | 1 psi |
| Rotation speed R3 of polishing plate | 30 rpm |
| Rotation speed R4 of substrate holder | 30 rpm (R3 and R4 are in the same direction) |
| Polishing rate | less than 250 nm/min |

In contrast. in the second step polishing, as shown in Table 3, the pushing forces are set small, the polishing plate 31 is rotated at a relatively high speed, and a follow-up performance of the abrasive cloth 102 on the surface of the polishing plate 31 to the unevenness of the surface of the polished substrate 33 (follow-up performance in deformation of the abrasive cloth to the unevenness of the surface) is lowered. Accordingly, the polishing rate of the thick silicon oxide film 27 left on the first element region 22a which the wide area is enhanced, and finally the silicon oxide film 27 on the nitride film 26 is removed. The nitride film 26 functions as a film for detecting the end point of the polishing. As a result, the region which contains the surface of the silicon oxide film 27 buried in the first trench 23a.to the fourth trench 23d to the surface of the nitride film 26 can be planarized.

As described above, in the first step polishing step, if the volume of the silicon oxide film 27 located in the first device region 22a having the wide area or the second device region 22b having the middle area is reduced by the polishing in which the mechanical element is strong, such a phenomenon that the upper surface of the silicon oxide film 27 in the first trench 23a to the fourth trench 23d becomes depressed like a dish, i.e., a dishing phenomenon, is hard to occur when the second step polishing is terminated.

Moreover, since, unlike the prior art, the present embodiment does not include the step of etching the silicon oxide film by using the resist, the steps can be shortened and the throughput can be improved.

By the way, level difference of the surface of the silicon oxide film 27 before the first step polishing step mentioned above is started and level difference of the surface of the silicon oxide film 27 after the first step polishing step has been finished are measured by a step measuring device (HRP) respectively. Measurement results are shown in FIGS. 9A to 9D, and 10A to 10D.

FIGS. 9A to 9D are views showing initial level difference of the surface of the silicon oxide film 27 respectively. FIGS. 10A to 10D are views showing level difference of the surface of the silicon oxide film 27 respectively after the first step polishing has been finished.

Out of the silicon substrate on which DRAM is to be formed, four regions, i.e., a scribe portion, a large pattern forming portion in a peripheral circuit region, a peripheral portion of the cell, and an inside portion of the cell are measured.

The scribe portion in which the nitride film 26 is present and the large pattern forming portion in the peripheral circuit region have a wide area themselves. Therefore, as can be seen from changes in FIG. 9A and 93 to FIG. 10A and 10B, corners of the convex portions of the silicon oxide film 27 which is left on the scribe portion and the large pattern forming portion are rounded after the first step polishing has been finished. In addition, it can be understood that, by comparing FIGS. 9C and 9D with FIGS. 10C and 10D, the convex portions of the silicon oxide film 27 are considerably reduced in height in the peripheral portion of the cell and the inside portion of the cell.

After such second step polishing has been completed, the polished surface of the polished substrate 33 is planarized, as shown in FIG. 7E.

SECOND EXAMPLE

In the condition shown in FIG. 7D, MIRRA-3400 (product name) manufactured by Applied Material Co., Ltd. is employed as the polishing equipment used to polish the silicon oxide film 27, and then the first step polishing and the second step polishing are carried out.

In the second example, the abrasive cloth and the slurry which are the same as those in the first example are employed.

The conditions for the first step polishing are given in Table 4, and also the conditions for the second step polishing are set forth in Table 5.

TABLE 4

| Polishing Equipment | Applied Material Co., Ltd. MIRRA-3400 |
|---|---|
| 1-st CMP | |
| Abrasive cloth | IC-1000 |
| Slurry | PLANERLITE-6103:ionized water = 1:1 |
| Membrane pressure | 5 psi |
| Inner tube pressure | 7 psi |
| Retainer ring pressure | 9 psi |
| Rotation speed R1 of polishing plate | 103 rpm |
| Rotation speed R2 of substrate holder | 97 rpm (R1 and R2 are in the same direction) |
| Polishing rate | 120 nm/min |

TABLE 5

| Polishing Equipment | Applied Material Co., Ltd. MIRRA-3400 |
|---|---|
| 2-nd CMP | |
| Abrasive cloth | IC-1400 |
| Slurry | SS-25:ionized water = 1:1 |
| Membrane pressure | 3.5 psi |
| Inner tube pressure | 3 psi |
| Retainer ring pressure | 5 psi |
| Rotation speed R3 of polishing plate | 103 rpm |
| Rotation speed R4 of substrate holder | 97 rpm (R3 and R4 are in the same direction) |
| Polishing rate | 330 nm/min |

In the first step polishing step, like the first example, the silicon oxide film 27 which is projected on the third device region 22c having the narrow area is ready to be physically removed due to contact of the hard abrasive cloth 102. On the contrary, since the silicon oxide film 27 on the first device region 22a having the wide area is mechanically strong and also the slurry is difficult to react chemically with the silicon oxide film 27 as the polishing object, the silicon oxide film 27 is hardly polished in the regions and thus upper corners of the silicon oxide film 27 are rounded as shown in FIG. 8.

In the polishing in the second step polishing step, the slurry which can react chemically with the polishing object is employed, the pushing force of the abrasive cloth 102 against the polishing object is set small, and the base plate 101 is rotated at the high speed. As a consequence, the follow-up performance of the abrasive cloth 102 onto the polished surface of the polished substrate 33 can be reduced. Then, the thick silicon oxide film 27 being left in the first device region 22a having the wide area is polished, and also the silicon oxide film 27 is buried in the first trench 23a to the fourth trench 23d, so that the planarized surface can be achieved.

According to the second example, the silicon oxide film 27 can be buried simply in the concave portions of the polished substrate by a single polishing step and also the surface of the polished substrate 33 can be planarized.

Then, as shown in FIG. 8, after the first step polishing has been ended, the thickness t10 of all films which are present in the first device region 22a on the silicon substrate 21 and the projected thickness t11 from the upper surface of the silicon substrate 21 adjacent to the first trench 23a are examined. In this case, the thickness t10 is called the film thickness in the device region, and the thickness t11 is called the projection amount.

At first, it has been examined how the thicknesses to and t11 distribute after the above first step polishing and also how the thicknesses t10 and t11 distribute after the second step polishing. Such film distribution is shown in FIG. 11A and FIG. 11B.

Figure 11A:
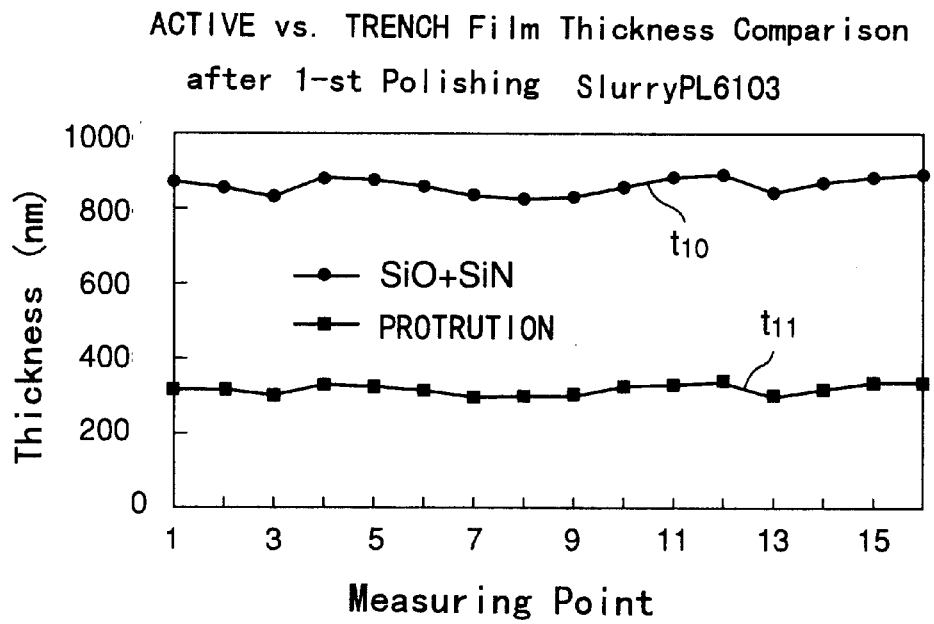
FIG. 11A is a graph showing a film thickness distribution of the silicon oxide film, which is employed in the shallow trench isolation formation according to the first embodiment of the present invention, at a predetermined location after the first step polishing has been finished.
Figure 11B:
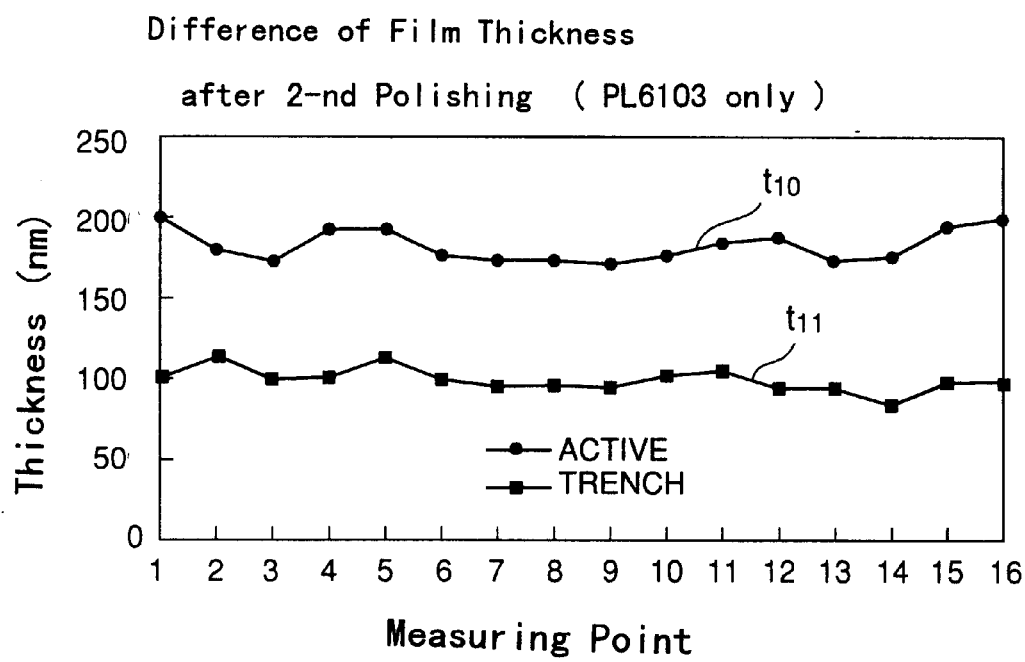
FIG. 11B is a graph showing a film thickness distribution of the silicon oxide film, which is employed in the shallow trench isolation formation according to the first embodiment of the present invention, at a predetermined location after a second step polishing has been finished.

In FIG. 11A showing the film thickness after the first step polishing has been finished, there is difference of about 600 nm in film thickness between t10 and t11 after the first step polishing. On the contrary, in FIG. 11 showing the film thickness after the second step polishing has been finished, there is difference of about 80 nm in film thickness between t10 and t11. Thus, it can be understood that the surface is rather planarized.

THIRD EXAMPLE

In the condition shown in FIG. 7D, MIRRA-3400 (product name) manufactured by Applied Material Co., Ltd. is employed as the polishing equipment used to polish the silicon oxide film 27, and then the first step polishing and the second step polishing are carried out.

In the third example, the polishing conditions except the slurry used in the first step polishing are set identically to those in the second example. In the third example, slurry in which SS-25 (product name) containing KOH as the dispersant Is diluted with the ionized water is employed as the slurry used in the first step polishing. In this case, if an amount of SS-25 is assumed to 1, an amount of the ionized water is set to 2.5. Also, slurry which contains silica or cerium oxide ($CeO_2$) as the abrasive grain contained in the slurry may be employed. Also, slurry which contains $NH_4OH$ as the dispersant may be employed.

The conditions for the first step polishing are given in Table 6, and also the conditions for the second step polishing are set forth in Table 7. It is preferable that a relative line velocity between the polished substrate 33 and the base plate 101 is set to more than 40 m/min.

TABLE 6

| Polishing Equipment | Applied Material Co., Ltd. MIRRA-3400 |
| --- | --- |
| 1-st CMP | |
| Abrasive cloth | IC-1000 |
| Slurry | SS-25:ionized water = 1:2.5 |
| Membrane pressure | 5 psi |
| Inner tube pressure | 7 psi |
| Retainer ring pressure | 9 psi |
| Rotation speed R1 of polishing plate | 103 rpm |
| Rotation speed R2 of substrate holder | 97 rpm (R1 and R2 are in the same direction) |
| Polishing rate | 330 nm/min |

TABLE 7

| Polishing Equipment | Applied Material Co., Ltd. MIRRA-3400 |
| --- | --- |
| 2-nd CMP | |
| Abrasive cloth | IC-1400 |
| Slurry | SS-25:ionized water = 1:1 |
| Membrane pressure | 3.5 psi |
| Inner tube pressure | 3 psi |

TABLE 7-continued

| Polishing Equipment | Applied Material Co., Ltd. MIRRA-3400 |
| --- | --- |
| Retainer ring pressure | 5 psi |
| Rotation speed R3 of polishing plate | 103 rpm |
| Rotation speed R4 of substrate holder | 97 rpm (R3 and R4 are in the same direction) |
| Polishing rate | 330 nm/min |

Figure 12A:
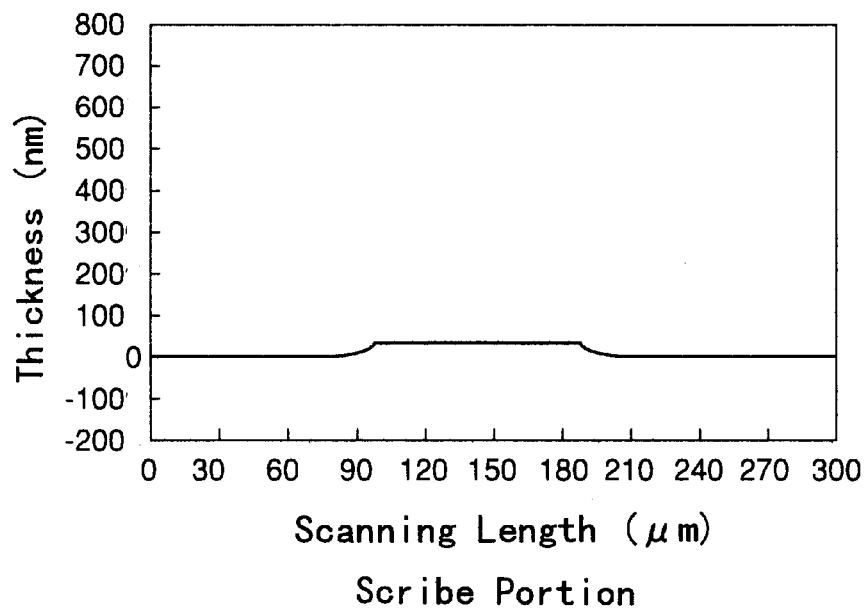
FIGS. 12A to 12D are views showing level difference of the silicon oxide film after the polishing if slurry is changed in the first step polishing during the shallow trench isolation formation according to the first embodiment of the present invention respectively.
Figure 12B:
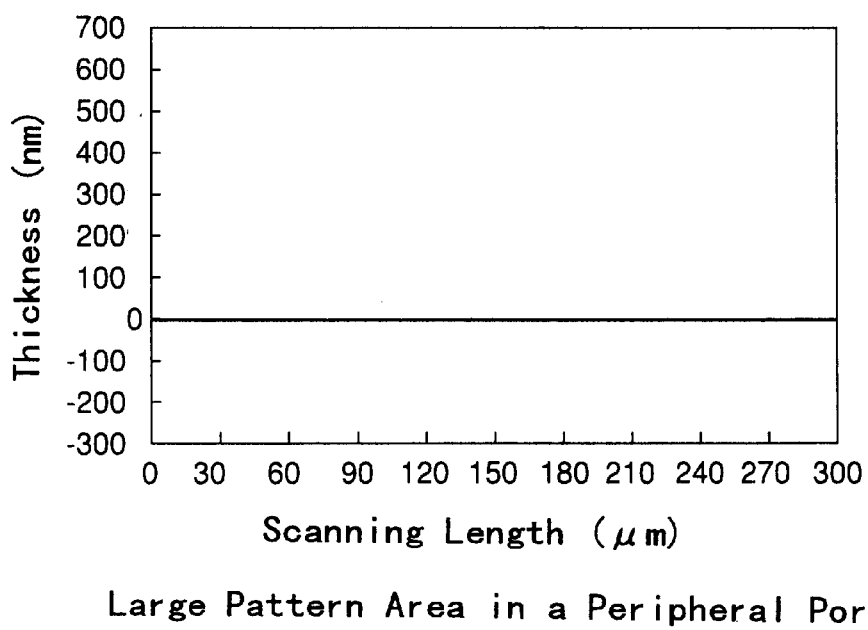
Figure 12C:
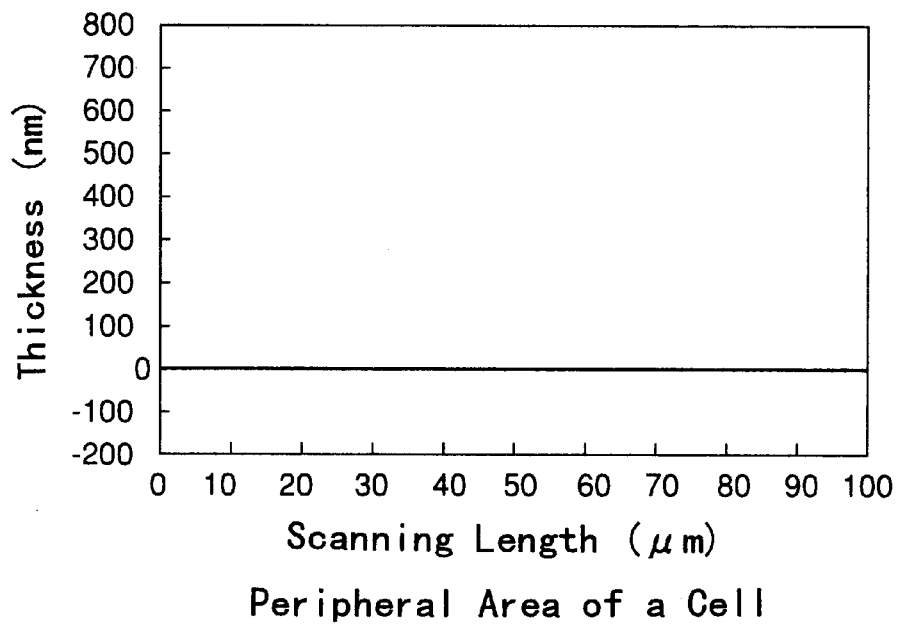
Figure 12D:
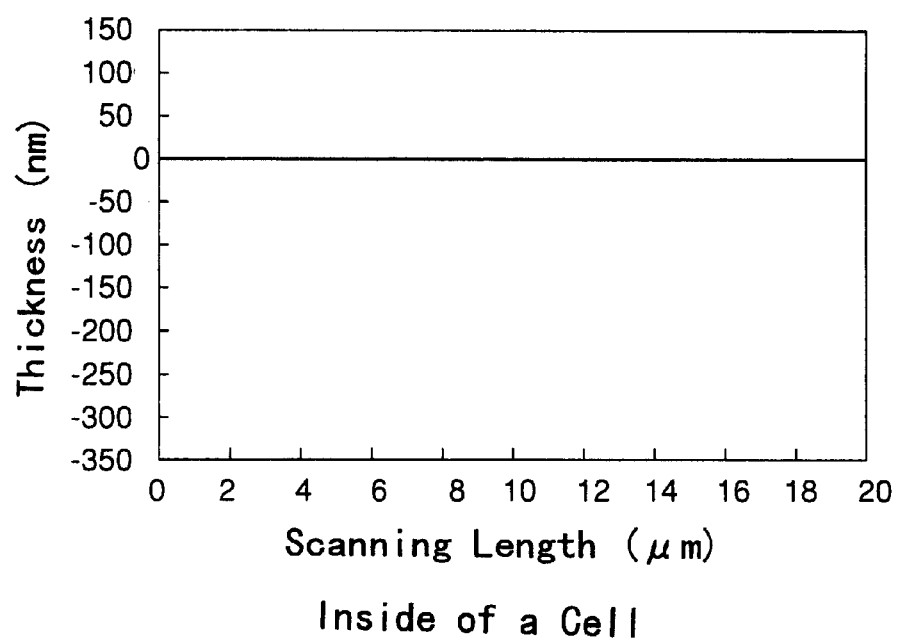

After the first step polishing has been performed under the above conditions, unevenness of the surface of the silicon oxide film 27 in the initial condition shown in FIGS. 9A to 9D is changed into those shown in FIGS. 17A and 17B and FIGS. 12A to 12D. In the scribe portion with the large area, as shown in FIG. 12A, the film thickness of the silicon oxide film 27 can be considerably reduced rather than the cases in the first example and the second example. In other regions, as shown in FIGS. 12B to 12D, the silicon oxide film 27 can be substantially planarized.

Figure 13A:
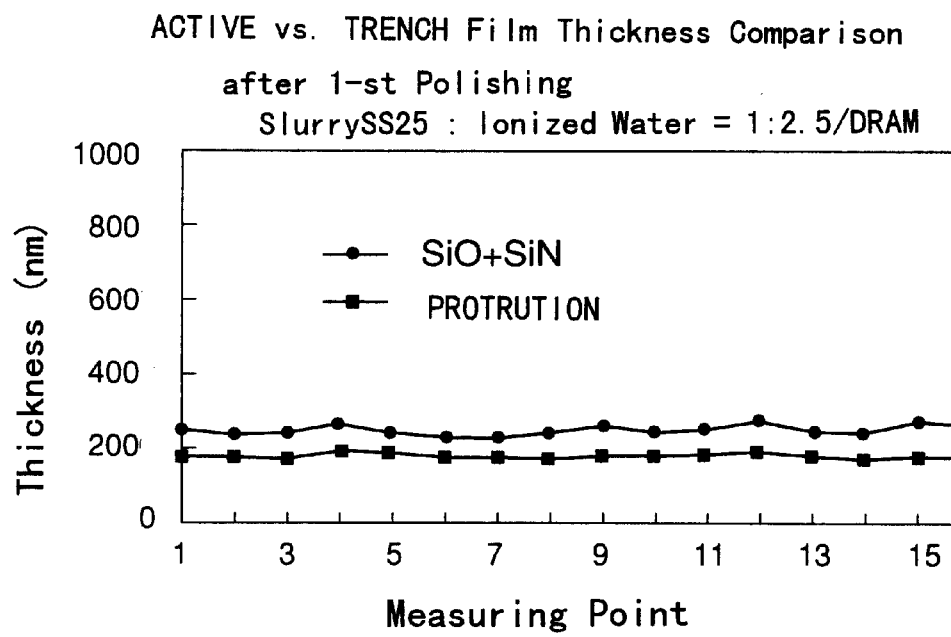
FIG. 13A is a graph showing a film thickness distribution of the silicon oxide film after polishing if slurry in which KOH is contained is employed in the first step polishing in the first embodiment of the present invention.
Figure 13B:
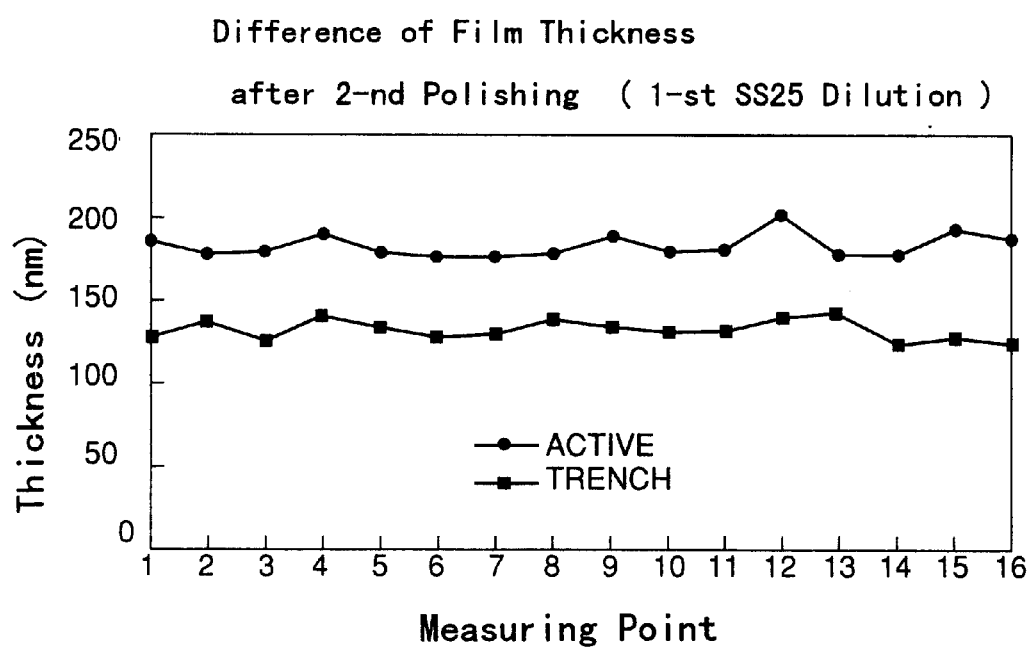
FIG. 13B is a graph showing a film thickness distribution of the silicon oxide film after the second step polishing has been applied to the silicon oxide film which has been subjected to the first step polishing.
Figure 14A:
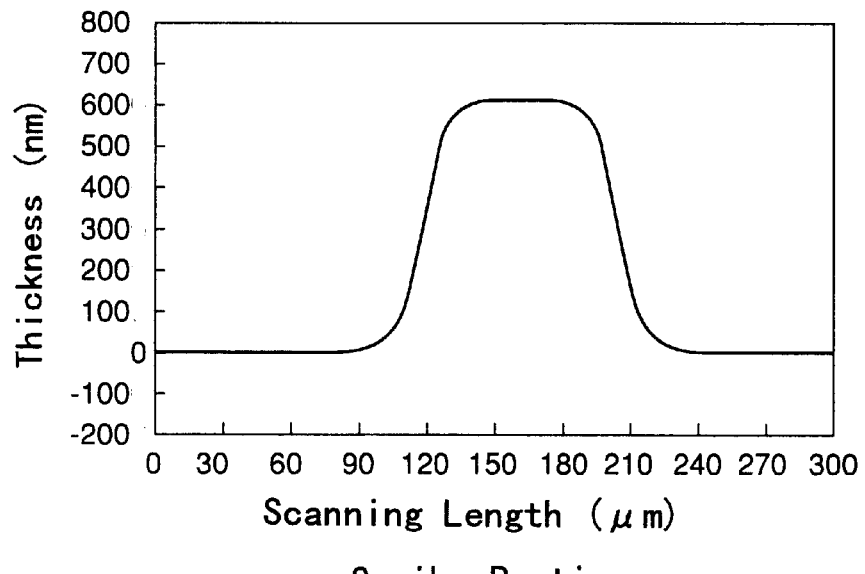
FIGS. 14A to 14D are views showing level difference of the silicon oxide film after the first step polishing if slurry in which first dispersant is contained is employed in the first step polishing in the first embodiment of the present invention.
Figure 14B:
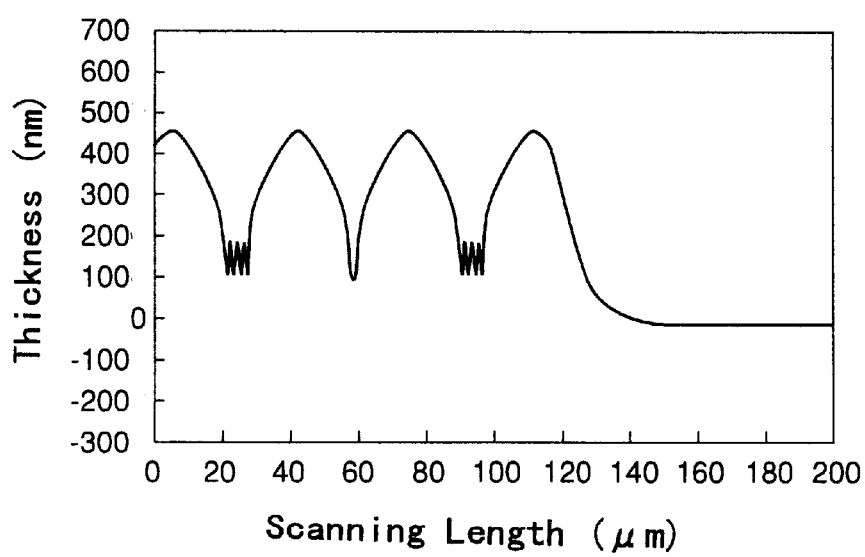
Figure 14C:
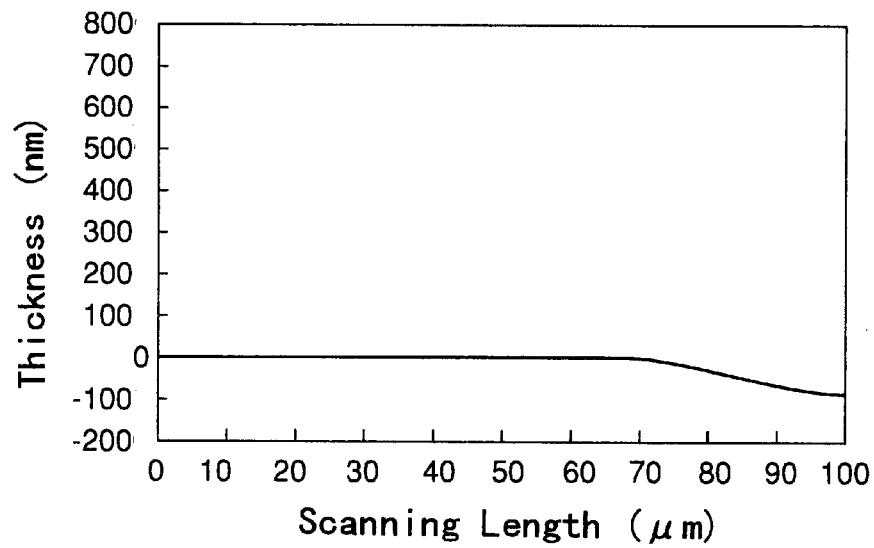
Figure 14D:
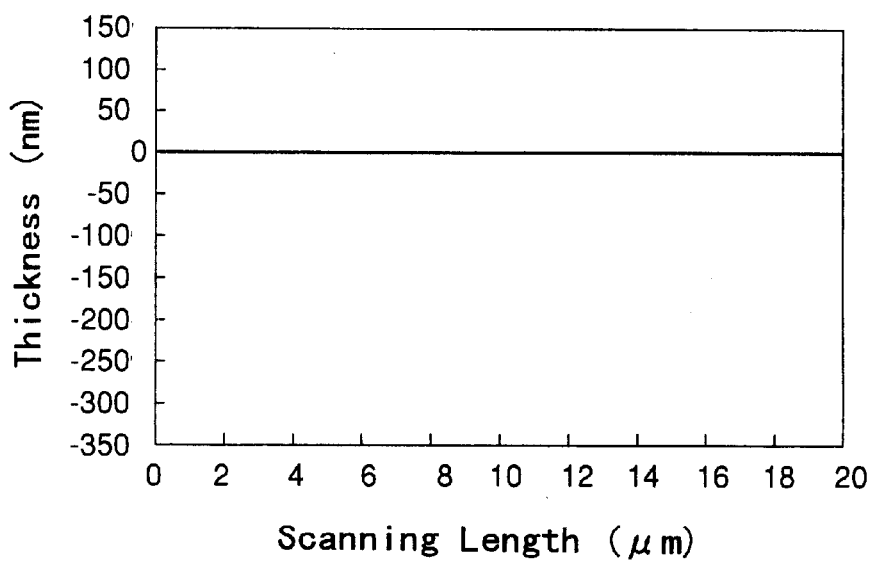
Figure 15A:
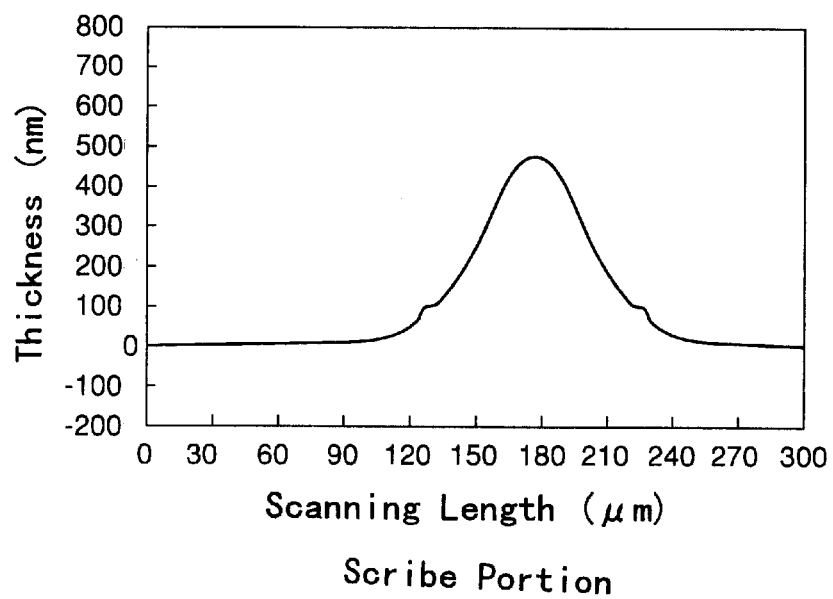
FIGS. 15A to 15D are views showing level difference of the silicon oxide film after the first step polishing if slurry in which second dispersant is contained is employed in the first step polishing in the first embodiment of the present invention.
Figure 15B:
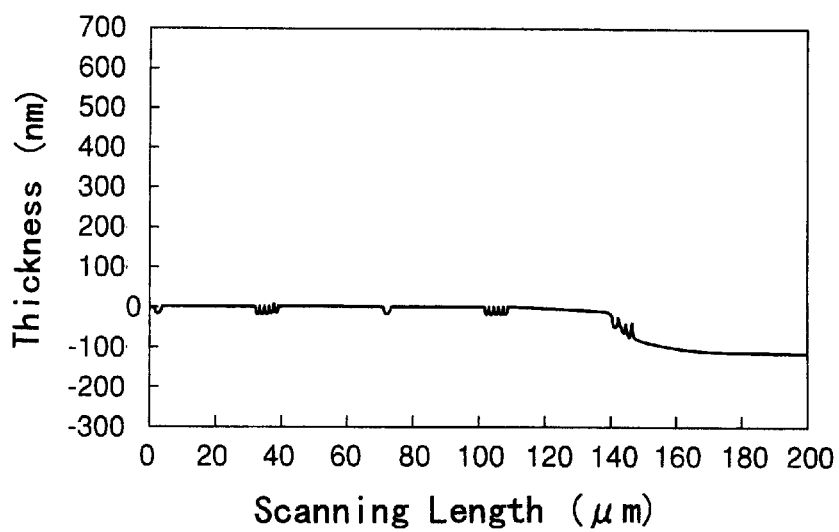
Figure 15C:
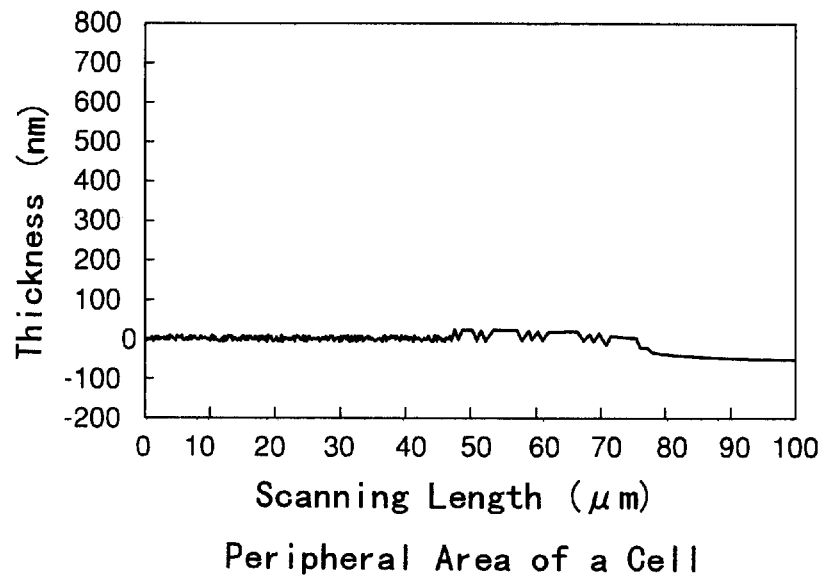
Figure 15D:
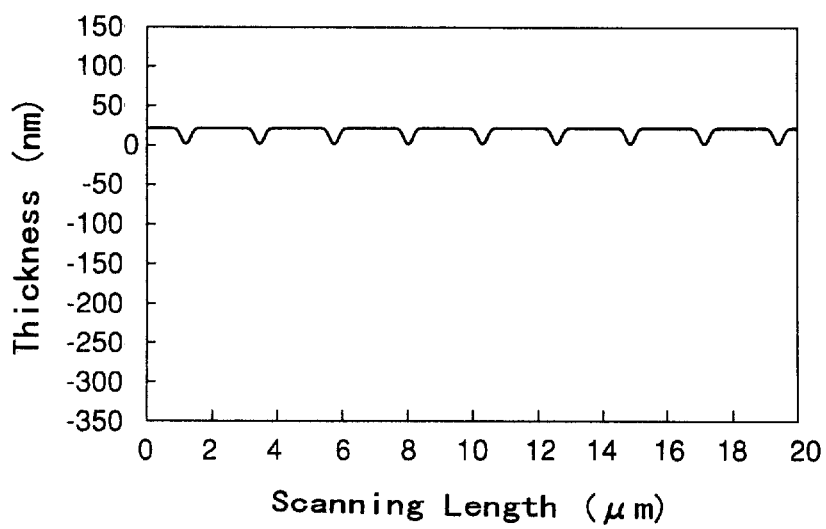

When film thickness distribution of the silicon oxide film 27 which has been polished under the first step polishing conditions is examined, results are shown in FIG. 13A. Difference between the film thickness t10 and the film thickness t11 is several tens rnm. As a result, it can be seen that the surface can be extremely planarized.

Accordingly, in the second step polishing to further planarize the silicon oxide film 27, a polishing time can be reduced since its polishing amount is made extremely small, and thus throughput can be improved further more. When the film thickness distribution of the silicon oxide film 27 is examined after the second step polishing has been finished, results shown in FIG. 12B are derived. Difference between the film thickness t10 and the film thickness t11 can be reduced much more. As a result, it can be seen that planarization of the upper surface of the silicon oxide film 27 can be further improved.

As the reason for the event that planarization of the silicon oxide film 27 can be extremely improved by the first step polishing, followings can be supposed.

First, it can be guessed that the polishing by the slurry which is diluted with the ionized water into the 1/2.5 times concentration is largely affected by the chemical elements other than mechanical elements.

The silicon oxide film ($SiO_2$) exhibits equilibrium reaction given by following chemical formula (10) in the water.

$$SiO_2 + H_2O \rightleftharpoons Si(OH)_4 \quad (10)$$

If KOH is added into the water, the reaction is ready to shift to the right side of the chemical formula (10) by catalytic action of K ion. This is because intermediate such as $KSi(OH)_3$, etc. is produced during when $SiO_2$ is changed into $Si(OH)_4$ to thus cause the reaction to the right side of the chemical formula (10) smoother. The commonly employed slurry can polish the silicon oxide film by utilizing such reaction.

If not only KOH but also the amine dispersant (e.g., tetramethylammonium hydroxide (TMAH)) is added into the water, a degree of dissociation of KOH to ions by the amine dispersant can be reduced. This is because $OH^-$ ions or OH minus ions are generated by the amine dispersant based on the law of $[H^+][OH^-] = 10^{-14} = 1E-14$ PH and consequently such degree of dissociation of KOH can be reduced.

The ions formed by the amine dispersant exhibit, of course, the catalytic action in the chemical formula (10) based on the type of such ion, nevertheless they do not often exhibit the strong catalytic action unlike the $K^+$ ion or K plus ions since a size of the molecule impedes a surface reaction of the silicon oxide film when the molecule per se is increased in size. $N(CH_3)_4$ plus ions which are generated TMAH listed as an example do not exhibit the strong catalytic action unlike the $K^+$ ion or K plus ions.

Therefore, in case KOH and the amine dispersant are added simultaneously into the water, it is difficult for the reaction to shift to the right side of the chemical formula (1). This is similarly true of the slurry. The polishing rate of the silicon oxide film can be reduced since the KOH slurry and the amine slurry disturb the reaction to the right side in the chemical formula (1) respectively when they are mixed with each other.

In this case, unlike the silica, cesium oxide enables the polishing while having the reducing reaction on the silicon oxide film.

With the above the polishing rate and the polishing condition can be easily controlled by adjusting the chemical elements in polishing. For example, if a mixture of SS-25 (product name) and PLANERLITE-6103 (product name) is employed as the slurry, the polishing condition is changed depending upon difference of a mixing ratio of SS-25 and PLANERLITE-6103, as shown in FIGS. 14A to 14D, and FIGS. 15A to 15D.

FIGS. 14A to 14D, and FIGS. 15A to 15D show the polished state of the silicon oxide film 27 formed in the scribe portion, the large pattern portion in the peripheral portion, the peripheral area of the cell, and the inside of the cell of DRAM respectively after the first step polishing has been finished.

In FIGS. 14A to 14D the slurry in which PLANERLITE-6103 (product name) is added to SS-25 (product name) by twice amount of SS-25 is employed. In FIGS. 15A to 15D, the slurry in which PLANERLITE-6103 (product name) is added to SS-25 (product name) by the same amount is employed. Other polishing conditions are equal to those in Table 6.

According to such experimental results, if a rate of SS-25 is increased, an amount of polishing can be increased and also planarization of the polished surface can be improved. As a result, the polishing condition can be controlled by adjusting the mixing ratio of SS-25 and PLANERLITE-6103.

Next, it will be explained hereunder how the polishing rate is affected by a degree of dilution of SS-25 by the ionized water.

Figure 16:
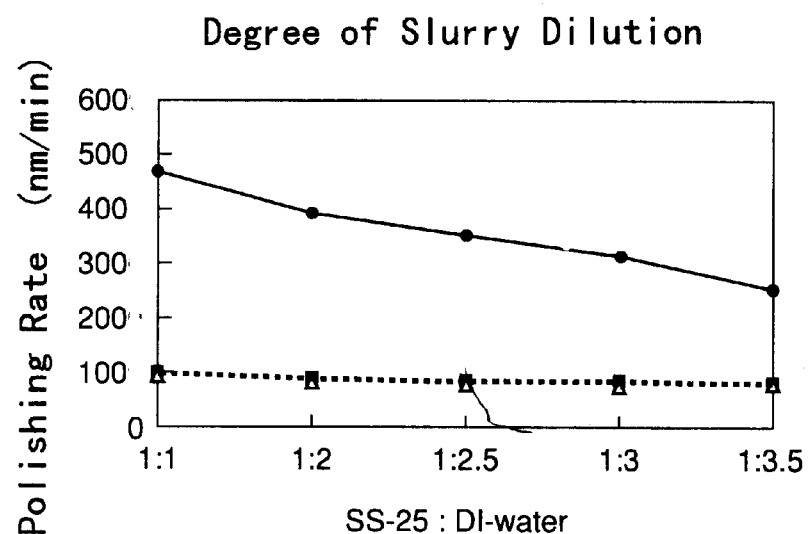
FIG. 16 is a graph showing a relationship between a mixing ratio of a dispersant to the ionized water employed in the first step polishing in the first embodiment of the present invention and a polishing rate.
Figure 17:
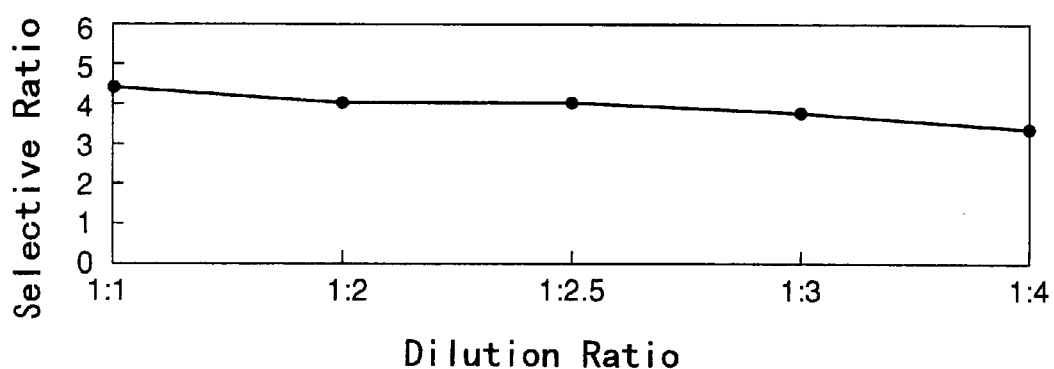
FIG. 17 is a graph showing a relationship between the mixing ratio of the dispersat to the ionized water employed in the first step polishing in the first embodiment of the present invention and an $SiO_2/SiN_3N_4$ polishing selective ratio.

FIG. 16 shows a relationship between the mixing ratio of SS-25 and the ionized water employed in the first step polishing and the polishing rate. From this relationship, it can be seen that the polishing rate of the silicon oxide film ($SiO_2$) is reduced smaller as the degree of dilution by the ionized water is increased. A broken line in FIG. 16 indicates a relationship between the degree of dilution of SS-25 by the ionized water and the polishing rate of the silicon nitride film ($Si_3N_4$). It can been seen that, because the degree of dilution seldom affects the polishing rate of the silicon nitride film, such change of the degree of dilution does not impair the polishing stopping function of the silicon nitride film. In this case, as shown in FIG. 17, a polishing selective ratio of the silicon oxide film to the silicon nitride film can be detected from the result in FIG. 16.

In the above embodiment, as the method of planarizing the buried insulating film formed in the trench and on the device region of the semiconductor substrate by polishing, it has been explained to use the two-step polishing method which exchanges the abrasive cloths having different hardness. However, when it is checked whether or not dishing of the buried insulating film formed in the trench is generated after such polishing step, it has been experimentally confirmed that occurring situation of the dishing is different based on the difference in width of the trench.

Figure 18A:
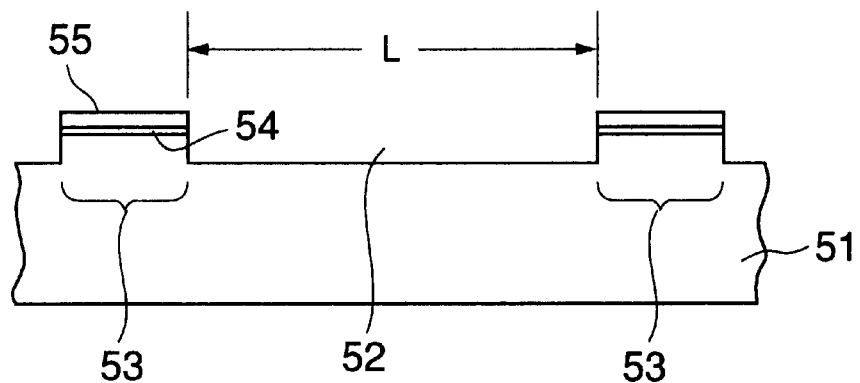
FIG. 18A is a sectional view showing a sample to examine a dishing amount of a buried insulating film which is subjected to two-step polishing in the first embodiment of the present invention.
Figure 18B:
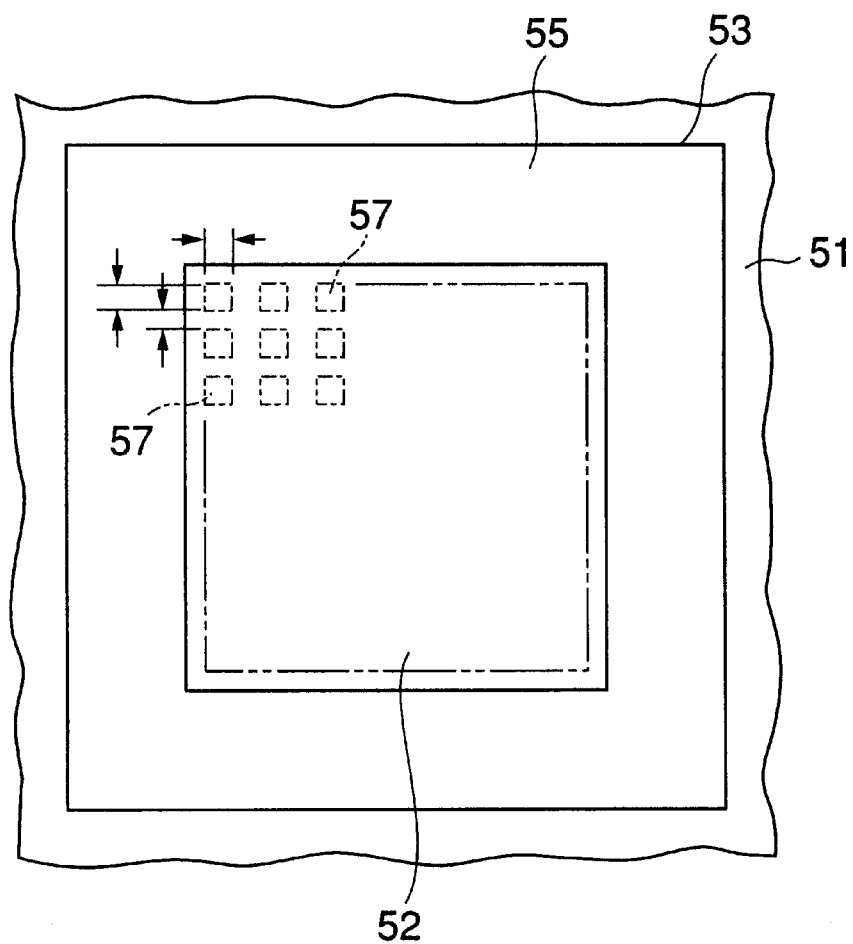
FIG. 18B: is a plan view showing the sample shown in FIG. 18A.

The experiment has been executed by using TEG (Test Element Group) pattern having patterns shown in FIGS. 18A and 18B as a sample. A plurality of TEG patterns are formed on an 8-inch silicon substrate 51.

This TEG pattern has also patterns of real device level. In this TEG pattern, the maximum single active region has an area of 800 $\mu$m×600 $\mu$m.

In FIGS. 18A and 18B, a square trench 52 whose side length is L is formed on the silicon substrate 51 to have a depth of 380 nm. The trench 52 is surrounded by a convex active region 53 which has a width of 100~150 $\mu$m. Level difference between a bottom surface of the trench 52 and an uppermost surface of the surrounding silicon substrate 51.

An initial oxide film 54 made of $SiO_2$ is formed on the surface of the silicon substrate 51 in the active region 53 to have a thickness of 10 nm. Then, a silicon nitride film 55 of 99 nm thickness is formed on the active region 53 via the initial oxide film 54. The silicon nitride film 55 functions as the polishing stopping film.

Here the active region 53 is a region which substantially corresponds to the device forming region or the scribe region, for example.

Next, steps for filling the buried insulating film into the trench 52 of the TEG patterns.

Figure 19A:
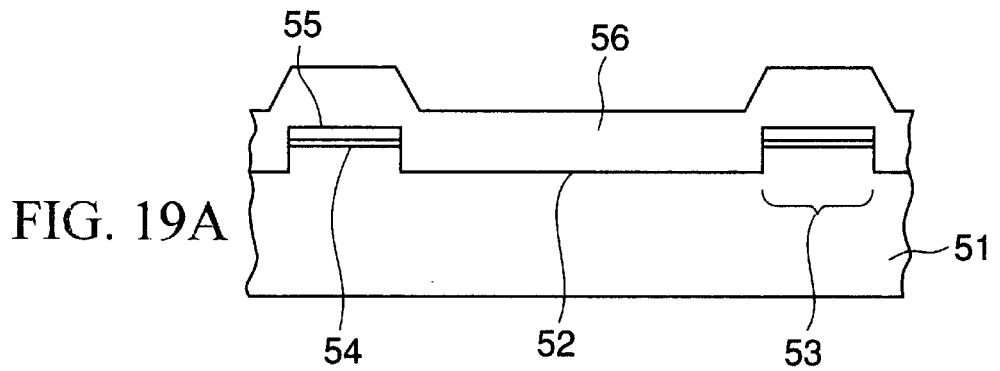
FIGS. 19A to 19C are sectional views showing steps for filling the insulating fij into the trench of the sample shown in FIG. 18A.

First, as shown in FIG. 19A, the silicon oxide film 56 is formed on the silicon substrate 51 as the buried insulating film by using the high density plasma (HDP) CVD method. The silicon oxide film 56 is projected highest on the active region 53.

A film thickness of the silicon oxide film 56 is set thicker than the depth of the trench 52, e.g., 700 nm.

Then, the silicon oxide film 56 is polished by two-step polishing by using MIRRA 3400 (product name) manufactured by Applied Material Co., Ltd. as the polishing equipment. The polishing head of the polishing equipment has an schematic configuration shown in FIGS. 3A and 3C.

The substrate holder (polishing head) 32 of the polishing equipment MIRRA 3400 comprises an upper body 104a made of a rigid material as ion, an elastic body 104b such as an air bag which is interposed between the semiconductor wafer 33 and the upper body 104a, and a retainer ring 105 fitted onto a periphery of the upper body 104a and the elastic body 104b. There is a membrane made of aluminum in the air bag. As a Young's modulus of the elastic body. a value is selected in the range of $1 \times 10^{10}$ $N/m^2$ to $1 \times 10^4$ $N/m^2$, preferably the range of $1 \times 10^5$ $N/m^2$ to $1 \times 10^7$ $N/m^2$. This elastic body is provided to distribute uniformly the stress applied to the polished surface of the semiconductor wafer.

Figure 3C:
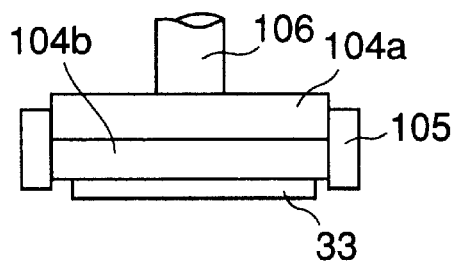
FIG. 3C is another substrate holder in the polishing equipment.

In other words, the first step polishing is carried out by using the hard IC-1000 as the abrasive cloth 102 shown in FIG. 3C. A plurality of concentric trenches being called "K-grooves" are formed on an upper surface of the abrasive cloth 102. A slurry in which SS-25 (product name) containing KOH is diluted with the ionized water is employed as the slurry supplied onto the abrasive cloth 102. The ionized water is supplied 2.5 times of SS-25 in terms of volume. The abrasive cloth 102, the slurry, and other polishing conditions are given in Table 8.

TABLE 8

| Polishing Equipment | Applied Material Co., Ltd. MIRRA-3400 |
|---|---|
| 1-st CMP | |
| Abrasive cloth (pad) | IC-1000-050-K groove |
| Slurry | SS-25:ionized water = 1:2.5 |
| Membrane pressure | 5 psi |
| Inner tube pressure | 5 psi |
| Retainer ring pressure | 10 psi |
| Rotation speed R3 of polishing plate | 103 rpm |
| Rotation speed R4 of substrate holder | 97 rpm (R3 and R4 are in the same direction) |
| Polishing rate | 320 nm/min |

Figure 19B:
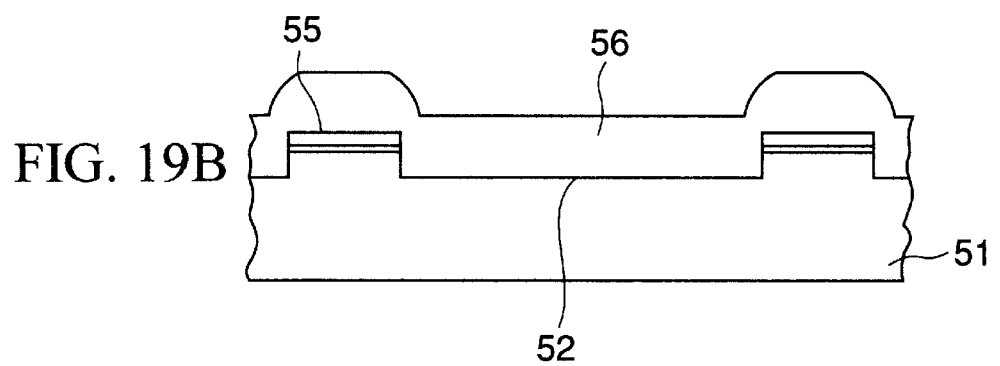

This first step polishing step is ended at the point of time when the film thickness of the silicon oxide film 56 in the center of the trench 52 is reduced to 530 to 550 nm. When the first step polishing step is ended, as shown in FIG. 19B, the projected portion of the silicon oxide film 56 in the active region 53 becomes thin and is rounded.

The second step polishing step is started following to the first stop polishing step.

In the second step polishing step, the abrasive cloth 102 is exchanged from the hard IC-1000 to the soft IC-1400 to polish the silicon oxide film 56, The K-grooves are formed on the upper surface of the IC-1400. The same slurry as that in the first step polishing is used in the second step polishing. The abrasive cloth 102, the slurry, and other polishing conditions are given in Table 9.

TABLE 9

| Polishing Equipment | Applied Material Co., Ltd. MIRRA-3400 |
|---|---|
| 2-nd CMP | |
| Abrasive cloth (pad) | IC-1400-050-K groove |
| Slurry | SS-25:ionized water = 1:2.5 |
| Membrane pressure | 3 psi |
| Inner tube pressure | 3.5 psi |
| Retainer ring pressure | 4.3 psi |
| Rotation speed R3 of polishing plate | 103 rpm |
| Rotation speed R4 of substrate holder | 100 rpm (R3 and R4 are in the same direction) |
| Polishing rate | 230 nm/min |

Figure 19C:
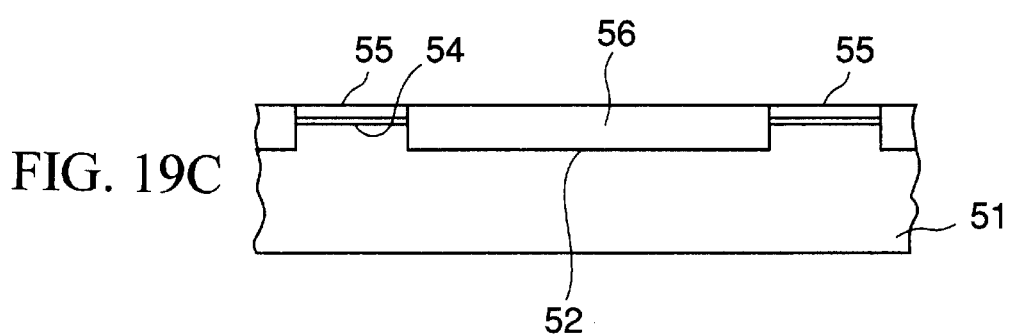

The second step polishing is ended when, as shown in FIG. 19C, the silicon nitride film 55 is exposed from the overall surface of the silicon substrate 51.

A polishing amount of the silicon oxide film 56 by the above first step polishing step is 300 nm to 380 nm, and a polishing amount of the silicon oxide film 56 by the second step polishing step is 100 nm to 200 nm. According to the first and second step polishing steps, the thickness of about 500 nm is polished in terms of a polishing amount of the silicon oxide film on the planarized surface.

Figure 20:
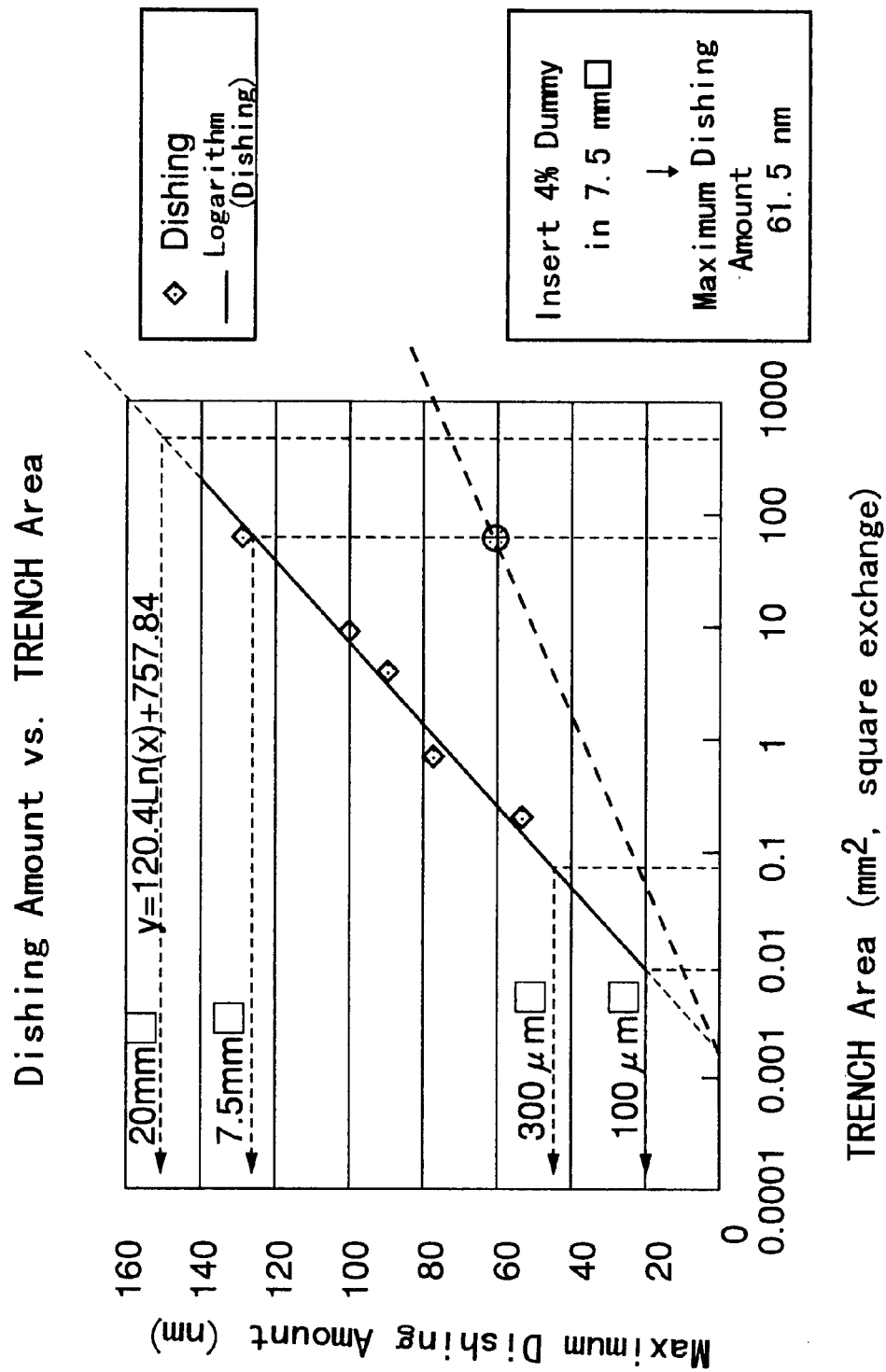
FIG. 20 is a graph showing a relationship between a dishing amount generated the insulating film buried in the trench formed by the steps in FIGS. 19A to 19C and an area of the trench.

When a relationship between a maximum dishing amount of the silicon oxide film 56 in the center area of the trench 52 and area (bottom area) of the trench 52 is measured after polishing of the silicon oxide film 56 has been finished, the result indicated by a solid line in FIG. 20 has been derived. In this case, in FIG. 20, an abscissa is shown by a logarithmic scale and an ordinate is shown by a proportional scale.

It can be seen from the solid line in FIG. 20 that, as the length L of one side of the trench 52 becomes longer, i.e., the bottom area of the trench 52 is increased, the maximum dishing amount is increased.

By the way, according to the one-step polishing in the prior art, a maximum dishing amount of the silicon oxide film in the trench of 1 mm×1 mm size is 300 nm. In contrast, according to the two-step polishing method of the present invention, a maximum dishing amount of the silicon oxide film in the trench of 1 mm×1 mm size is about 80 nm, which is reduced ¼ the maximum dishing amount in the prior art. The conditions for the one-step polishing in the prior art are indicated in Table 10.

TABLE 10

| Polishing Equipment | Applied Material Co., Ltd. MIRRA-3400 |
|---|---|
| Prior art CMP | |
| Abrasive cloth (pad) | IC-1400-050-K groove |
| Slurry | SS-25:ionized water = 1.1 |
| Membrane pressure | 4 psi |
| Inner tube pressure | 4 psi |
| Retainer ring pressure | 6 psi |
| Rotation speed R3 of polishing plate | 83 rpm |
| Rotation speed R4 of substrate holder | 77 rpm (R3 and R4 are in the same direction) |
| Polishing rate | 330 nm/min |

In this manner, the two-step polishing method of the present invention intends to reduce selectively the projected portion of the silicon oxide film 56 in the active region 53 by the polishing using the abrasive cloth 102 which is harder than that in the first step polishing step. Therefore, the first step polishing step Is difficult to be affected by mohorogie such as the unevenness which essentially exists on the surface of the silicon substrate 51, and thus the polishing of the silicon oxide film 56 can be finished uniformly over the entire surface of the silicon substrate 51.

For the unevenness existing on the surface of the semiconductor substrate, in order to polish the overall surface of the substrate uniformly, it is most preferable that level difference of the unevenness in any 20 mm square area is below 200 nm and that level difference of the unevenness in any 5 mm square area is below 50 nm.

If such unevenness is present, the uniform polishing rate can be achieved over all the substrate surface by interposing the above elastic body between the semiconductor substrate and the supporting substrate.

In addition, as indicated by a broken line in FIG. 18B, a number of minute active regions (dummy convex portions) 57 are formed in the trench 52. Then, when the inventors have measured a relationship between a maximum dishing amount of the silicon oxide film 56 in the trench 52 and the bottom area of the trench 52 after two-step polishing has been finished, the result indicated by a broken line in FIG. 20 can be derived.

It can be seen from the broken line in FIG. 20 that, if the dummy convex portions 57 are formed in the trench 52, a maximum dishing amount can be reduced half or less rather than the case where no dummy convex portion is formed in the trench 52. For example, when a plurality of dummy convex portions 57 each has a 7.5 μm×7.5 μm planar size are arranged at a pitch of 50 μm in the 7.5 mm×7.5 mm trench 52, a maximum dishing amount of the silicon oxide film 56 in the trench 52 has been 61.5 nm. In other words, if the dummy convex portions 57 are formed in the trench 52, such maximum dishing amount of the silicon oxide film 56 is reduced to about ½ of the case where no dummy convex portion is formed in the trench 52.

Accordingly, in two-step polishing method, it can be found that the effect for suppressing the dishing can be enhanced by forming a plurality of dummy convex portions in the wide trench.

In this case, the minute active regions (dummy convex regions) 57 are a part of the silicon substrate 51 and have the same height as an uppermost surface of the silicon substrate 51 in the active region 53.

As the method of detecting the end point of two-step polishing method, there are the method in which change of polishing torque generated by difference of the polishing rate when the polishing object is changed from the silicon oxide film to the silicon nitride film is utilized, the method in which change of a reflection intensity of the laser beam caused, depending upon difference of a reflection optical path, when the polishing object is changed from the silicon oxide film to the silicon nitride film while irradiating the laser beam having a single wavelength of 100 nm to 1000 nm onto the polished surface is utilized, etc.

Figure 21:
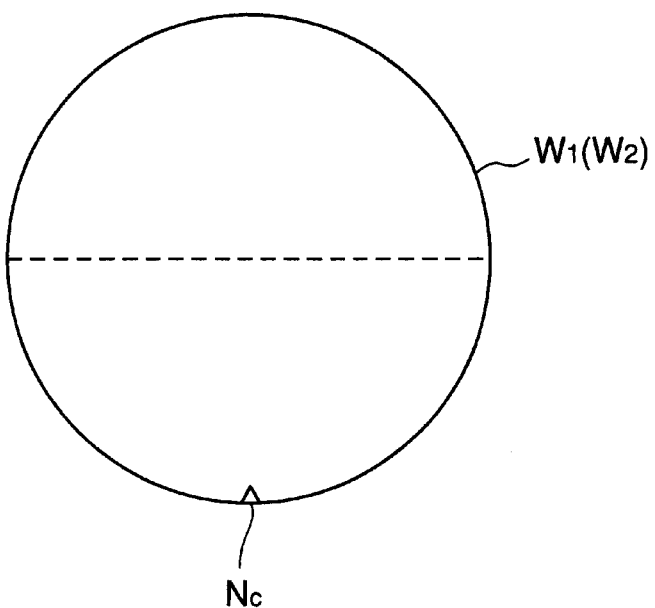
FIG. 21 is a plan view showing a semiconductor wafer employed In the first embodiment of the present invention.

Next, it has been examined how difference of mohorogie of the surface of the semiconductor substrate affects of the surface of the silicon oxide film after the first step polishing (also referred to as "selective polishing" hereinafter) step has been finished. As shown in FIG. 21, an 8 inch circular silicon wafer $W_1$, $W_2$, on the principal surface of which a silicon film of 11 μm thickness is epitaxially grown, is employed as the semiconductor substrate. In FIG. 21, a reference No denotes a notch indicating a face orientation.

Figure 22:
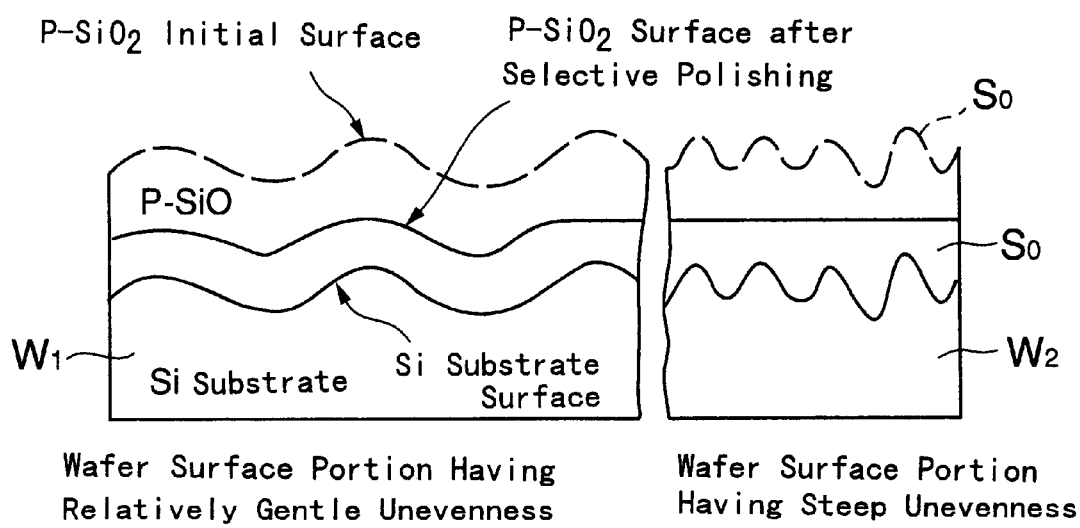
FIG. 22 is a sectional view showing an initial state of a surface of a silicon oxide film formed on the semiconductor wafer shown in FIG. 21 and a selective polishing state of the surface of the same silicon oxide film.

In the experiment, the wafer whose surface unevenness is gently changed is employed as the first silicon wafer $W_1$, as shown on the left side of FIG. 22, and the wafer whose surface unevenness is changed bit by bit is employed, as the second silicon wafer $W_2$, as shown on the right side of FIG. 22.

Then, the silicon oxide film of 1000 nm thickness is formed on respective main planes of the first silicon wafer $W_1$ and the second silicon wafer $W_2$ by the plasma CVD method, and then the silicon oxide $S_0$ film is polished for 60 seconds under the conditions listed in Table 8. An amount of polishing is 350 nm on average. As the polishing equipment, MITRRA-3400 available from Applied Material Co. Ltd., which has the substrate holder 32 shown. in FIG. 3C is employed.

Figure 23:
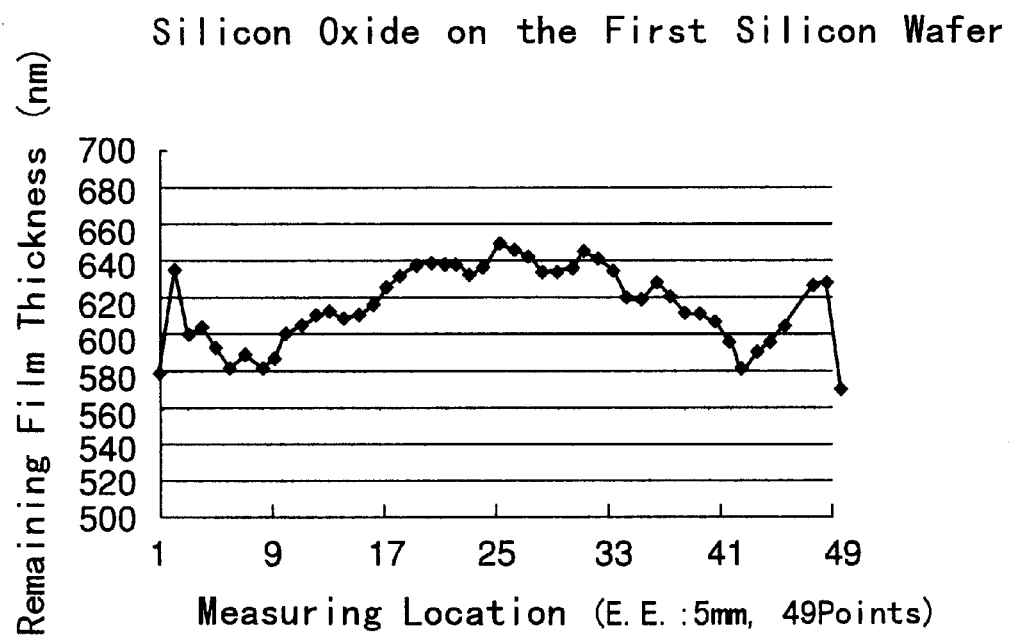
FIG. 23 is a view showing a film thickness distribution of the silicon oxide film, in which unevenness of the surface of the semiconductor wafer is gently changed, after the selective polishing.
Figure 24:
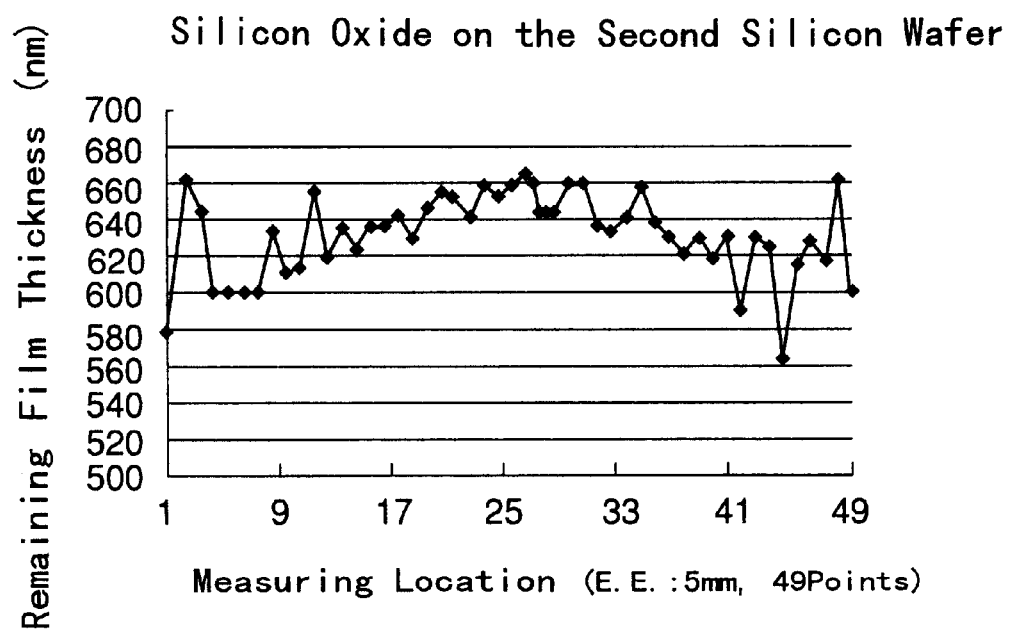
FIG. 24 is a view showing a film thickness distribution of the silicon oxide film, in which unevenness of the surface of the semiconductor wafer is changed bit by bit, after the selective polishing.

Then, when the film thickness of respective silicon oxide films $S_0$ on the first silicon wafer $W_1$ and the second silicon wafer $W_2$ is measured, film thickness distributions in FIGS. 23 and 24 have been obtained. The film thickness of respective silicon oxide film $S_0$ is measured at 49 locations along a broken line in FIG. 21 by the optical film thickness measuring method.

According to FIG. 23, the silicon oxide film $S_0$ on the first silicon wafer $W_1$ is polished such that the film thickness distribution having gentle change of the unevenness can be given along the surface of the silicon wafer $W_1$. Hence, in the semiconductor devices which are formed in plural, on the silicon wafer $W_1$, the film thickness of the silicon oxide film $S_0$ left in the trench after polishing can be made uniform.

However, according to FIG. 24, the silicon oxide film $S_0$ on the second silicon wafer $W_2$ has been polished. Such that the film thickness distribution having steep change of the unevenness can be given along the surface or the silicon wafer $W_2$. Hence, in the semiconductor devices which Are formed, in plural on the silicon wafer $W_2$, the nonuniform film thickness of the silicon oxide film $S_0$ left in the trench after polishing is resulted.

As a result, in the case that the silicon oxide film on the semiconductor wafer is polished by the selective polishing, it is preferable that the mohorogie of the surface of the semiconductor wafer coincide with the above condition.

Second Embodiment

It has already been described that, in order to polish the buried insulating film on the active region of the semiconductor wafer in which FRAM cells, SRAM cells, or the like are formed and the scribe line region for splitting the wafer, there is such a possibility that the dishing of the buried oxide film occurs in the trench.

Figure 25:
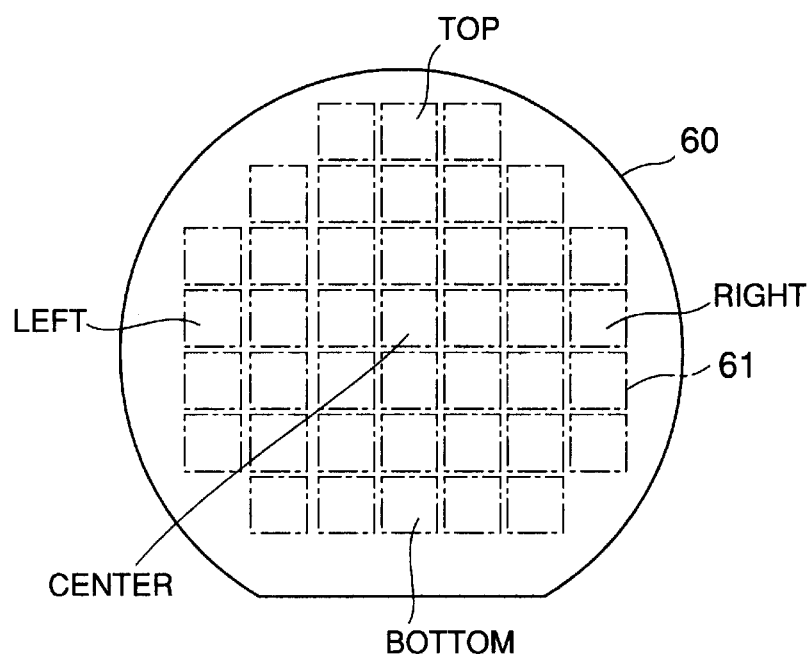
FIG. 25 is a plan view showing a semiconductor wafer on which TEG patterns are formed.
Figure 26:
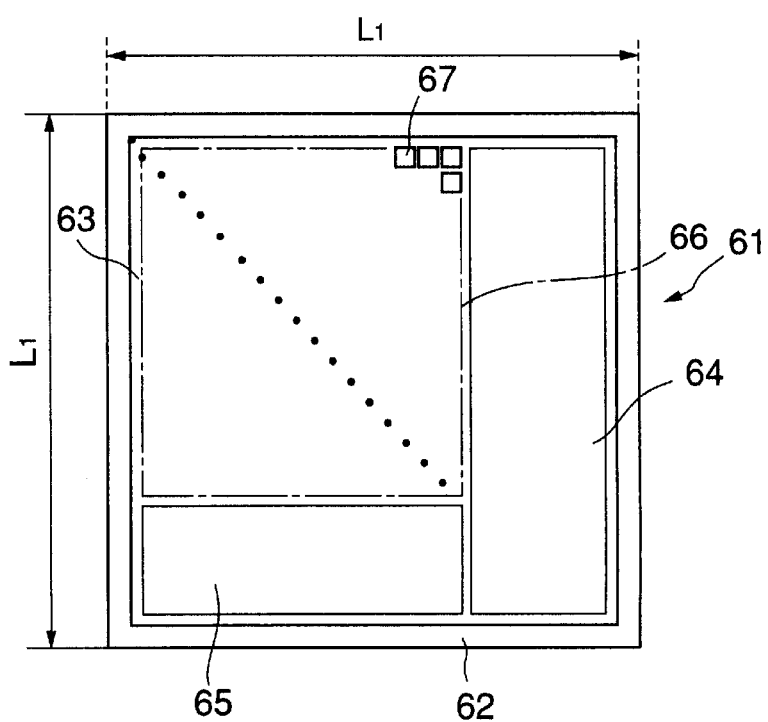

Therefore, TEG patterns 61 shown in FIG. 26 are formed at plural locations of the semiconductor wafer shown in FIG. 25, and then occurring situation of the dishing of the buried oxide film on the trench is checked.

This TEG pattern 61 has a plural of active pattern in which the maximum single active pattern has an area of 800 μm ×600 μm.

As shown in FIG. 26, in the TEG pattern 61, a square trench 63 having depth of 380 nm is formed in a region, which is surrounded by a scribe line 62 having a width of 100 μm, of the silicon wafer 60. A length L1 of one side of the trench 63 is 20 mm from a center of the scribe line 62. A first active pattern congested region 64 having a rectangular shape of about 5 mm×20 mm and a second active pattern congested region 65 having a rectangular shape of about 5 mm×15 mm are formed at a distance like an L-shape in the trench 63. A plurality of dummy convex portions (minute active regions) 67 are formed in a remaining region having a size of about 15 mm×15 mm in the trench 63. The dummy convex portions 67 have a height identical to the scribe line 62.

The dummy convex portions 67 each having a 7 μm×7 μm planar shape are arranged at a pitch of 25 mm. or the dummy convex portions 67 each having a 10 μm×10 μm planar shape are arranged at a pitch of 25 mm. The 7 μm×7 μm dummy convex portions 67 occupy 8% of the remaining region 66 in the trench 63 in terms of area. The 10 μm×10 μm dummy convex portions 67 occupy 16% of the remaining region 66 in the trench 63 in terms of area.

After the silicon nitride film is formed on the active regions 64, 65 and the scribe region 62 of the TEG patterns 61 via the initial oxide film and then the silicon oxide film is formed on the overall TEG patterns, the silicon oxide film is polished by two-step polishing method until the silicon nitride film is exposed from the entire surface of the semiconductor wafer 60, The bottom surface of the trench 63 has a depth of 380 nm from upper surfaces of the active regions 64, 65, the scribe line region 62, and the dummy convex portions 67 of the silicon wafer 60.

Figure 27:
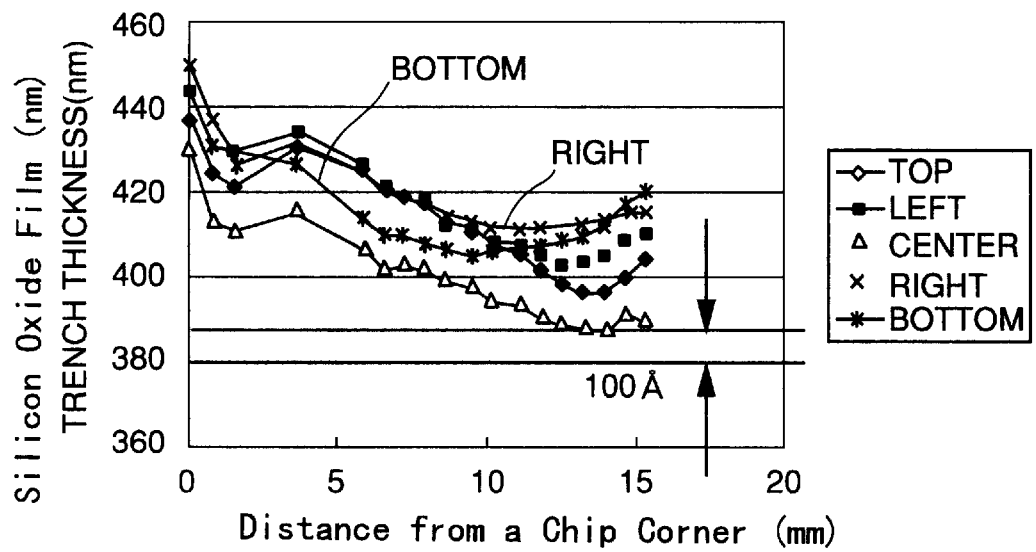
FIG. 27 is a graph showing a first film thickness distribution of the silicon oxide film polished on the trench by two-step polishing method in the first embodiment of the present invention.

When the silicon oxide film is polished by two-step polishing method, the dishing shown in FIG. 27 occurs on the trench 63 in the TEG pattern 61 which has the 8% dummy convex portions 67, and an amount of the silicon oxide film which is projected upwardly from a top of the side surface of the trench 63 is 10 nm at a minimum. The dishing shown in FIG. 28 occurs on the trench 63 in the TEG pattern 61 which has the 16% dummy convex portions 67, and an amount of the silicon oxide film which is projected upwardly from the top of the side surface of the trench 63 is 30 nm at a minimum.

Figure 28:
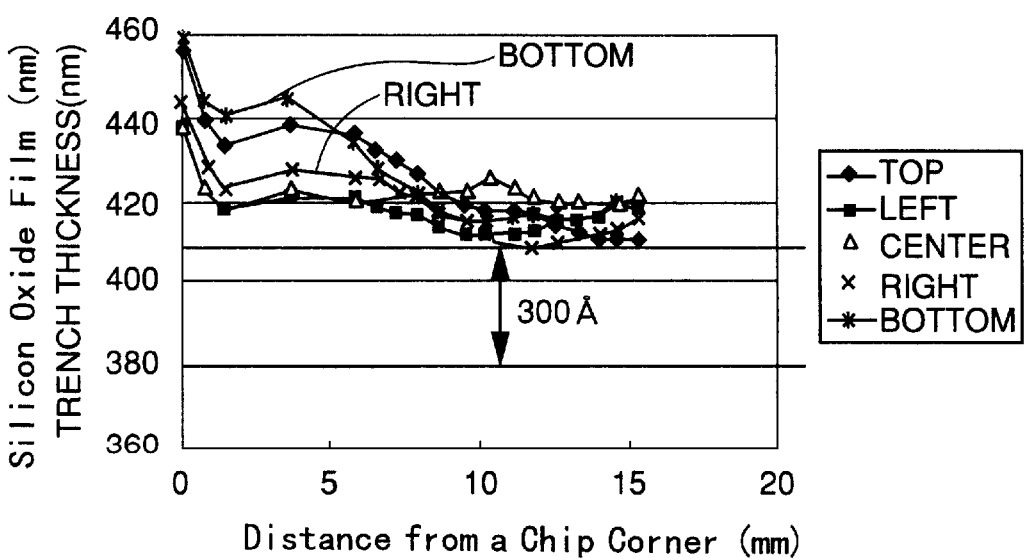
FIG. 28 is a graph showing a second film thickness distribution of the silicon oxide film polished on the trench by two-step polishing method in the first embodiment of the present invention.

In FIGS. 27 and 28, TOP, LEFT, CENTER, RIGHT, and BOTTOM denote a dishing amount in the TEC pattern 61 formed in TOP, LEFT, CENTER, RIGHT, and BOTTOM regions in FIG. 25 respectively.

Meanwhile, it is examined which amount of the dishing of the silicon oxide film on the trench 63 is preferable when a gate electrode of the MOS transistor is formed in the first and second active regions 64, 65 respectively.

First, in the situation that polishing of the silicon oxide film by two-step polishing method is finished, it is a possibility that polishing residue of the silicon oxide film is left on the silicon nitride film. Therefore, in order to remove such polishing residue, the hydrogen fluoride must be supplied onto the silicon nitride film until the film thickness of the silicon oxide film filled in the trench 63 is reduced to about 10 nm. Subsequently, the silicon nitride film is removed by phosphoric acid of 170° C., and then the initial oxide film is removed by supplying the hydrogen fluoride onto the first and second active regions 64, 65, the scribe line region 62, and the dummy convex portions 67. Then, a sacrificial oxide film of 10 nm thickness is formed by thermally oxidizing respective surfaces of the first and second active regions 64, 65, the scribe line region 62. and the dummy convex portions 67 of the silicon wafer 60, whereby the silicon wafer 60 constituting the surfaces of them is consumed by 5 nm. As a result, this is equivalent to that the depth of the trench 63 becomes substantially small by 5 nm. Then, when the sacrificial oxide film is removed by the hydrogen fluoride, the hydrogen fluoride is supplied until the thickness of the silicon oxide film in the trench is reduced by 16.8 nm. After this, a gate oxide film of 10 nm thickness is formed by thermally oxidizing respective surfaces of the first and second active regions 64, 65, the scribe line region 62, and the dummy convex portions 67 as exposed surfaces of the silicon wafer 60. At this time, since the surface of the silicon substrate is consumed by 5 nm, the depth of the trench 63 is further reduced by 5 nm.

The silicon oxide film existing on the trench 63 is reduced by 28.8 nm in thickness in total immediately after the gate oxide film is formed via above hydrogen fluoride process and thermal oxidizing process. Hence, if the silicon oxide film in the trench 63 can be reduced in excess of about 30 nm, the event that the dishing surfaces lower than the surfaces of the first and second active regions are generated on the silicon oxide film in the trench 63 can be prevented.

Accordingly, as shown in FIG. 28, it can be understood that an area occupying rate of the dummy convex portions 67 must be set to more than 16%. Since the polishing process is interfered if the area occupying rate of the dummy convex portions 67 is set too high, preferably the area occupying rate should be set to less than 40%.

The dishing amount can be controlled by adjusting the area occupying rate of the dummy convex portions 67. However, the dishing amount of the silicon oxide film in the trench 63 is different at corner portions of the trench 63 and portions remote from the corner portions. In order to make distribution of the dishing amount uniform and reduce the dishing amount, the inventors of the present invention have adopted steps of forming a polishing covering film made of the silicon nitride film of several tens nm thickness on the silicon oxide film which fills the trench 63.

The steps of polishing the silicon oxide film by two-step polishing method with the use of the polishing covering film will be explained with reference to FIGS. 29A to 29E hereinafter.

Figure 29A:
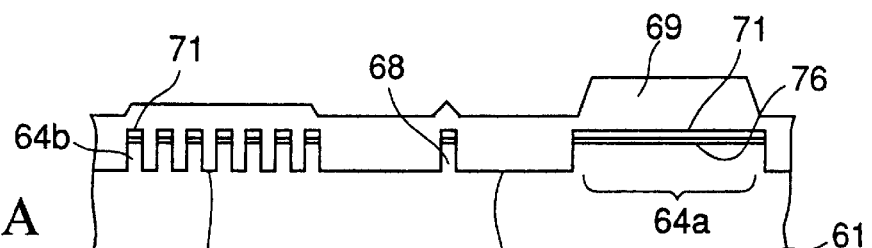
FIGS. 29A to 29E are sectional views showing polishing steps according to a fourth embodiment of the present invention.

First, as shown in FIG. 29A, a first wide trench 63a d which is located adjacent to a first wide active region 64a of the silicon wafer 61 is formed and also a plurality of narrow second minute active regions 64b are formed densely through in a second trench 63b. Also, a third isolated active region 68 is formed in the first trench 63a.

The depth of the first and second trench 63 is 380 nm from an uppermost surface of the silicon wafer 61. Also, a polishing stopping film 71 made of a silicon nitride film of 99 nm thickness is formed on respective surfaces of the first and second active regions 64a, 64b, the third active region 68, etc. of the silicon wafer 61 via an initial oxide film 70 formed of $SiO_2$. of 10 nm thickness. Therefore, level difference between an upper surface of the polishing stopping film 71 and a bottom surface of the trench 63 is 489 nm.

After this, a silicon oxide film 69 of 700 nm thickness is formed over the entire surface of the silicon wafer 61 in which the trenches 63a, 63b, the active region 64a, 64b, etc. are formed.

Figure 29B:
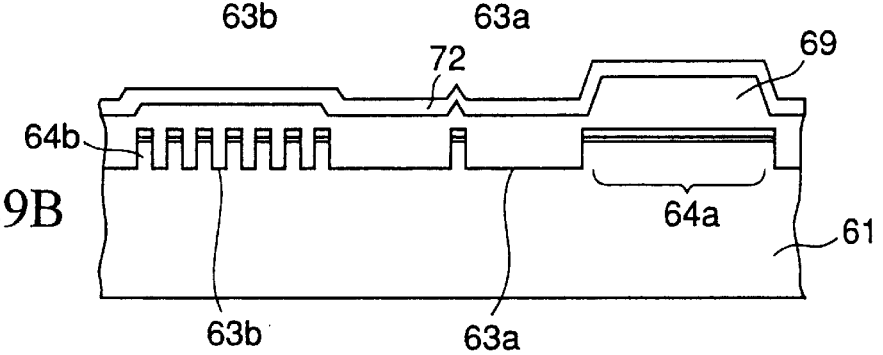

In turn, as shown in FIG. 29B, a silicon nitride film (polishing covering film) 72 of 50 nm thickness is formed on the silicon oxide film 69 by the plasma CVD method.

Figure 29C:
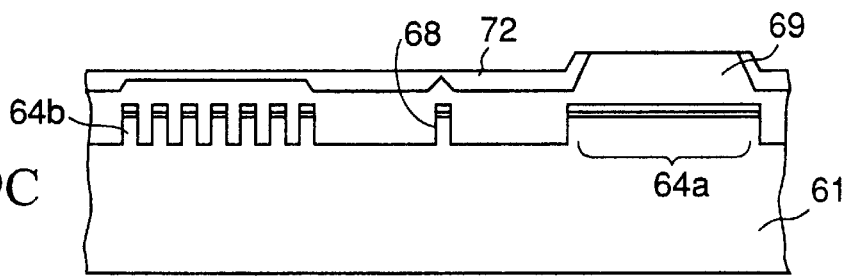
Figure 29D:
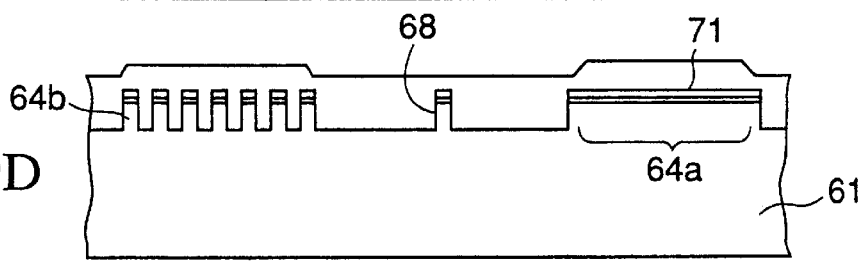
Figure 29E:
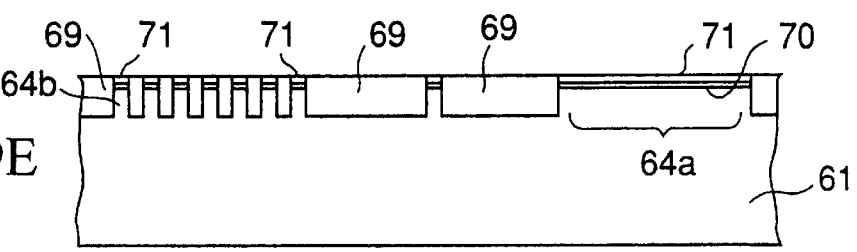

Then, the polishing covering film 72 and the silicon oxide film 69 are polished by the first step polishing step under the same conditions as those listed in Table 8. At the initial stage of the first step polishing step, as shown in FIG. 29C, the polishing covering film 72 formed on the first active region 64a where the silicon oxide film 69 is highest projected is polished to then expose the silicon oxide film 69 therefrom. Then, if the first step polishing is ended at is the point of time when the thickness of the silicon oxide film 69 on the first trench 63a is reduced to the thickness of 530 nm to 550 nm, as shown in FIG. 29D, the convex silicon oxide film 69 on the first active region 64a is thinned and also corners of the convex portions are rounded. In this case, the convex silicon oxide film 69 on the trench 63a, 63b and the second active region 64b has the small polishing rate because of the polishing covering film 72.

When the first step of polishing is finish, the convex silicon oxide film 69 is exposed in all areas of the silicon wafer 61.

If the thickness of the polishing covering film 72 can be adjusted appropriately to mate with the thickness of the silicon oxide film 69, sizes of the active regions 64a, 64b, etc., margin of the planarization process by the polishing can be expanded wider by setting the polishing rate of the convex silicon oxide film 69 on the first and second active regions 64a, 64b to be slower than the polishing rate of the silicon oxide film 69 on the trench 63a, 63b and the narrow active region 64b.

Then, the silicon oxide film 69 is polished by the second step polishing step under the same conditions as those listed in Table 9.

As shown in FIG. 29B, the second step polishing is terminated at the point of time when the polishing stopping film 71 is exposed from the overall silicon wafer 61.

Figure 30:
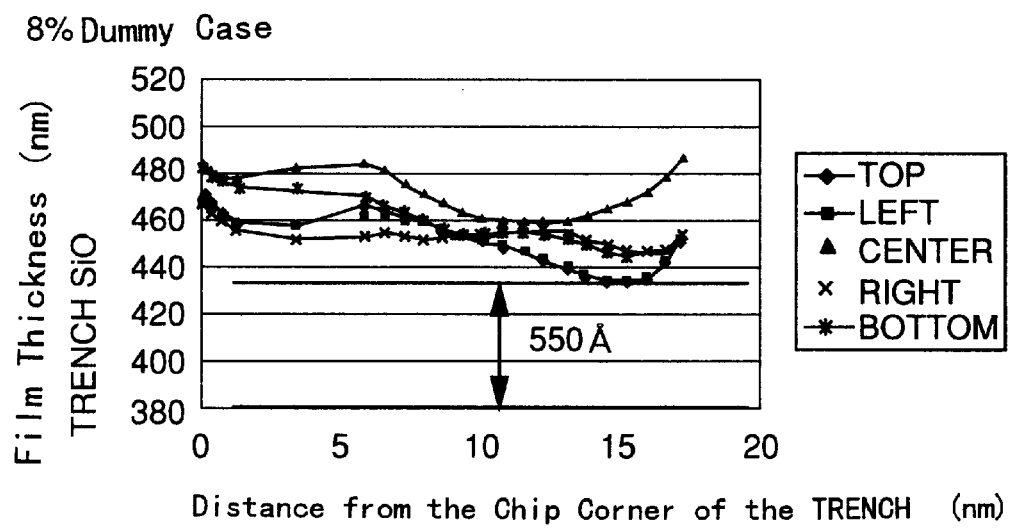
FIG. 30 is a graph showing a first film thickness distribution of the silicon oxide film polished on the trench by the fourth embodiment of the present invention.
Figure 31:
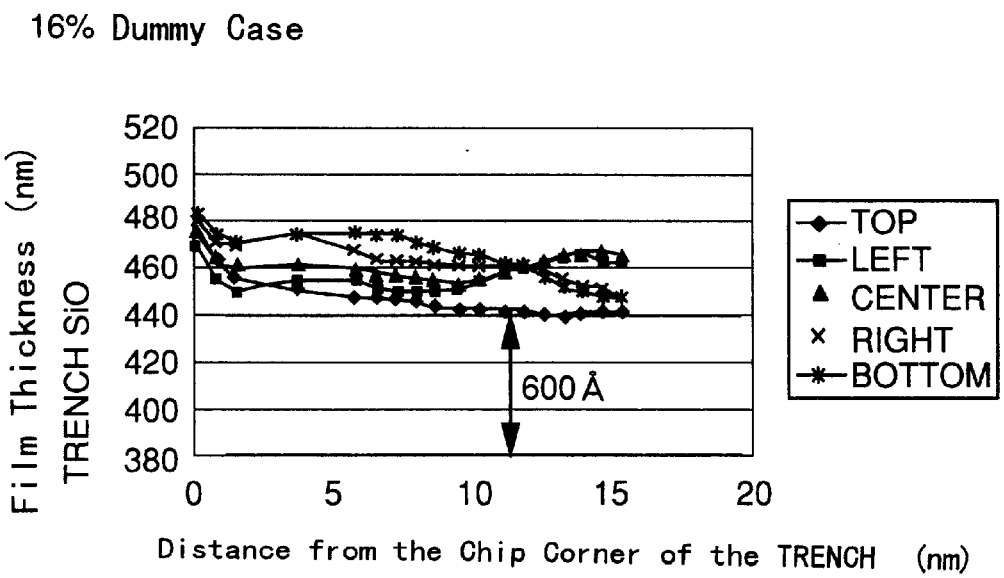
FIG. 31 is a graph showing a second film thickness distribution of the silicon oxide film polished on the trench by the fourth embodiment of the present invention.

When distribution of the dishing amount of the silicon oxide film 69 in the trench of the TEG pattern 61 is examined while using the polishing covering film 72 formed of the silicon nitride film, results shown in FIGS. 30 and 31 have been derived. The dishing amounts shown in FIGS. 30 and 31 have been measured at locations indicated by "+" in FIG. 26.

FIG. 30 shows polishing distribution if the area occupying rate of the dummy convex portions 67 is set to 8%. In FIG. 30, in the region where the maximum dishing amount is generated, the silicon oxide film 69 on the trench 63 is projected upward by an amount of about 55 nm from the uppermost surface of the silicon wafer, and also film thickness distribution of the silicon oxide film 69 on the trench 63 is uniformized.

FIG. 31 shows polishing distribution if the area occupying rate of the dummy convex portions 67 is set to 16%. In FIG. 31, in the region where the maximum dishing amount is generated, the silicon oxide film 69 on the trench 63 is projected upward by an amount of about 60 nm from the uppermost surface of the silicon wafer, and also film thickness distribution of the silicon oxide film 69 on the trench 63 is uniformized.

As a result, if the thickness of the silicon oxide film 69 on the trench 63 is reduced to about 30 nm, for example, before the gate oxide film is formed in the first active region 64 after two-step polishing has been finished, the silicon oxide film 69 on the trench 63 is never lowered rather than the uppermost surface of the silicon wafer 61

Third Embodiment

In the above first embodiment, the flatness of the silicon oxide film buried in the trench can be enhanced by forming the trenches on the silicon substrate, then forming the silicon nitride film in the active regions, then forming the buried silicon oxide film on the silicon substrate, and then polishing the silicon oxide film by using two-step polishing method. Furthermore, in the fourth embodiment, the flatness of the silicon oxide film can be Improved much more by adding the steps of forming the silicon nitride film 72 on the silicon oxide film 69 prior to two-step polishing.

In the fifth embodiment, the step of removing the silicon oxide film being projected from the active regions of the silicon wafer by etching is further added prior to two-step polishing.

For instance, the same steps as those in the fourth embodiment can be applied until the silicon oxide film 69 is formed on the wafer by the plasma CVD method, as shown in FIG. 29B.

Figure 32A:
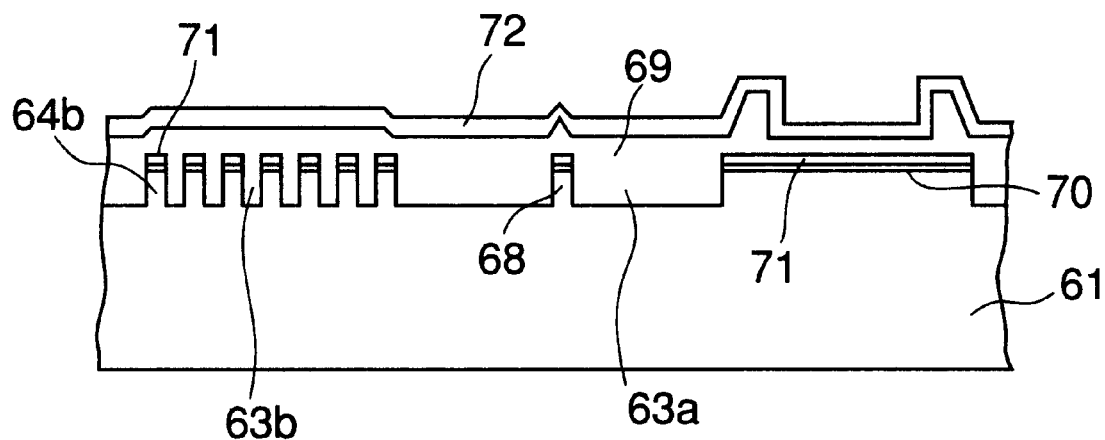
FIGS. 32A to 32C are sectional views showing polishing steps according to a fifth embodiment of the present invention.

Then, as shown in FIG. 32A, a part of projected portion, which has the highest projection amount, of the silicon oxide film 69 on the first active region 64*a* is removed by the photolithography method to thin the film thickness. Then, the silicon nitride film (polishing covering film) 72 of 50 nm thickness is formed on the silicon oxide film 69.

Figure 32B:
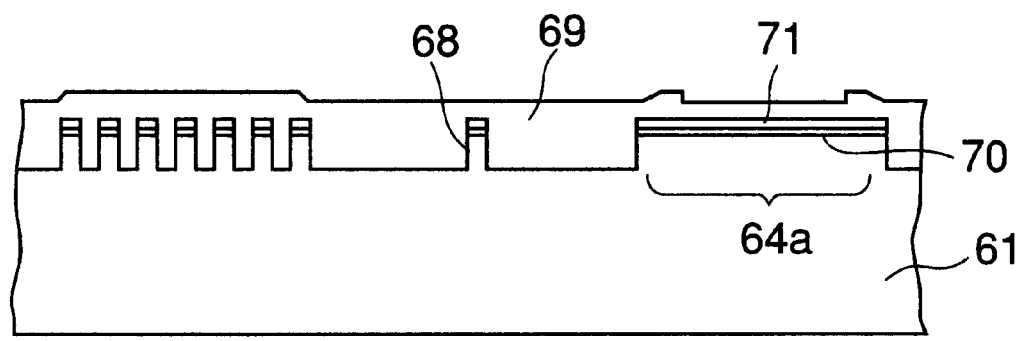

Then, the polishing covering film 72 and the silicon oxide film 69 are polished by using the first step polishing under the same conditions as those listed in Table 8, and then the first step polishing is ended at the point of time when the film thickness of the silicon oxide film 69 on the first trench 63*a* is reduced to the thickness of 5300 Å to 5300 Å. At that time, as shown in FIG. 32B, the projected portion of the silicon oxide film 69 on the first active region 64*a* is made thin, and also the corners of the convex portion are rounded. In this case, the polishing rate of the silicon oxide film 69 on the first active region 64*a* is quick rather than the first step polishing in the fourth embodiment, and also the polishing rate of the silicon oxide film existing on the trenches 63*a* and 63*b* and the third active region 68 is reduced because of the presence of the polishing covering film 72.

In this case, if the thickness of the polishing covering film 72 can be adjusted appropriately to mate with the thickness of the silicon oxide film 69, sizes of the active regions 64*a*, 64*b*, 65, etc., margin of the planarization process by the polishing can be expanded wider by setting the polishing rate of the convex silicon oxide film 69 on the first and second active regions 64, 65 to be slower than the polishing rate of the silicon oxide film 69 on the trenches 63*a*, 63*b* and the narrow active region 68.

Figure 32C:
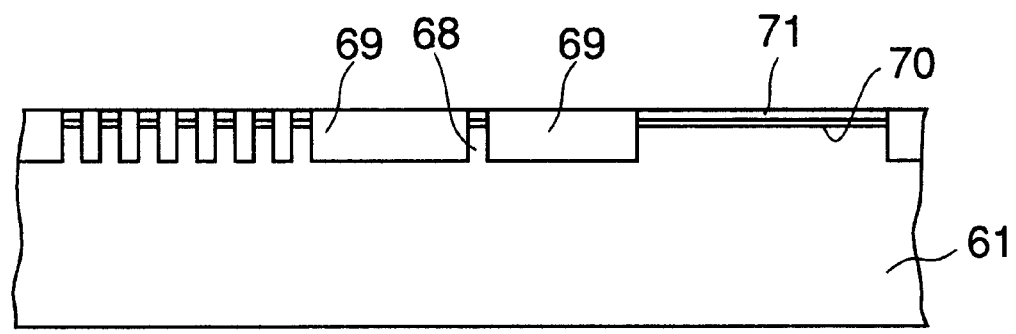

Then, the silicon oxide film 69 is polished by the second step polishing step under the same conditions as those listed In Table 9. As shown in FIG. 32C, the second step polishing is terminated at the point of time when the polishing stopping film 71 is exposed from the overall silicon wafer.

Figure 33:
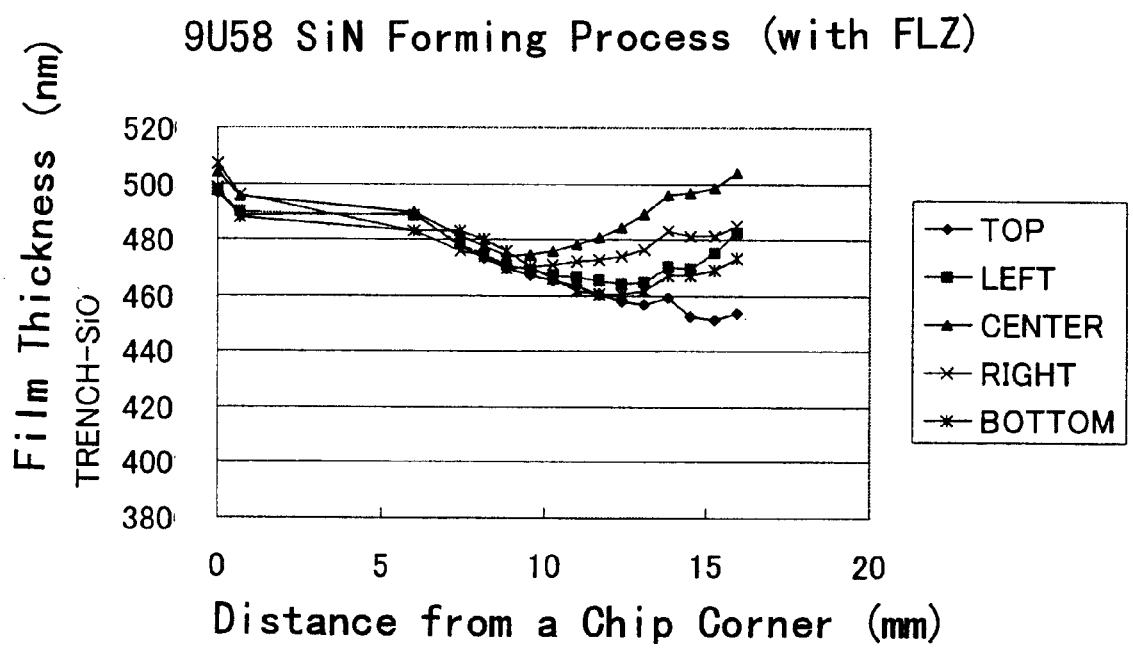
FIG. 33 is a graph showing a film thickness distribution of the silicon oxide film polished on the trench by the fifth embodiment of the present invention.

When distribution of the dishing amount of the silicon oxide film 69 buried in the trenches 63*a*, 63*b* in the TEG pattern as shown in FIG. 26 is examined while using such polishing covering film 72, results shown in FIG. 33 have been derived.

FIG. 33 shows a polished amount distribution of the silicon oxide film if the area occupying rate of the dummy convex portions is set to 0%. In the region where the maximum dishing amount is generated in the trench 63, the silicon oxide film on the trench 63 is projected upward by an amount of about 70 nm from the uppermost surface of the silicon wafer.

Accordingly, it can be understood that, if no dummy convex portion 67 is formed in the trench 63, preferably two-step polishing should be executed after a part of the silicon oxide film and the polishing covering film 72, which are located on the wide active region 64, is removed previously by etching.

As a result, if the thickness of the silicon oxide film on the trench 63 is reduced by various steps before the gate oxide film is formed after the polishing stopping film 71 on the active region 64 has been removed, the silicon oxide film in the trench 63 can be prevented from being lowered rather than the uppermost surface of the silicon wafer 61.

As described above, according to the present invention, when the insulating oxide film is filled into the trenches of the substrate, the first step polishing step in which the very hard abrasive cloth is employed as the abrasive cloth and the slurry for reducing the polishing rate of the polishing object is employed as the slurry is carried out. Therefore, mainly the insulating oxide film which is projected from the fine and mechanically weak device regions can be polished mechanically to reduce a volume, and thus the planarization process in the second step polishing can be facilitated.

According to the polishing in the second step polishing step, the surface follow-up performance of the abrasive cloth to the polished surface is decreased by reducing the pushing force of the polished substrate against the abrasive cloth and rotating the abrasive cloth at a high speed, whereby flatness of the polished substrate can be achieved.

Also, according to the present invention, the insulating oxide film can be polished by using the slurry, which contains the abrasive grains made of silica material or cerium oxide in the dispersant having OH radicals, and the abrasive cloth which has a hardness whose ratio of the compressive strain to the compressive load is less than 0.06 $\mu m \cdot cm^2 /g$. Therefore, the polishing of the convex portion of the insulating oxide film can be accelerated to thus improve the flatness of the insulating oxide film.

Fourth Embodiment

The polishing explained in the first embodiment can also be applied to steps other than the shallow trench isolation forming step. In this second embodiment, polishing of an interlayer insulating film which is used to form the multi-layered wiring structure will be explained hereunder.

Figure 34A:
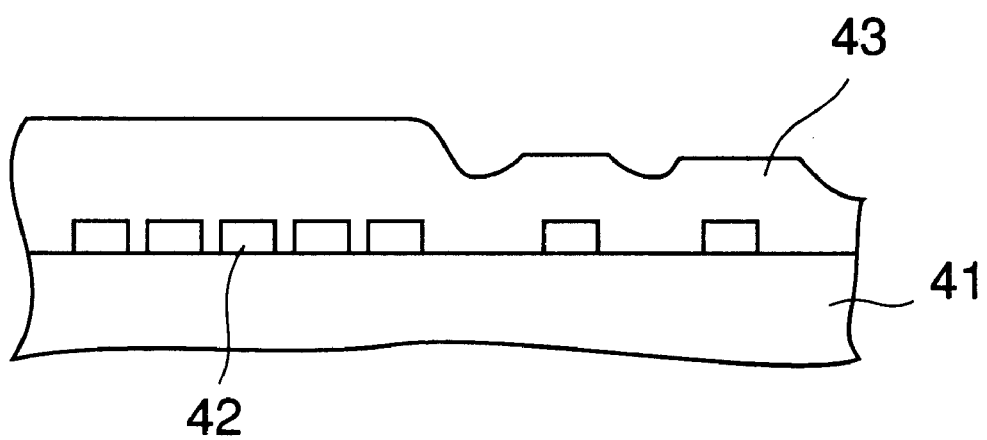
FIGS. 34A and 34B are sectional views showing polishing of an insulating film in a semiconductor device manufacturing method according to a second embodiment of the present invention.

FIGS. 34A and 345 are sectional views showing a polishing step performed in the second embodiment of the present invention.

In FIG. 34A. lower wirings 42 which have a different wiring density are formed on an underlying insulating film 41, and the wiring thickness of 400 nm appears on the underlying insulating film 41 as the level difference. In addition, an interlayer insulating film 43 made of $SiO_2$, PSG, BPSG, etc. is formed on the underlying insulating film 41 and the lower wirings 42 to have a thickness of 800 nm.

Unevenness of an upper surface of the interlayer insulating film 43 is caused owing to the wiring density of the lower wirings 42. If an upper wiring is formed on the interlayer insulating film 43 in the situation that the unevenness of the upper surface still remain, such a possibility is enhanced that disconnection of the upper wiring because of such level difference being caused by the unevenness.

Accordingly, the interlayer insulating film 43 must be planarized by polishing.

As the polishing method of the interlayer insulating film 43, it is preferable that the same conditions as those in the first step polishing shown in the third example of the first embodiment should be employed. In other words, the hard IC-1000 is employed as the abrasive cloth 102, and also material containing the dispersant or the polishing accelerator formed of KOH or $NH_4OH$ is employed as the slurry. Silica or cerium oxide is contained as the abrasive grains in the slurry.

Figure 34B:
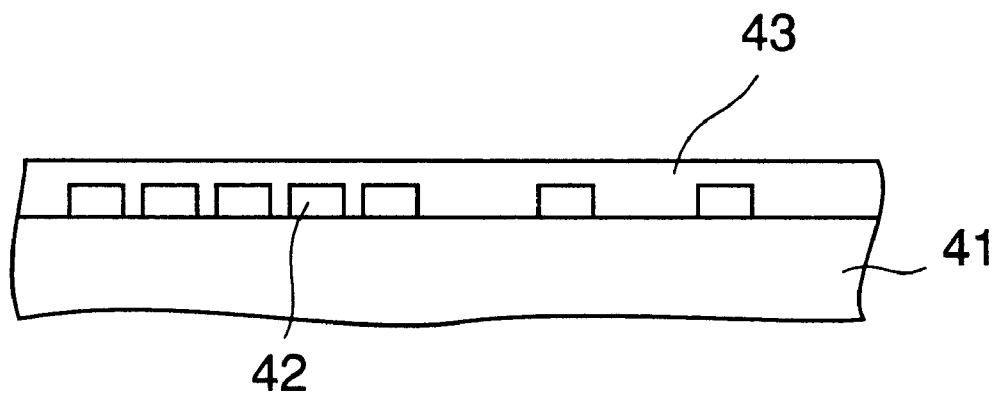

According to the same polishing conditions as those shown in Table 7, the interlayer insulating film 43 is polished until a remaining thickness of the interlayer insulating film 43 is 200 nm. In this case, the polishing speed of convex portions of the interlayer insulating film 43 can be increased, and thus the upper surface of the interlayer insulating film 43 can be planarized not to expose the lower wirings 42, as shown in FIG. 34B.

After this, an upper wiring (not shown) is formed further on the interlayer insulating film 43.

In this fashion, if the slurry containing KOH, $NH_4OH$ is employed to polish the interlayer insulating film 43, the flat surface which has the extremely small uneven difference can be formed. In the second embodiment, planarization of the level difference of the wirings is explained as an example. However, if the level difference between stacked capacitors and the insulating film is large like 1 μm since the stacked capacitors of DRAM, etc. are projected from the insulating film, it is very effective to planarize the surface by polishing the interlayer insulating film covering the stacked capacitors under the conditions that the hard abrasive cloth and the slurry containing KOH or $NH_3OH$ are employed.

Fifth Embodiment

The polishing explained in the first embodiment can be applied steps other than the shallow trench isolation (STI) forming step. In a third embodiment, in order to form a positioning mark used in photolithography (referred to as an "alignment mark" hereinafter), the first and second step polishing steps explained in the first embodiment are employed.

Sometimes a light non-transmitting film, e.g., GATE wiring material film. Is formed on the alignment mark. Therefore, there are some cases where a structure having unevenness (level difference) is adopted as the structure of the alignment mark and, for example, LOCOS formed on the silicon substrate by the selective oxidation method is utilized. However, since bird's beaks are formed on edge portions of the alignment mark formed by the selective oxidation method, such structure is not suited to the alignment mark.

For this reason, formation of the alignment mark which has sharp unevenness on the side edge portion and has a substantially uniform height on the surface of the wafer is requested. Next, the step of forming the alignment mark which can respond such request will be explained hereunder.

Figure 35A:
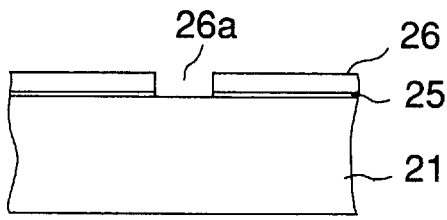
FIGS. 35A to 35F are sectional views showing alignment mark manufacturing steps in a semiconductor device manufacturing method according to a third embodiment of the present invention.

First, as shown in FIG. 35A, an $SiO_2$ film 25 of 10 nm thickness and an $Si_3N_4$ film 26 of 100 to 250 nm thickness are formed on a silicon substrate 21. Then, an opening portion 26a is formed at an alignment mark forming position by patterning the $SiO_2$ film 25 and the $Si_3N_4$ film 26 by the photolithography method.

Figure 35B:
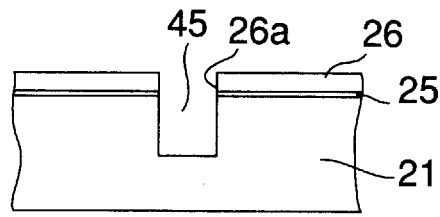

Then, as shown in FIG. 35B, the silicon substrate 21 is etched via the opening portion 26a, so that an alignment trench 45 having a depth of about 0.2 to 0.5 μm is formed. This alignment trench 45 may be formed simultaneously with the first trench 23a to the fourth trench 23d which constitute STI shown in the first embodiment.

Figure 35C:
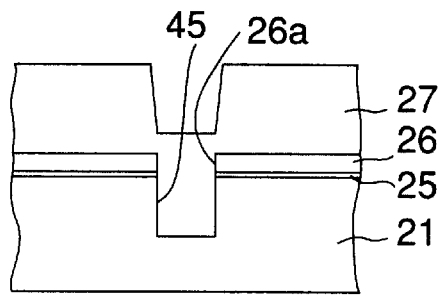

Then, as shown in FIG. 35C, a silicon oxide film 27 is formed in the alignment trench 45 and on the silicon substrate 21 by the HDP-CVD method. The conditions for forming the silicon oxide film 27 are identical to those in the first embodiment.

Then, the first step polishing and the second step polishing of the silicon oxide film 27 are executed. These polishing conditions may be set like those given in Tables 2, 3 of the first example, or Tables 4, 5 of the second example, or Tables 6, 7 of the third example in the first embodiment, for example.

In the first step polishing of the silicon oxide film 27, the abrasive cloth formed of hard material, e.g., IC-1000, is used.

Figure 35D:
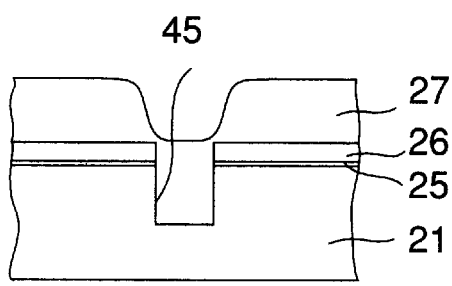
Figure 36:
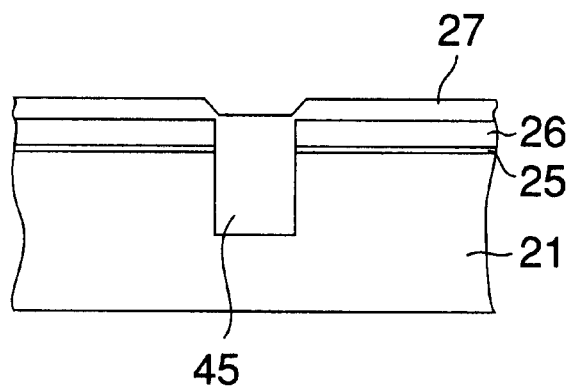
FIG. 36 is a plan view showing the TEG patterns formed on the semiconductor wafer.

If the conditions given in Table 2 or Table 4 are applied in this first step polishing, as shown in FIG. 35D, edges of the convex portions in the sectional shape of the silicon oxide film 27 are rounded and a volume of the convex portions is reduced after the polishing has been finished. On the contrary, if the conditions given in Table 6 are applied, the sectional shape of the silicon oxide film 27 can be polished as shown in FIG. 36 and thus flatness of the silicon oxide film 27 can be improved much more.

Next, the second step polishing of the silicon oxide film 27 is started.

Figure 35E:
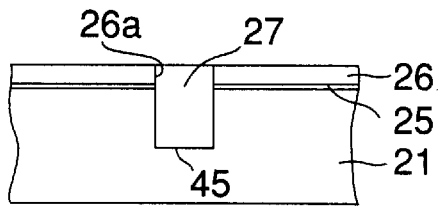

Then, as shown in FIG. 35E, the upper surface of the silicon oxide film 27 is polished by using the abrasive cloth which is softer than IC-1000 to thereby remove the silicon oxide film 27 on the $Si_3N_4$ film 26. In this case, the silicon oxide film 27 may be polished excessively to such extent that the silicon oxide film 27 remains in the alignment trench 45 and the opening portion 26a.

Figure 35F:
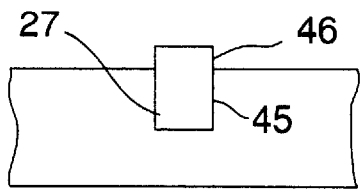

Then, if the $Si_3N_4$ film 26 is removed by phosphoric acid and then the $Si_3N_4$ film 26 is removed by hydrogen fluoride, as shown in FIG. 35F, the silicon oxide film 27 appears from the alignment trench 45 as the convex portion. This convex portion is slightly etched in the hydrogen fluoride process, nevertheless such convex portion in no way disappears since an original projected amount of the convex portion is about 100 to 250 nm.

Then, the convex portion of the silicon oxide film 27 projected from the alignment trench 45 is utilized as an alignment mark 46.

The alignment mark 46 formed by the above steps is formed via the first step polishing using the hard abrasive cloth at first and the second step polishing using the abrasive cloth softer than this hard abrasive cloth. Since polishing on the wafer can increase the flatness according to two-step polishing, respective projection amounts of the concave portions as a plurality of the alignment marks 46 formed on the wafer become almost equal. Therefore, alignment precision in exposure and stability of pattern recognition can be improved by using such alignment marks 46.

When a plurality of the alignment marks are formed on the wafer according to the above method, respective projection amounts of these alignment marks have been substantially uniform. Such semiconductor wafer is loaded on an XY stage of a stepper (not shown), and then position of the wafer is corrected automatically by detecting the alignment marks. A correction amount is measured repeatedly plural times by the exposure system. An example of the measurement of the correction amount will be explained in the following.

Figure 37:
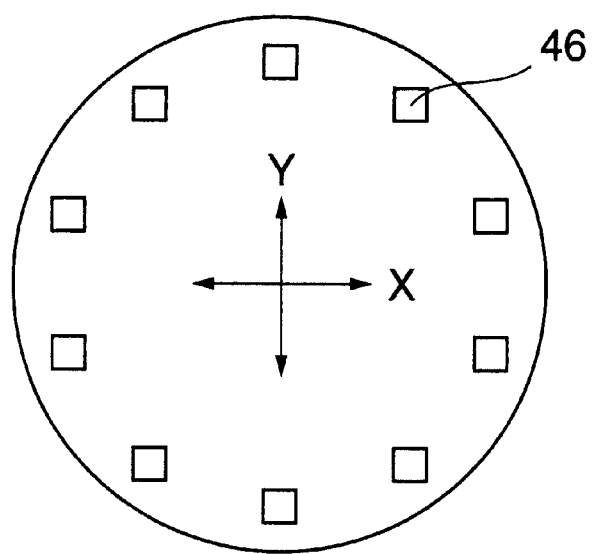
FIG. 37 is a plan view showing an example of arrangement of alignment marks which are formed in the third embodiment of the present invention.

In a prepared sample, as shown in FIG. 37, a plurality of the alignment marks 46 are formed along a circumference of the silicon wafer to form logic semiconductor devices. When measurement of the correction amount is executed plural times, results shown in FIGS. 38A and 38B have been derived.

Figure 38A:
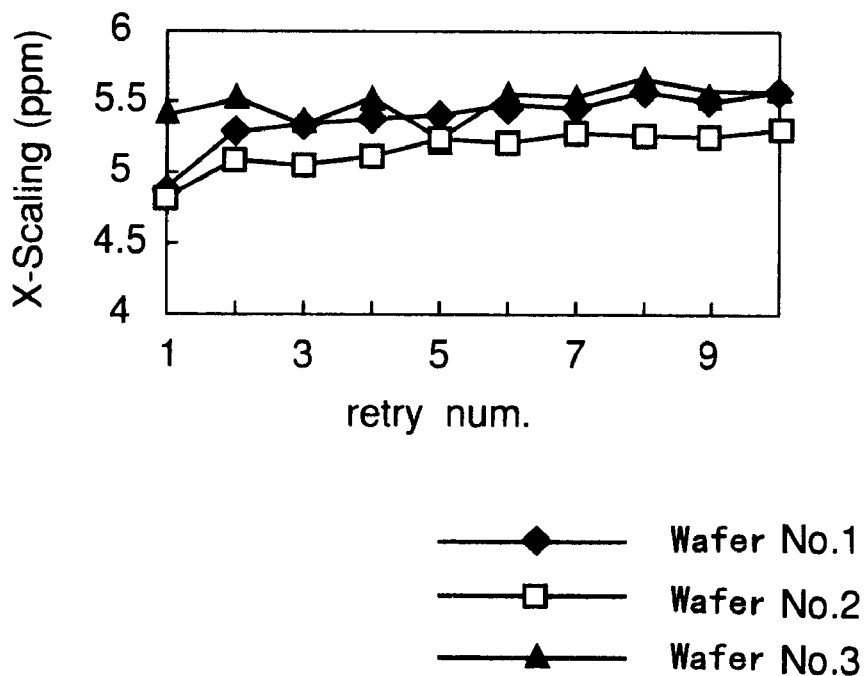
FIGS. 38A and 38B are views showing measurement results of a correction amount of the alignment marks, which are formed in the third embodiment of the present invention, effected by a stepper.
Figure 38B:
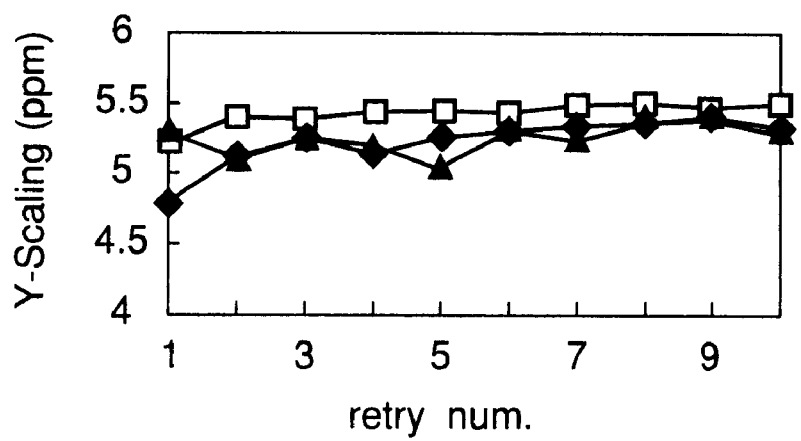

In FIGS. 38A and 38B, an abscissa denotes the number of correction measurement and an ordinate denotes a measuring direction along the X direction or the Y direction. According to the measurement results, the correction amount of the alignment marks 46 which are formed by the above method is substantially constant and thus the exposure position is corrected based on the correction amount. If the correction amount is largely varied, the exposure cannot be executed.

In FIGS. 38A and 38B, 1 ppm unit in the ordinate corresponds to 0.1 $\mu$m of the wafer in the radial direction.

In the measurement of the correction amount effected by the stepper, measured position data of the alignment marks 46 is compared with reference data to detect a discrepancy between them, and then wafer scaling, rotation speed of the wafer, etc. are calculated to correct the exposure data. Because a rotation amount of the wafer cannot be reproduced, reproducibility of the alignment in the stepper is checked by scaling.

In FIG. 35F, the convex portion formed in the trench 45 to project from the substrate surface is used as the alignment mark 46. As shown on the left side of FIG. 39A and FIG. 39B, the alignment marks 46 having such structure are mainly adopted in the active region. In contrast, as shown on the right side of FIG. 39A and FIG. 39B, regions surrounded by the convex portion 28 made of the silicon oxide film 27 (concave portion) are often adopted as the alignment mark 47 in the field region.

Two type of the alignment marks 46, 47 shown FIGS. 47A and 47B are formed on the semiconductor wafer W, and then their flatness is measured.

Figure 40:
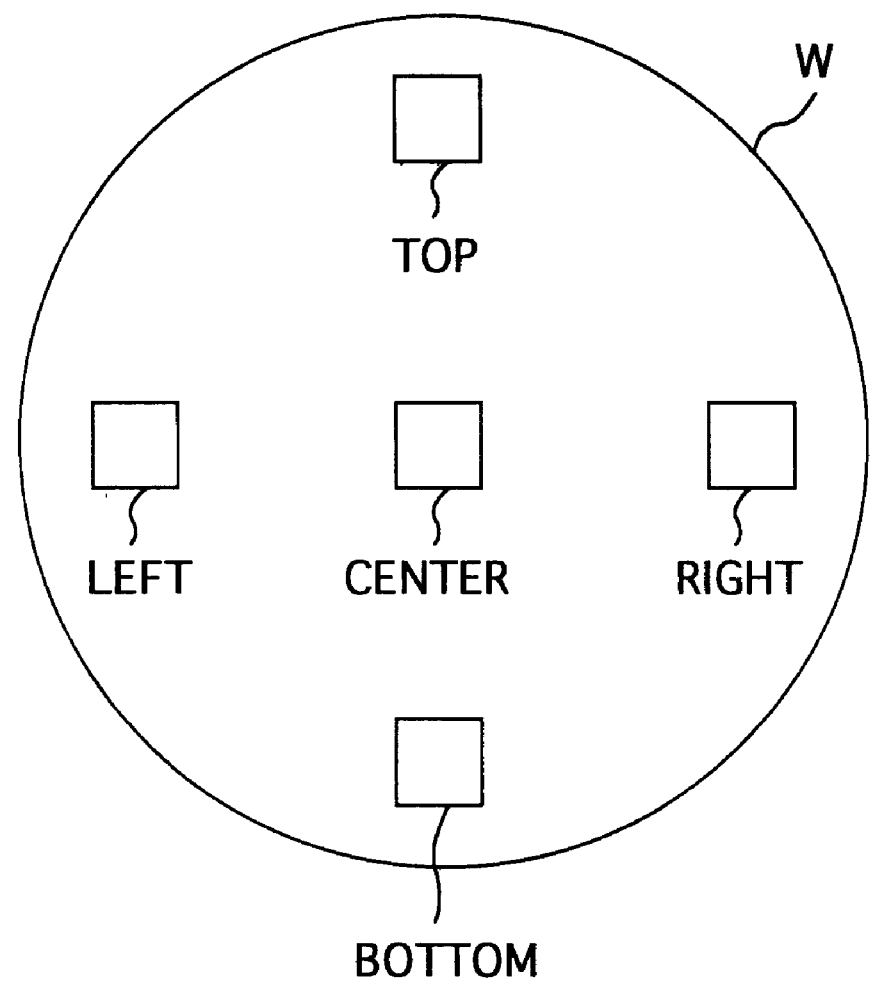
FIG. 40 is a plan view showing locations at which level difference of a plurality of alignment marks, which are formed in the third embodiment of the present invention, are measured.
Figure 41A:
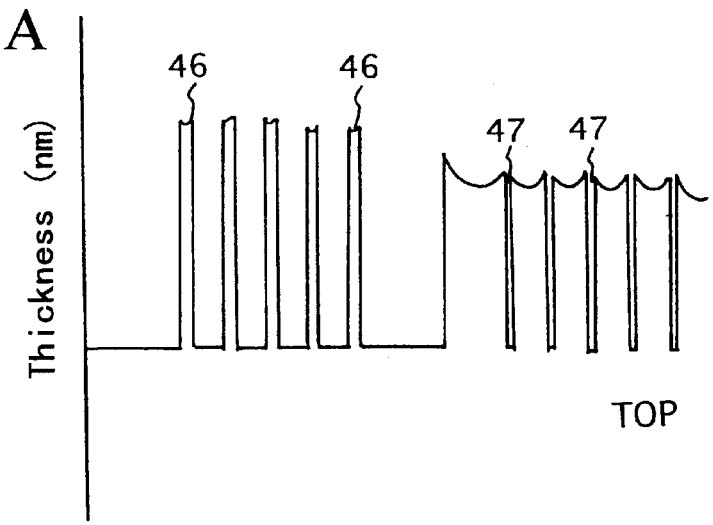
FIGS. 41A to 41E are views showing measurement results of level difference of the alignment marks positioned in TOP, RIGHT, BOTTOM, LEFT and CENTER areas of the measuring locations shown in FIG. 48 respectively.
Figure 41B:
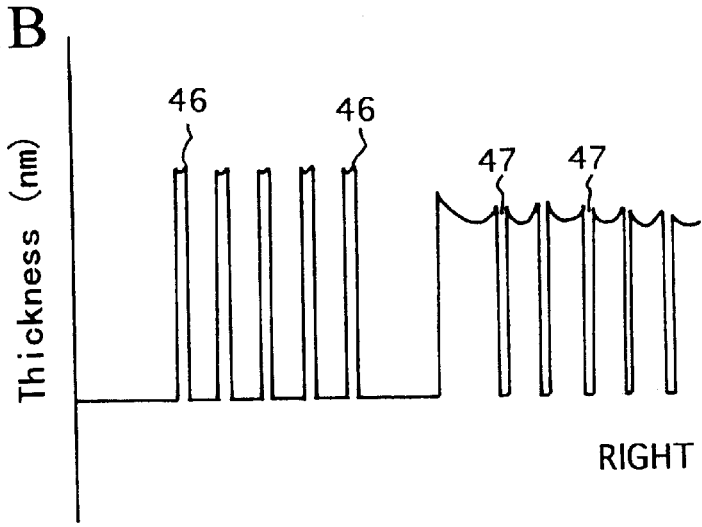
Figure 41C:
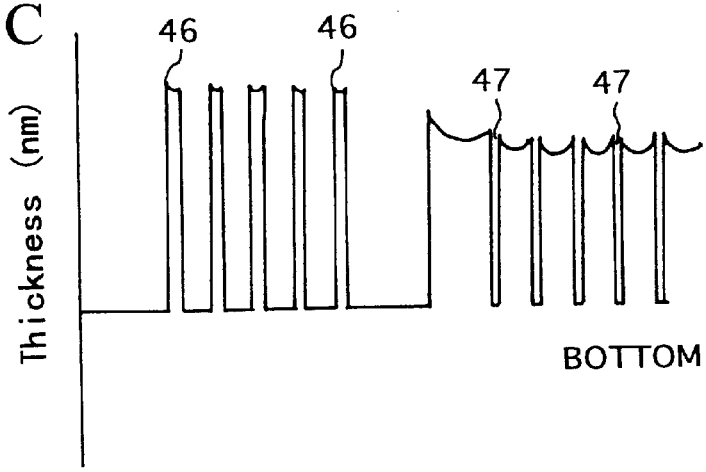
Figure 41D:
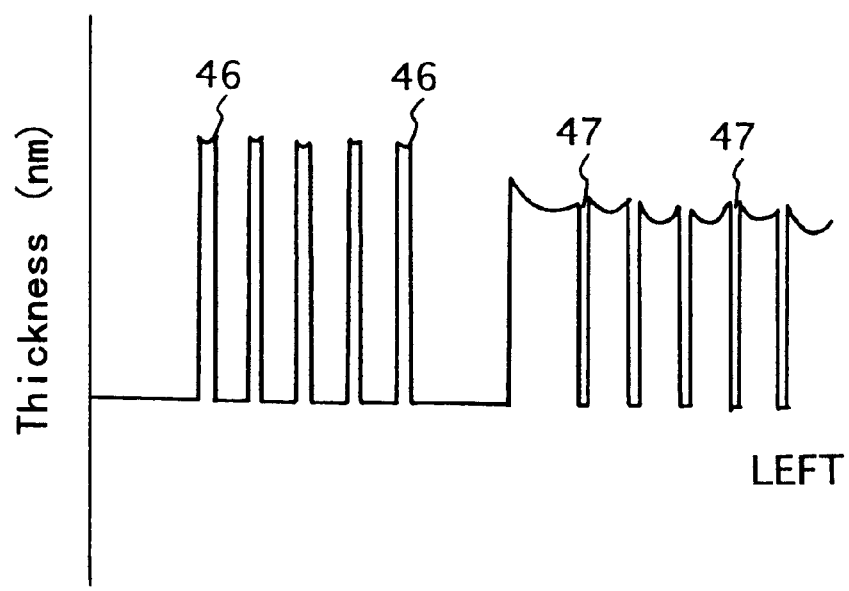
Figure 41E:
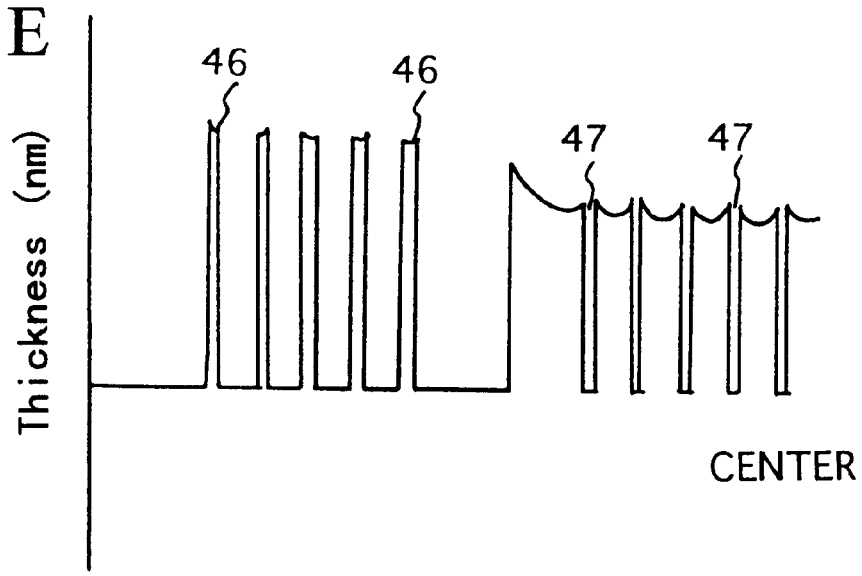

As shown in FIG. 40, five locations of the semiconductor wafer W, i.e., four locations TOP, RIGHT, BOTTOM, and LEFT positioned along the circumference of the semiconductor wafer W and one center location CENTER of the wafer W are set in total as measuring locations. Then, level differences between the alignment marks 46 in the active region and peripheral areas and between the alignment marks 47 in the field region and peripheral areas are measured in respective measuring locations.

When the alignment marks 46 and the alignment marks 47 are measured at five locations, results of the level differences of the alignment marks shown in FIGS. 41A to 41E have been derived. Errors in height of a plurality of convex alignment marks 46 have been within the range of 100 Å. Errors in depth of a plurality of convex alignment marks 47 have also been within the range of 100 Å.

With the above, according to the above steps, it has been confirmed that the alignment marks each has a substantially uniform profile and a uniform height or depth can be formed on the surface of the wafer.

What is claimed is:

1. A semiconductor device manufacturing method comprising the steps of:
    providing a semiconductor substrate comprising concave portions having a first width and a second width narrower than the first width;
    forming an insulating film on the semiconductor substrate, the insulating film filled in the concave portions, the insulating film including a first convex portion having a first width and a second convex portion having a second width narrower than the first width, the first convex portion having a higher projection surface than the second convex portion;
    polishing the first convex portions of the insulating film by using a first abrasive cloth which has first hardness for reducing a capacity of the first convex portion; and
    polishing the insulating film by using a second abrasive cloth which has second hardness softer than the first hardness after the insulating film has been polished by using the first abrasive cloth.

2. A semiconductor device manufacturing method according to claim 1, wherein the insulating film is formed of a silicon oxide film.

3. A semiconductor device manufacturing method according to claim 1, wherein the first abrasive cloth has a ratio of compressive strain to compressive load of less than 0.06 $\mu$m cm$^2$/g.

4. A semiconductor device manufacturing method according to claim 1, wherein the insulating film is formed by an inductive coupling plasma method or an electron cyclotron resonance method.

5. A semiconductor device manufacturing method according to claim 1, wherein the insulating film is formed by repeating film formation by a plasma chemical vapor deposition method and sputter etching.

6. A semiconductor device manufacturing method according to claim 1, further comprising the step of:
    forming wirings on the semiconductor substrate via an underlying insulating film before the insulating film is formed.

7. A semiconductor device manufacturing method according to 1, wherein the semiconductor substrate is fitted to a lower surface of an elastic member which is fitted to a bottom of a polishing head and has a Young's modulus of $1 \times 10^4$/m$^2$ to $1 \times 10^{10}$ N/m$^2$.

8. A semiconductor device manufacturing method according to claim 1, wherein the insulating film is formed with convex portions and the concave portions, a level difference between the convex portions and the concave portions is below 200 nm in any 20 mm square area and is below 50 nm in any 5 mm square area.

9. A semiconductor device manufacturing method according to claim 1, further comprising the step of:
    forming convex portions by removing the polishing stopping film to make the insulating film, which is filled in the trenches, project from the upper surface of the semiconductor substrate after the insulating film has been polished by using the second abrasive cloth.

10. A semiconductor device manufacturing method according to claim 9, wherein the convex portions are used as an alignment mark respectively.

11. A semiconductor device manufacturing method according to claim 1, wherein a first slurry is supplied onto the insulating film in polishing the insulating film by using the first abrasive cloth, and
    a second slurry is supplied onto the insulating film in polishing the insulating film by using the second abrasive cloth.

12. A semiconductor device manufacturing method according to claim 11, wherein the first slurry and the second slurry contain same material.

13. A semiconductor device manufacturing method according to claim 11, wherein the first slurry contains abrasive grains formed of silica material or cerium oxide in an amine dispersant.

14. A semiconductor device manufacturing method according to claim 11, wherein the first slurry contains abrasive grains formed of silica material or cerium oxide in a dispersant having OH radicals.

15. A semiconductor device manufacturing method according to claim 14, wherein the dispersant having OH radicals is formed of KOH or $NH_4OH$.

16. A semiconductor device manufacturing method according to claim 1, further comprising the step of:

forming a polishing stopping film in a first region on the semiconductor substrate and also forming, trenches in a second region which is not covered with the polishing stopping film before the insulating film is formed; and wherein polishing of the insulating film by using the second abrasive cloth is continued until the polishing stopping film is exposed.

17. A semiconductor device manufacturing method according to claim 16, wherein an area, of an upper surface of the semiconductor substrate except the trenches is set in a range of less than 70% of an overall area of the upper surface of the semiconductor substrate.

18. A semiconductor device manufacturing method according to claim 16, wherein the insulating film is a silicon oxide film formed by a plasma CVD method, and the polishing stopping film is a silicon nitride film formed by a CVD method.

19. A semiconductor device manufacturing method according to claim 10, wherein, a dummy pattern which is formed by projecting a part of the semiconductor substrate is formed in the trench.

20. A semiconductor device manufacturing method according to claim 16, wherein, in the step of polishing the insulating film by using the second abrasive cloth, a polishing end point is detected by a method which detects change in a polishing torque of the second abrasive cloth caused when polishing is changed from the insulating film to the polishing stopping film.

21. A semiconductor device manufacturing method according to claim 16, wherein, in the step of polishing the insulating film by using the second abrasive cloth, a polishing end point is detected by a method which irradiates a laser beam having a single wavelength of 100 nm to 1000 nm to the insulating film and then detects a change point of a reflection intensity of the laser beam when polishing is changed from the insulating film to the polishing stopping film.

22. A semiconductor device manufacturing method according to 16, claim further comprising the step of:

forming an initial oxide film between the polishing stopping film and the semiconductor substrate.

23. A semiconductor device manufacturing method according to claim 22, wherein the semiconductor substrate is a silicon substrate, the insulating film is a silicon oxide film formed by a CVD method, the polishing stopping film is a silicon nitride film formed by the CVD method, the initial oxide film is a silicon oxide film formed on a surface of the semiconductor substrate, and a value of a film thickness of the insulating film buried in the trenches is set in a range of one time to two times of a height value from bottom surfaces of the trenches to an uppermost surface of the polishing stopping film after the insulating film has been polished by using the second abrasive cloth.

24. A semiconductor device manufacturing method according to claim 16, further comprising the step of:

removing a part of the insulating film existing on the first region by etching before the insulating film is polished by using the first abrasive cloth.

25. A semiconductor device manufacturing method according to claim 24, wherein a polishing covering film formed of material which has the polishing rate slower than the insulating film is formed on the insulating film before or after etching of the insulating film.

26. A semiconductor device manufacturing method according to claim 16, further comprising the step of:

forming a polishing covering film whose polishing rate is slower than the insulating film on the insulating film.

27. A semiconductor device manufacturing method according to claim 26, wherein the semiconductor substrate is a silicon substrate, the insulating film is a silicon oxide film formed by a CVD method, the polishing stopping film is a silicon nitride film formed by the CVD method, a film thickness of the insulating film buried in the trenches is set in a range of 1.1 times to 1.5 times of a height from bottom surfaces of the trenches to an uppermost surface of the polishing stopping film after the insulating film has been polished by using the second abrasive cloth, and the polishing covering film has a film thickness of 30 nm to 150 nm.

28. A semiconductor device manufacturing method according to claim 26, wherein the insulating film is formed of a silicon oxide film, and the polishing covering film is formed, of a silicon nitride film.

29. A semiconductor device manufacturing method according to claim 28, wherein the silicon nitride film is formed to have a film thickness of 30 nm to 150 nm.

30. A semiconductor device manufacturing method comprising the steps of:

forming an insulating film on a principal surface of a semiconductor substrate, the insulating film including a first convex portion having a first width and a second convex portion having a second width narrower than the first width, the first convex portion having a higher projection surface than the second convex portion;

first polishing a portion of insulating film by using first abrasive cloth which has first hardness, while supplying the first abrasive cloth with a first slurry not etching the insulating film chemically to reduce a capacity of the first convex portion; and second polishing the insulating film by using a second abrasive cloth which has second hardness softer than the first hardness, while supplying the second abrasive cloth with a second slurry etching the insulating film chemically, after the insulating film has been polished by using the first abrasive cloth.

* * * * *